US009766551B2

(12) United States Patent
Mirkin et al.

(10) Patent No.: US 9,766,551 B2
(45) Date of Patent: Sep. 19, 2017

(54) HEAT ACTUATED AND PROJECTED LITHOGRAPHY SYSTEMS AND METHODS

(71) Applicant: NORTHWESTERN UNIVERSITY, Evanston, IL (US)

(72) Inventors: Chad A. Mirkin, Wilmette, IL (US); Xing Liao, Evanston, IL (US); Keith A. Brown, Evanston, IL (US); Guoliang Liu, Evanston, IL (US); Abrin L. Schmucker, Chicago, IL (US); Shu He, Evanston, IL (US); Wooyoung Shim, Skokie, IL (US); Daniel J. Eichelsdoerfer, Evanston, IL (US); Boris Rasin, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 100 days.

(21) Appl. No.: 14/439,252

(22) PCT Filed: Oct. 15, 2013

(86) PCT No.: PCT/US2013/064959
§ 371 (c)(1),
(2) Date: Apr. 29, 2015

(87) PCT Pub. No.: WO2014/070444
PCT Pub. Date: May 8, 2014

(65) Prior Publication Data
US 2015/0286148 A1    Oct. 8, 2015

Related U.S. Application Data

(60) Provisional application No. 61/719,907, filed on Oct. 29, 2012, provisional application No. 61/719,918, filed on Oct. 29, 2012.

(51) Int. Cl.
*G03B 27/52*    (2006.01)
*G03B 27/54*    (2006.01)
(Continued)

(52) U.S. Cl.
CPC ............ *G03F 7/7035* (2013.01); *B05D 1/26* (2013.01); *B05D 3/06* (2013.01); *G02B 13/143* (2013.01);
(Continued)

(58) Field of Classification Search
CPC . B05D 1/26; B05D 3/06; B82Y 40/00; G02B 13/143; G03F 7/0002; G03F 7/20;
(Continued)

(56) References Cited

U.S. PATENT DOCUMENTS 5,166,520 A    11/1992 Prater et al.
5,294,790 A    3/1994 Ohta et al.
(Continued)

FOREIGN PATENT DOCUMENTS

JP    11-016856 A    1/1999
JP    11-064350 A    3/1999
(Continued)

OTHER PUBLICATIONS

Allara et al., Spontaneously organized molecular assemblies. 1. Formation, dynamics and physical properties of n-Alkanoic acids adsorbed from solution on an oxidized aluminum surface, *Langmuir*, 1: 45 (1985).
(Continued)

*Primary Examiner* — Christina Riddle
(74) *Attorney, Agent, or Firm* — Marshall, Gerstein & Burun LLP

(57) ABSTRACT

In accordance with an embodiment of the disclosure, a method of patterning can include dividing an image into a
(Continued)

set of frame sections; determining a tip pattern for a respective portion of an image to be patterned by each tip of the tip array in each frame section of the set of frame sections; disposing the tip array in a patterning position in a first location of the substrate corresponding to a location of the substrate in which the first frame section in the set of frame sections is to be patterned; projecting a first pattern of radiation onto the tip array to selectively irradiate one or more tips of the tip array and pattern the substrate, wherein the first pattern of radiation corresponds to a tip pattern for the first frame section; disposing the tip array in a patterning position in a second location of the substrate corresponding to a location of the substrate in which the second frame section in the set of frame sections is to be patterned; projecting a second pattern of radiation onto the tip array to selectively irradiate tips of the tip array and pattern the substrate, wherein the second pattern of radiation corresponds to a tip pattern for the second frame section; and repeating the disposing and projecting for each frame section in the set of frame sections to pattern the image.

29 Claims, 49 Drawing Sheets

(51) Int. Cl.
| | | |
|---|---|---|
| G03F 7/20 | (2006.01) | |
| G03F 7/00 | (2006.01) | |
| B05D 1/26 | (2006.01) | |
| B05D 3/06 | (2006.01) | |
| G02B 13/14 | (2006.01) | |
| B82Y 40/00 | (2011.01) | |

(52) U.S. Cl.
CPC .............. *G03F 7/0002* (2013.01); *G03F 7/20* (2013.01); *G03F 7/2049* (2013.01); *G03F 7/7045* (2013.01); *G03F 7/70141* (2013.01); *G03F 7/70325* (2013.01); *G03F 7/70383* (2013.01); *B82Y 40/00* (2013.01)

(58) Field of Classification Search
CPC ...... G03F 7/203; G03F 7/2045; G03F 7/2047; G03F 7/2049; G03F 7/70141; G03F 7/70258; G03F 7/70266; G03F 7/70275; G03F 7/70325; G03F 7/70358; G03F 7/70375; G03F 7/70383; G03F 7/70391; G03F 7/70416; G03F 7/7045; G03F 7/70775
USPC .. 355/19, 30, 46, 53, 55, 67–71, 72, 75, 78, 355/95; 850/55, 57, 58; 977/855, 859, 977/860, 862, 867, 868, 875, 877–879, 977/887; 430/5, 22, 30, 311, 313, 322, 430/330
See application file for complete search history.

(56) References Cited

U.S. PATENT DOCUMENTS

| 5,472,881 | A | 12/1995 | Beebe et al. |
|---|---|---|---|
| 5,776,748 | A | 7/1998 | Singhvi et al. |
| 5,846,909 | A | 12/1998 | McDevitt et al. |
| 5,859,937 | A | 1/1999 | Nomura |
| 5,942,397 | A | 8/1999 | Tarlov et al. |
| 6,156,215 | A | 12/2000 | Shimada et al. |
| 6,236,033 | B1 | 5/2001 | Ebbesen et al. |
| 6,339,217 | B1 | 1/2002 | Kley |
| 6,376,833 | B2 | 4/2002 | Shimada et al. |
| 6,445,453 | B1 | 9/2002 | Hill |
| 6,455,334 | B1 | 9/2002 | Goruganthu et al. |
| 6,479,816 | B1 | 11/2002 | Oumi et al. |
| 6,500,549 | B1 | 12/2002 | Deppisch et al. |
| 6,596,346 | B2 | 7/2003 | Bernard et al. |
| 6,768,095 | B2 | 7/2004 | Niwa et al. |
| 6,794,296 | B1 | 9/2004 | Kassing et al. |
| 8,220,317 | B2 | 7/2012 | Mirkin et al. |
| 9,021,611 | B2 | 4/2015 | Mirkin et al. |
| 2001/0011704 | A1 | 8/2001 | Niwa et al. |
| 2001/0030938 | A1 | 10/2001 | Oumi et al. |
| 2002/0024004 | A1 | 2/2002 | Shimada et al. |
| 2002/0154859 | A1 | 10/2002 | Kuroda et al. |
| 2003/0068446 | A1 | 4/2003 | Mirkin et al. |
| 2003/0085351 | A1 | 5/2003 | Nakajima et al. |
| 2004/0022962 | A1 | 2/2004 | Shibue et al. |
| 2005/0013536 | A1 | 1/2005 | Walt |
| 2005/0018997 | A1* | 1/2005 | Bleeker ............... G03F 7/70066 385/147 |
| 2005/0035983 | A1 | 2/2005 | Cruchon-Dupeyrat et al. |
| 2005/0191774 | A1 | 9/2005 | Li et al. |
| 2005/0253290 | A1 | 11/2005 | Yokoyama et al. |
| 2006/0192115 | A1 | 8/2006 | Thomas et al. |
| 2007/0125969 | A1 | 6/2007 | Schellenberg et al. |
| 2007/0281130 | A1 | 12/2007 | D'Urso et al. |
| 2008/0062389 | A1* | 3/2008 | Sandstrom ............ G03B 27/44 355/46 |
| 2008/0078239 | A1 | 4/2008 | Ko et al. |
| 2008/0198350 | A1* | 8/2008 | Sugita ................ G03F 7/70091 355/46 |
| 2013/0040856 | A1 | 2/2013 | Mirkin et al. |
| 2014/0134336 | A1* | 5/2014 | Ha ........................ G03F 7/0002 427/256 |
| 2015/0309073 | A1* | 10/2015 | Mirkin .................. B82Y 40/00 850/55 |

FOREIGN PATENT DOCUMENTS

| JP | 2003-305700 A | 10/2003 | |
|---|---|---|---|
| KR | 1020070063318 | 6/2007 | |
| WO | WO-99/45437 A1 | 9/1999 | |
| WO | WO-99/48682 A1 | 9/1999 | |
| WO | WO-2006/026993 A1 | 3/2006 | |
| WO | WO 2010096593 A2 * | 8/2010 | ........... G03F 7/2051 |
| WO | WO-2011/071753 A2 | 6/2011 | |

OTHER PUBLICATIONS

Allara et al., The study of the gas-solid interaction of acetic acid with a cuprous oxide surface using reflection-absorption spectroscopy, *J. Colloid Interface Sci.*, 49: 410-21 (1974).

Andrew et al., Confining light to deep subwavelength dimensions to enable optical nanopatterning, Science, 324:917-21 (2009).

Anwander et al., Surface characterization and functionalization of MCM-41 silicas via silazane silylation, *J. Phys. Chem. B*, 104:3532-44 (2000).

Bain, A new class of self-assembled monolayers: organic thiols on gallium arsenide, *Adv. Mater.*, 4:591-4 (1992).

Bansal et al., Electrochemical properties of (111)-oriented n-Si surfaces derivatized with covalently-attached alkyl chains, *J. Phys. Chem. B*, 102:1067-70 (1998).

Bansal et al., Stabilization of Si photoanodes in aqueous electrolytes through surface alkylation, *J. Phys. Chem. B.*, 102:4058-60 (1998).

Bernard et al., Printing patterns of proteins, *Langmuir*, 14:2225-9 (1998).

Bishop et al., Self-assembled monolayers: Recent developments and applications, *Curr. Opin. Colloid & Interface Sci.*, 1:127-36 (1996).

Brazdil et al. Resonance raman spectra of adsorbed species at solid-gas interfaces. 2. Y-Nitrosodimethylaniline and Y-Dimethylaminoazobenzene adsorbed on semiconductor oxide surfaces, *J. Phys. Chem.*, 85, 1005-14 (1981).

Bullen et al., Electrostatically actuated dip pen nanolithography probe arrays, Sensors and Actuators A: Physical, 125:504-11 (2006).

Bullen et al., Parallel dip-pen nanolithography with arrays of individually addressable cantilevers, Appl. Phys. Lett., 84:789-91 (2004).

(56) References Cited

OTHER PUBLICATIONS

Burwell Modified silica gels as adsorbents and catalysts, *Chemical Technology*, 4, 370-7 (1974).
Calvert, Lithographic patterning of self-assembled films, J. Vac. Sci. Technol. B, 11:2155 (1993).
Chang et al., Structures of self-assembled monolayers of aromatic-derivatized thiols on evaporated gold and silver surfaces: implication on packing mechanism, *J. Am. Chem. Soc.*, 116, 6792-805 (1994).
Chen et al., Do alkanethiols adsorb onto the surfaces of Tl—Ba—Ca—Cu—O-based high-temperature superconductors? The critical role of H20 content on the adsorption process, *Langmuir*, 12:2622-4 (1996).
Chen et al., Surveying the surface coordination chemistry of a superconductor: spontaneous adsorption of monolayer films of redox-active "ligands" on $YBa_2$—$Cu_3$—$O_7$-$\sigma$, J. Am. Chem. Soc., 117:6374-5 (1995).
Chen et al., Synthesis and characterization of carboxylate-modified gold nanoparticle powders dispersible in water, *Langmuir*, 15:1075-82 (1999).
Chidsey, Book of Abstracts, 214th ACS National Meeting, Las Vegas, Nev., Sep. 7-11, 1997, I&EC-027.
Choi et al., A photocurable poly(dimethylsiloxane) chemistry designed for soft lithographic molding and printing in the nanometer regime, J Am Chem Soc., 125(14):4060-1 (2003).
Choi et al., Modeling of a nanoscale oxide aperture opening for a NSOM probe, J. Korean Phys. Soc., 45:1659 (2004).
Dammel, Diazonaphthoquinone Based Resists, 1st ed., SPIE Optical Engineering Press, Bellingham, Wash. (1993).
Donzel et al., Hydrophilic poly(dimethylsiloxane) stamps for microcontact printing, Adv. Mater., 13(15): 1164-7 (2001).
Donzel et al., Hydrophilic poly(dimethylsiloxane) stamps for microcontact printing, Adv. Mater., 13(15):1164-7 (2001).
Dubois et al., Synthesis, structure, and properties of model organic surfaces, *Phys. Chem.*, 43:437-63 (1992).
Ellison et al., Adsorption of Phenyl Isothiocyanate on Si(001): A 1,2-Dipolar Surface Addition Reaction, J. Phys. Chem. B, 103:6243-51 (1999).
Ellison et al., Cycloaddition Chemistry on Silicon(001) Surfaces: The Adsorption of Azo-tert-butane, J. Phys. Chem. B, 102:8510-8 (1998).
Eltekova et al., Adsorption of aromatic compounds from solutions on titanium dioxide and silica, *Langmuir*, 3:951-7 (1987).
Fenter et al., Structure of $CH_3(CH_2)_{17}SH$ self-assembled on the Ag(111) surface: an incommensurate monolayer, *Langmuir*, 7, 2013-16 (1991).
Gates et al., New approaches to nanofabrication: molding, printing, and other techniques, *Chem. Rev.*, 105:1171-96 (2005).
Geissler et al., Patterning: principles and some new developments, *Adv. Mater.*, 16:1249-69 (2004).
Grabar et al., Preparation and characterization of Au colloid monolayers, *Anal Chem*, 67 : 735-43 (1995).
Gu et al., Electron tunneling at the semiconductor-insulator-electrolyte interface. Photocurrent studies of the n-InP-alkanethiol-ferrocyanide system, *J. Phys. Chem. B*, 102:9015-28 (1998).
Gui et al., Adsorption and surface structural chemistry of thiophenol, benzyl mercaptan, and alkyl mercaptans. Comparative studies at Ag(111) and Pt(111) electrodes by means of auger spectroscopy, electron energy loss spectroscopy, low-energy electron diffraction, and electrochemistry, *Langmuir*, 7, 955-63 (1991).
Hamers et al., Formation of Ordered, Anisotropic Organic Monolayers on the Si(001) Surface, *J. Phys. Chem. B*, 101:1489-92 (1997).
He et al., Preparation of Hydrophilic Poly(dimethylsiloxane) Stamps by Plasma-Induced Grafting, Langmuir, 19(17):6982-6 (2003).
He et al., Preparation of hydrophilic poly(dimethylsiloxane) stamps by plasma-induced grafting, Langmuir, 19:6982-6 (2003).
Henderson et al., Self-assembled monolayers of ithiols, diisocyanides, and isocyanothiols on gold: "chemically sticky" surfaces for covalent attachment of metal clusters and studies of interfacial electron transfer, *Inorg. Chim. Acta*, 242:115-24 (1996).
Hickman et al., "Combining spontaneous molecular assembly with microfabrication to pattern surfaces: selective binding of isonitriles to platinum microwires and characterization by electrochemistry and surface spectroscopy", *J. Am. Chem. Soc.*, 111: 7271-7272 (1989).
Hickman et al., Toward orthogonal self-assembly of redox active molecules on Pt and Au: selective reaction of disulfide with Au and isocyanide with Pt, *Langmuir*, 8, 357-9 (1992).
Hovis et al., Cycloaddition chemistry and formation of ordered organic monolayers on silicon (001) surfaces, *Surf. Sci.*, 402-404:1-7 (1998).
Hovis et al., Cycloaddition Chemistry of 1,3-Dienes on the Silicon(001) Surface: Competition between [4+2] and [2+2] Reactions, J. Phys. Chem. B, 102:6873-9 (1998).
Hovis et al., Structure and bonding of ordered organic monolayers of 1,5-cyclooctadiene on the silicon(001) surface, *J. Phys. Chem. B*, 101:9581-5 (1997).
Hubbard, Electrochemistry of well-defined surfaces, *Acc. Chem. Res.*, 13:177-84 (1980).
Huc et al., Self-assembled mono- and multilayers on gold from 1,4-diisocyanobenzene and ruthenium phthalocyanine, *J. Phys. Chem. B*, 103: 10489-95 (1999).
Huo et al., Polymer pen lithography, Science, 321(5896): 1658-60 (2008).
Huo et al., Polymer pen lithography, Science, 321(5896):1658-60 (2008).
Iler, *The Chemistry of Silica*, Chapter 6, New York: Wiley (1979).
International Search Report and Written Opinion, International Application No. PCT/US2013/064959, mailed Mar. 6, 2014.
Ito et al., Pushing the limits of lithography, *Nature*, 406:1027-31 (2000).
James et al., Patterned protein layers on solid substrates by thin stamp microcontact printing, *Langmuir*, 14, 741-4 (1998).
Kingsley et al., Optical nanolithography using a scanning near-field probe with an integrated light source, Appl. Phys. Lett., 93:213103 (2008).
Laibinis et al., f-Terminated alkanethiolate monolayers on surfaces of copper, silver, and gold have similar wettabilities, *J. Am. Chem. Soc.*, 114, 1990-5 (1992).
Laibinis et al., Comparisons of self-assembled monolayers on silver and gold: mixed monolayers derived from $HS(CH_2)_{21}X$ and $HS(CH_2)_{10}Y$ (X, Y = $CH_3$, $CH_2OH$) have similar properties, *Langmuir*, 7:3167-73 (1991).
Lee et al., Adsorption of ordered zirconium phosphonate multilayer films on silicon and gold surfaces, *J. Phys. Chem.*, 92 : 2597-601 (1988).
Leggett, Scanning near-field photolithography—surface photochemistry with nanoscale spatial resolution, Chem. Soc. Rev., 35:1150-61 (2006).
Levenson et al., Improving resolution in photolithography with a phase-shifting mask, IEEE Trans. Electr. Dev., 29(12):1828-36 (1982).
Li et al., Achieving $\lambda/20$ resolution by one-color initiation and deactivation of polymerization, Science, 324:910-3 (2009).
Li et al., Self assembly of n-Alkanethiolate monolayers on silver nano-structures: determination of the apparent thickness of the monolayer by scanning tunneling microscopy, Office of Naval Research, Technical Report No. 2, 24 pp (1994).
Lo et al., Polypyrrole growth on $YBa_2Cu_3O_7$-L modified with a self-assembled monolayer of N-(3-aminopropyl)pyrrole: hardwiring the "electroactive hot spots" on a superconductor electrode, J. Am. Chem. Soc., 118:11295-6 (1996).
Lunt et al., Chemical studies of the passivation of GaAs surface recombination using sulfides and thiols, *J. Appl. Phys.*, 70:7449-67 (1991).
Lunt et al., Passivation of GaAs surface recombination with organic thiols, *J. Vacuum Sci. Technol. B*, 9:2333-6 (1991).
Magallon et al., Structural characterization of n-alkyl amine monolayers on copper by ellipsometry and infrared spectroscopy, IN: Book of Abstracts of 215th ACS National Meeting, Dallas, Texas, Mar. 29-Apr. 2, 1998, Abstract No. 048.

(56) References Cited

OTHER PUBLICATIONS

Maoz et al., Penetration-controlled reactions in organized monolayer assemblies. 1. Aqueous permanganate interaction with monolayer and multilayer films of long-chain surfactants, Langmuir, 3:1034-44 (1987).
Maoz et al., Penetration-controlled reactions in organized monolayers assemblies. 2. Aqueous permanganate interaction with self-assembling monolayers of long-chain surfactants, Langmuir, 3:1045-51 (1987).
Martin et al., Direct protein microarray fabrication using a hydrogel "stamper", Langmuir, 14(15):3971-5 (1998).
Matteucci et al., Synthesis of deoxyoligonucleotides on a polymer support, J Am Chem Soc, 103:3185-91 (1981).
Mayya et al., A study of the partitioning of colloidal particles based on their size during electrostatic immobilization at the air-water interface using fatty amine monolayers, J. Phys. Chem. B, 101, 9790-3 (1997).
Menzel et al., Surface-confined nanoparticles as substrates for photopolymerizable self-assembled monolayers, Adv. Mater., 11:131-4 (1999).
Meyer et al., Evidence for adduct formation at the semiconductor-gas interface. Photoluminescent properties of cadmium selenide in the presence of amines, J. Am. Chem. Soc., 110: 4914-18 (1988).
Mirkin et al., Controlling the surface properties of high temperature superconductors, Adv. Mater., 9:167-73 (1997).
Mirkin, The power of the pen: development of massively parallel dip-pen nanolithography, ACS Nano, 1:79-83 (2007).
Mucic et al., Synthesis and characterization of DNA with ferrocenyl groups attached to their 5-termini: electrochemical characterization of a redox-active nucleotide monolayer, Chem Commun, 555-557 (1996).
Munster et al., Novel micromachined cantilever sensors for scanning near-field optical microscopy, J. Microsopy, 186(1):17-22 (1997).
Naber et al., High-resolution lithography with near-field optical microscopy, Scanning, 18:567-71 (1996).
Nakagawa et al., GaAs interfaces with octadecyl thiol self-assembled monolayer: structural and electrical properties, Japan J. Appl. Phys. Part I, 30:3759-62 (1991).
Nuzzo et al., Spontaneously organized molecular assemblies. 3. Preparation and properties of solution adsorbed monolayers of organic disulfides on gold surfaces, J Am Chem Soc, 109:2358-2368 (1987).
Ohno et al., Nanostructural formation of self-assembled monolayer films on cleaved AlGaAs/GaAs heterojuctions, Mol. Crystal Liq. Crystal Sci. Technol. A, 295:189-92 (1997).
Patil et al., Surface derivatization of colloidal silver particles using interdigitized bilayers: a novel strategy for electrostatic immobilization of colloidal particles in thermally evaporated fatty acid/fatty amine films, Langmuir, 14, 2707-11 (1998).
Pereira et al., Modification of surface properties of alumina by plasma treatment, J. Mater. Chem., 10, 259-61 (2000).
Piner et al., 'Dip-Pen' nanolithography, Science, 283:661-3 (1999).
Porter et al., Gold and silver nanoparticles functionalized by the adsorption of dialkyl disulfides, Langmuir, 14, 7378-86 (1998).
Qi et al., A three-dimensional optical photonic crystal with designed point defects, Nature, 429:538-42 (2004).
Qin et al., Photolithography with transparent reflective photomasks, J. Vac. Sci. Technol. B, 16:98-103 (1998).
Qin et al., Elastomeric light valves, Adv. Mater., 9:407-10 (2004).
Reuter et al., Effects of gallium arsenide passivation on scanning tunneling microscope excited luminescence, IN: Mater. Res. Soc. Symposium Proceedings, 380:119-24 (1995).
Salaita et al., Applications of dip-pen nanolithography, Nat. Nanotechnol., 2:145-55 (2007).
Sangiorgi et al., Adsorption of 1-decylamine on copper, Gazz. Chim. Ital., 111: 99-102 (1981).
Schmid et al., Siloxane polymers for high-resolution, high-accuracy soft lithography, 33:3042-9 (2000).

Scott et al., Two-Color Single-Photon Photoinitiation and Photoinhibition for Subdiffraction Photolithography, Science, 324:913-7 (2009).
Sheen et al., A new class of organized self-assembled monolayers: alkane thiols on GaAs, J. Am. Chem. Soc., 114:1514-15 (1992).
Slavov et al., Mechanism of silation of silica with hexamethyldisilazane, J. Phys. Chem. B, 104:983-9 (2000).
Smith, A proposal for maskless, zone-plate-array nanolithography, J. Vac. Sci. Technol. B, 14:4318 (1996).
Solomun et al., On the promoting effect of alkali metals on the adsorption of nitriles on the gold(100) surface, Ber. Bunsen-Ges. Phys. Chem., 95:95-8 (1991).
Solomun et al., The interaction of nitriles with a potassium-promoted gold(100) surface, J. Phys. Chem., 95:10041-9 (1991).
Son et al., Adsorption of 4-methoxybenzyl cyanide on silver and gold surfaces investigated by fourier transform infrared spectroscopy, J. Phys. Chem., 98:8488-93 (1994).
Song, Quenching of porous silicon photoluminescence by aromatic molecules, and surface derivatization of porous silicon with dimethyl sulfoxide, aryllithium, or alkyllithium reagents, Doctor of Philosophy in ChemistryThesis, University of California at San Diego (1998).
Soriaga et al., "Determination of the orientation of aromatic molecules adsorbed on platinum electrodes. The effect of solute concentration", J Am Chem Soc, 104:3937-45 (1982).
Steiner et al., Adsorption of alkanenitriles and alkanedinitriles on gold and copper, Langmuir, 8, 2771-7 (1992).
Steiner et al., Adsorption of NPh3, PPh3, AsPh3, SbPh3, and BiPh3 on gold and copper, Langmuir, 8, 90-4 (1992).
Tao, Structural comparison of self-assembled monolayers of n-alkanoic acids on the surfaces of silver, copper, and aluminum, J. Am. Chem. Soc., 115:4350-8 (1993).
Timmons et al., "Investigation of fatty acid monolayers on metals by contact potential measurements", J Phys Chem, 69:984-990 (1965).
Ulman, An Introduction to Ultrathin Organic Films: From Langmuir-Blodgett to Self-Assembly, Boston: Academic Press (1991).
Ulman, Formation and Structure of Self-Assembled Monolayers, Chem. Rev., 96:1533-54 (1996).
Vettiger et al., The "Millipede"—more than thousand tips for future AFM storage, IBM J. Res. Dev., 44:323 (2000).
Walczak et al., Structure and interfacial properties of spontaneously adsorbed n-alkanethiolate monolayers on evaporated silver surfaces, J. Am. Chem. Soc., 113:2370-8 (1991).
Wang et al., Scanning probe contact printing, Langmuir, 19:8951-5 (2003).
Wang et al., Thermally actuated probe array for parallel dip-pen nanolithography, J. Vac. Sci. Technol. B, 22:2563 (2004).
Wasserman et al., "Structure and reactivity of alkylsiloxane monolayers formed by reaction of alkyltrichlorosilanes on silicon substrates", Langmuir, 5:1074-1087 (1989).
Whitesides, Proceedings of the Robert A. Welch Foundation 39th Conference on Chemical Research Nanophase Chemistry, Houston, Texas, pp. 109-21 (1995).
Xia et al., Soft Lithography, Angew. Chem. Int. Ed., 37:550-75 (1998).
Xu et al., Surface coordination chemistry of YBa2Cu3O7-L, Langmuir, 14:6505-11 (1998).
Yamamoto et al., Characterization of the surface to thiol bonding in self-assembled monolayer films of C12H25SH on InP (100) by angle-resolved X-ray photoelectron spectroscopy, Langmuir, 15:8640-4 (1999).
Yonezawa et al., Layered nanocomposite of close-packed gold nanoparticles and TiO2 gel layers, Chem. Mater., 11:33-5 (1999).
Zhang et al., Dip pen nanolithography stamp tip, Nano Lett., 4(9):1649-55 (2004).
Zheng et al., Multiplexed protein arrays enabled by polymer pen lithography: addressing the inking challenge, Angew. Chem. Int. Ed., 48:7626-9 (2009).

* cited by examiner

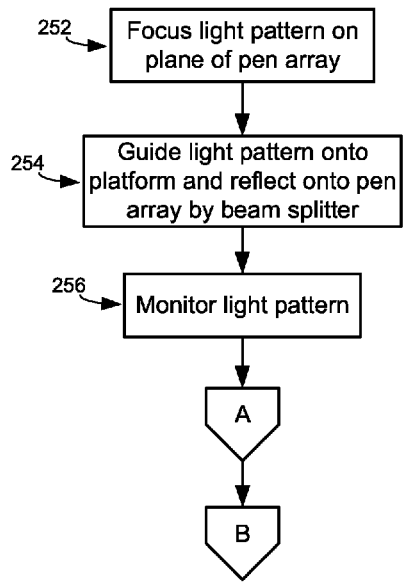
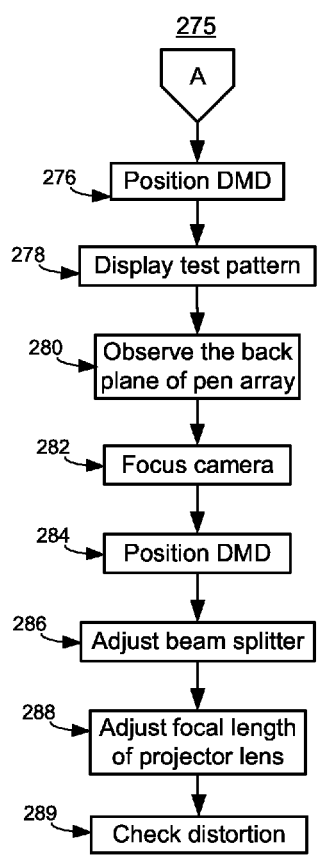
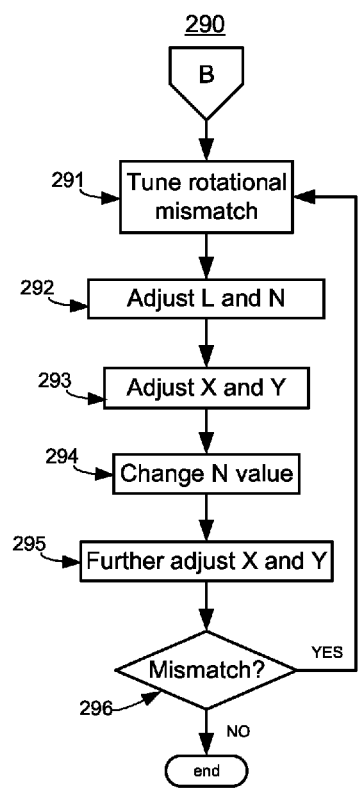
Fig. 2b
Fig. 2c
Fig. 2d

400

A

HEAT ACTUATED AND PROJECTED LITHOGRAPHY SYSTEMS AND METHODS

CROSS-REFERENCE TO RELATED APPLICATIONS

This application is a U.S. national phase of PCT/US2013/064959 filed Oct. 15, 2013, which claims the priority benefit of U.S. Patent Application Nos. 61/719,907 filed Oct. 29, 2012, and 61/719,918 filed Oct. 29, 2012, the entire respective disclosures of which are incorporated herein by reference.

STATEMENT OF GOVERNMENT INTEREST

This invention was made with government support under DMR1124131 and DBI1152139 awarded by the National Science Foundation; N66001-08-1-2044 awarded by the Space and Naval Warfare Systems Center—Pacific (DARPA); FA23868-10-1-4065 awarded by the Asian Office of Aerospace Research and Development; FA9550-12-1-0280 and FA9550-12-1-0141 awarded by the Air Force Office of Scientific Research; and CA151880 awarded by the National Institutes of Health. The government has certain rights in the invention.

BACKGROUND

The demand for nanoscale components in integrated circuits, medical diagnostics, and optoelectronics has generated much interest in the development and study of various lithography strategies. Conventional patterning methods, however, have failed to satisfy the need for rapidly patterning of nanoscale features at a low cost. The expense of patterning equipment grows dramatically as the required resolution increases.

With conventional far-field optical lithography, lateral feature resolution is diffraction-limited, as defined by the Rayleigh or Abbé conditions, which in practical terms only allow feature dimensions of approximately half the incident wavelength. In order to overcome the diffraction limit, a number of lithography approaches have been reported, including multi-photon induced photoresist polymerization, zone-plate array lithography, and phase-shift photolithography. Though these techniques are highly parallel, they rely on non-standard optical instrumentation and light sources not readily available to most researchers, or they preclude arbitrary nanoscale pattern formation. In order to produce complex patterns, established approaches including electron-beam lithography, focused ion beam (FIB) lithography, and scanning probe microscopy (SPM)-based techniques such as dip-pen nanolithography (DPN) have been employed. Near-field scanning optical microscopy (NSOM)-based techniques and scanning near-field photolithography (SNP) are promising custom lithographic methods for sub-diffraction limit patterning, but are inherently low throughput and restricted to scan areas several hundred microns in length.

In order to generate sub-diffraction limit features, SNP optics rely on the evanescent field of incident light passing through an aperture, the intensity of which is strongly dependent on the distance between this aperture and the surface. To control precise aperture heights and lateral registry, SNP relies on feedback systems used in piezo-controlled SPM instruments. Though highly parallel two-dimensional (2D) silicon-based NSOM aperture arrays have been fabricated, aligning a large area substrate surface with near-field proximity to this hard, non-deformable aperture array remains challenging. As a result, no successful demonstrations of their use in homogeneous patterning have been reported.

Beam pen lithography (BPL) is another desktop fabrication technique, which uses light to write patterns, as opposed to electrons and other particle-based techniques. Near-field apertures in a BPL tip array offer a direct route to circumvent the diffraction limit present in conventional photolithography. However, BPL is limited in that all tips in the array act in unison, making this technique only useful for generating replicas of patterns, and the apertures are either constructed serially using a focused ion beam or in parallel using a mechanical stripping technique that yields large micron-sized pores.

SUMMARY

In accordance with an embodiment of the disclosure, a method of patterning can include dividing an image into a set of frame sections; determining a tip pattern for a respective portion of an image to be patterned by each tip of the tip array in each frame section of the set of frame sections; disposing the tip array in a patterning position in a first location of the substrate corresponding to a location of the substrate in which the first frame section in the set of frame sections is to be patterned; projecting a first pattern of radiation onto the tip array to selectively irradiate one or more tips of the tip array and pattern the substrate, wherein the first pattern of radiation corresponds to a tip pattern for the first frame section; disposing the tip array in a patterning position in a second location of the substrate corresponding to a location of the substrate in which the second frame section in the set of frame sections is to be patterned; projecting a second pattern of radiation onto the tip array to selectively irradiate tips of the tip array and pattern the substrate, wherein the second pattern of radiation corresponds to a tip pattern for the second frame section; and repeating the disposing and projecting for each frame section in the set of frame sections to pattern the image.

In accordance with another embodiment of the disclosure, a method for patterning a substrate using projected radiation can include (a) subdividing an image to be patterned into frame sections, wherein each frame section corresponds to a portion of the image to be patterned on a substrate by each pen of a tip array in a patterning location; (b) receiving a set of data inputs, the set of data inputs comprising a spatial size of the image, a center location of the image, rotational offset of the image, a delay time, an exposure time, and a safety time; (c) outputting an instruction data set based the set of data inputs; (d) receiving with a control system for the tip array the instruction data set for directing movement of the tip array to a patterning location; (e) disposing the tip array in a patterning position in a first patterning location; (f) detecting a Z-piezo voltage, wherein a threshold voltage corresponds to the tip array being in a patterning position; (g) projecting onto the tip array a first pattern of radiation after detecting the threshold voltage; the first irradiation pattern selectively irradiate the tip array to pattern a first portion of the image corresponding to a first subset of the frames sections located in the first patterning location; (h) maintaining projection of the first pattern of radiation for an exposure time; (i) maintaining the tips in the patterning position for a hold time equal to the exposure time, the delay time, and the safety time to pattern the first portion of the image on the substrate; (j) stopping projection of the first pattern of radiation after the exposure time has lapsed; (k)

removing the tips from the patterning position after the hold time has lapsed; (l) moving the tips to a second patterning location once the tips are removed from the patterning position, the spatial location of second patterning location being provided by the instruction data set; and, (m) repeating steps (e)-(k) at the second patterning location to pattern the substrate in a second patterning location.

In accordance with an embodiment of the disclosure, a method of aligning a tip array and pattern of radiation projected from a projector can include positioning a projector comprising a digital micromirror device and a macro lens a distance from a tip array, the distance being substantially equal to the focal length of the macro lens; aligning the digital micromirror device, the macro lens and a beam splitter using an optical breadboard; displaying a first test pattern of radiation from the projector and projecting the first test pattern onto the tip array, wherein the first test pattern has first ratio of L/N, wherein L is the number of mirrors disposed on an edge of an illuminated portion of the test pattern and N is the number of tips disposed on an edge of an illuminated portion of the test pattern; observing the projected test pattern projected on a back surface of the tip array; adjusting the position of the digital micromirror device to center the first test pattern on the tips disposed in the irradiate portion of the first test pattern; adjusting the position of the beam splitter until the test pattern is in rough focus on the tip array; adjusting the focal length of the macro lens until the test pattern is in sharp focus; projecting a second test pattern of radiation onto the tip array, wherein the second test pattern has a second ratio of L/N that is smaller than the first ratio of L/N; adjusting the size, orientation, and position of the second test pattern such that the projected second test pattern substantially matches the tips in the array until one tip of the tip array is in the center of each irradiated portion of the second test pattern.

In accordance with an embodiment of the disclosure, a system for patterning a substrate using projected radiation, the system including a tip array coupled to an actuator comprising a piezo driver; a projector including a radiation source; a substrate stage; a control module communicatively linked to the microscope and the projector, the module including a processor for executing instructions stored on a memory, the instructions to: (a) subdivide an image to be patterned into square frame sections, wherein each square frame section corresponds to a portion of the image to be patterned on a substrate by each pen of a tip array in a patterning location; (b) receive a set of data inputs, the set of data inputs comprising a spatial size of the image, a center location of the image, rotational offset of the image, a delay time, an exposure time, and a safety time; (c) generate an instruction data set based the set of data inputs, the instruction set for directing movement of the tip array to a patterning location by the actuator; (d) detect a threshold piezo voltage corresponding to the tip array being in a patterning position; (e) cause the projector to: project a first irradiation pattern onto the tip array after detecting the threshold voltage, wherein the first irradiation pattern corresponds to a first portion of the image and the first portion of the image corresponds to a first subset of the frames sections located in the first patterning location, maintain projection of the first irradiation pattern for an exposure time, and stop projection of the first pattern of radiation after the exposure time has lapsed; (f) cause the actuator and/or substrate stage to: maintain the tips in the patterning position for a hold time equal to the exposure time, the delay time, and the safety time to pattern the first portion of the image on the substrate, remove the tips from the patterning position after the hold time has lapsed, and move the tips to a second patterning location once the tips are removed from the patterning position, the spatial location of second patterning location being provided by the instruction data set; and (h) repeat steps (e) and (f) at the second patterning location to pattern the substrate in a second patterning location.

In accordance with another embodiment of the disclosure, a system for patterning a substrate using projected radiation can include a micro tip array coupled to an actuator; a projector including a radiation source; a substrate stage; a control module communicatively linked to the actuator, optionally the substrate stage, and the projector, the module including a processor for executing instructions stored on a memory, the instructions to: divide an image to be patterned into a set of frame sections; determine a tip pattern for a respective portion of an image to be patterned by each tip of the tip array in each frame section of the set of frame sections; and for each frame section in the set of frame sections, cause the actuator and/or the substrate stage to dispose the tip array in a patterning position in a first location of a substrate corresponding to a location of the substrate in which the first frame section in the set of frame sections is to be patterned; cause the projector to project a first pattern of radiation onto the tip array to selectively irradiate one or more tips of the tip array and pattern the substrate, wherein the first pattern of radiation corresponds to a tip pattern for the first frame section; cause the actuator and/or the substrate stage to dispose the tip array in a patterning position in a second location of the substrate corresponding to a location of the substrate in which the second frame section in the set of frame sections is to be patterned; and cause the projector to project a second pattern of radiation onto the tip array to selectively irradiate tips of the tip array and pattern the substrate, wherein the second pattern of radiation corresponds to a tip pattern for the second frame section.

In accordance with an embodiment of the disclosure, a tip array can include an elastomeric tip substrate layer comprising a first surface and an oppositely disposed second surface, the tip substrate layer being formed from an elastomeric material; a plurality of tips fixed to the first surface, the tips each comprising a tip end disposed opposite the first surface, the tips having a radius of curvature of less than about 1 micron; and an array of heaters disposed on the second surface of the tip substrate layer and configured such that when the tip substrate layer is heated by a heater, a tip disposed in a location of a heated portion of tip substrate layer is lowered relative to a tip disposed in a location of an unheated portion of the tip substrate layer.

In accordance with an embodiment of the disclosure, a method of aligning a tip array and pattern of radiation projected from a projector can include positioning a projector comprising a digital micromirror device and a macro lens a distance from a tip array, the distance being substantially equal to the focal length of the macro lens; aligning the digital micromirror device, the macro lens and a beam splitter using an optical breadboard; displaying a first test pattern of radiation from the projector and projecting the first test pattern onto the tip array, wherein the first test pattern has first ratio of L/N, such that N number of tips is disposed in an irradiated portion of the test pattern; observing the projected test pattern projected on a back surface of the tip array; adjusting the position of the digital micromirror device to center the first test pattern on the tips disposed in the irradiate portion of the first test pattern; adjusting the position of the beam splitter until the test pattern is in rough focus on the tip array; adjusting the focal length of the macro lens until the test pattern is in sharp focus; projecting a second test pattern of radiation onto the tip array, wherein the second test pattern has a second ratio of L/N that is smaller than the first ratio of L/N; adjusting the size, orientation, and position of the second test pattern such that the projected second test pattern substantially matches the tips in the array until one tip of the tip array is in the center of each irradiated portion of the second test pattern.

BRIEF DESCRIPTION OF THE DRAWINGS

FIGS. 2b-d are flowcharts for methods to complete an alignment process for a lithography system according to the disclosure herein;

FIG. 23b-23d show magnified images of different regions of 23a;

FIG. 23e-23i show fabricated Si tip arrays on $SiO_2$/PDMS/glass: e, Si wafer (2×2 cm) on a cured PDMS surface on a glass slide before etching and f, an actual tip array after etching in KOH. g, a SEM image of the Si tip array on $SiO_2$/PDMS/glass with 160 μm in pitch that are uniform with bottom width 30±0.6 μm corresponding to about 47±0.9 μm in pen height; the pen height may vary up to 10% in optimized condition, since the original wafer itself used as a starting material in this experiment has a variation of 10% in thickness; the inset shows the array in a large area that shows the homogeneity of the tips; h, (311) planes were introduced during the wet etching with <110> oriented masks on a (100) Si surface. The measured surface intersection angles, $\alpha_1$ and $\alpha_2$, as defined in this figure were 126.9° and 143.1° that correspond to the tip defining planes of (311); rotation of the intersection of planes to <100>, $\phi$, was 18.4°, and also showed that the tip plane is (311); i, the tip radius of curvature was 22±3 nm.

FIG. 29a is an SEM image of a serpentine resistor formed by projected lithography with a beam pen tip array according to the disclosure herein;

FIG. 29b is an SEM image of resistors, planar capacitors, inductors, and surface acoustic wave sensors formed by projected lithography with a beam pen tip array according to the disclosure herein;

FIG. 29c is a graph illustrating the sheet resistance of the resistors of FIG. 29a;

DETAILED DESCRIPTION

Projected Lithography, for example projected beam pen lithography (pBPL) or projected lithography using heat actuable tip arrays, can allow for rapid patterning of sub-100 nm features in arbitrary arrangements across a cm-scale surface. With pBPL, small features are generated by directing light through small apertures at the apexes of pyramidal tips of a beam pen tip array. With projected lithography using heat actuable tips arrays, light can be used to activate heaters disposed in proximity to tips to selectively bring tips of the array into contact with a substrate for patterning, or selective inking of the tips of the array prior to patterning.

Projected lithography utilizes large tip arrays which can be used to generate large scale, complete images comprising small features by projecting a series of frames of the image onto the tip array as it scans across the surface. For example, projected lithography can advantageously allow for large-scale images to be generated by raster scanning the tip array across a substrate and projecting and rapidly changing the frames projected on the tip array as it raster scans. This allows each point on the substrate to be addressed by the tip array as it scans across the surface. Patterning using projected lithography can also advantageously allow for patterning with variable exposure times (e.g., in grayscale) in which each pen is capable of writing different sized features.

Figure 32:
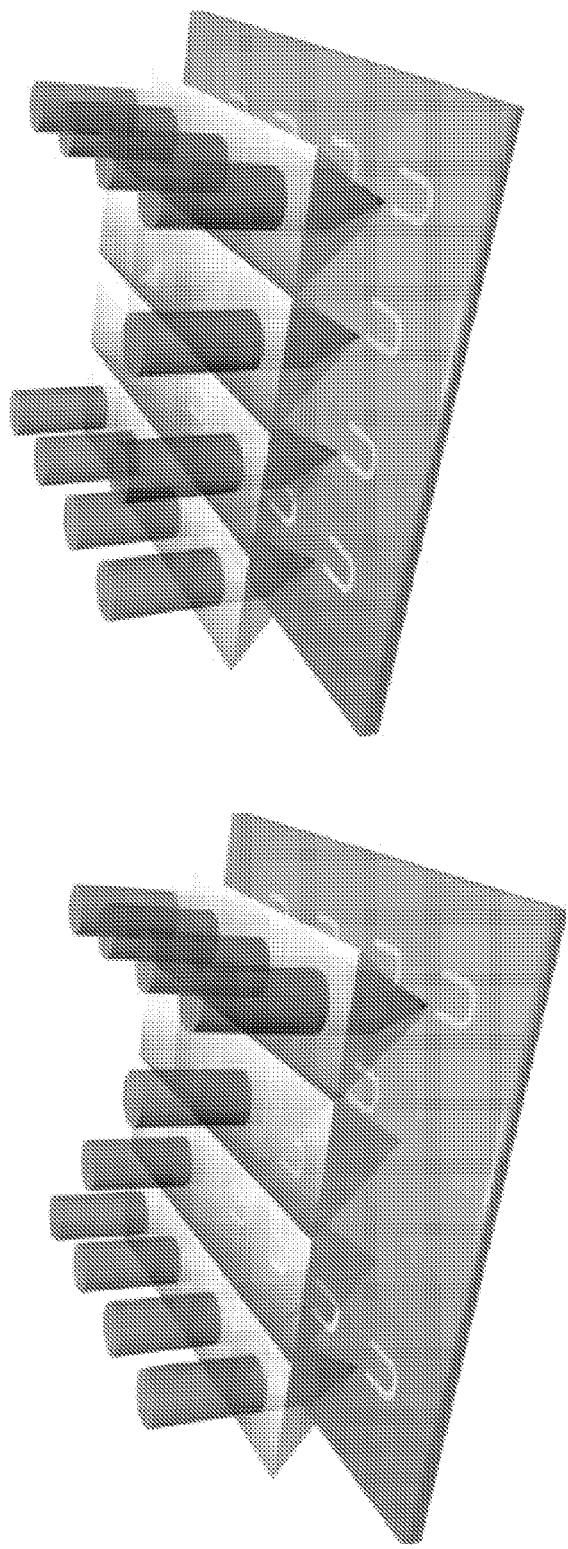
FIG. 32 is a schematic illustration of conventional beam pen lithography patterning.

As compared to conventional BPL and other lithography methods, projected lithography can allow for the patterning of a macro-pattern comprised of micro-patterns without the need to mask the entire tip array in the desired macro-pattern or manipulate the tip array and/or the substrate in the desired micro-pattern. For example, referring to FIG. 32, with conventional BPL a macro-pattern in the shape of an "N" or a "U" can be formed with micro-patterns of "U" by masking the tip array such that the tips are arranged in the "N" or "U" macro-pattern are selectively illuminated and then manipulating the tip array or the substrate in the "U" micro-pattern shape to generate the macro-pattern. Such masking and manipulation of the tip array can be difficult with large macro-patterns and complex micro- or macro-patterns. In contrast, projected lithography allows a base pattern comprising both the macro- and the micro patterns to be subdivided into patterning frames and the tips to be selectively illuminated with an irradiation pattern corresponding to the patterning frame, to pattern each frame of the base pattern while the tip array scans across the substrate. For example, projected lithography can allow for generation of complex patterns while the tip array performs a simple raster scan across the substrate surface. Projection of the irradiation patterns corresponding to patterning frames can be rapidly changed as the tip array is scanned across the substrate to generate large, complex patterns rapidly and without complex manipulation of the tip array. This advantageously eliminates the need to manipulate the tip array and/or the substrate in complex patterns or perform complex masking of the tips in the form of the complete image of the macro-pattern.

In one embodiment, a method for patterning using projected lithography can include dividing an image into a set of frame sections and determining a tip irradiation pattern for a respective portion of an image to be patterned by selected tips of the tip array in each frame section of the set of frame sections. The tip array can be positioned in a patterning position in a first location of the substrate corresponding to the location of the substrate in which a first frame section in the set of frame sections is to be patterned. The first frame section is patterned by projecting a first pattern of radiation onto the tip array to selectively irradiate one or more tips of the tip array and pattern the substrate. The first pattern of radiation corresponds to a tip irradiation pattern for the first frame section. The method can further include disposing the tip array in a patterning position in a second location of the substrate corresponding to a location of the substrate in which the second frame section in the set of frame sections is to be patterned. The second frame section can be patterned by projecting a second pattern of radiation onto the tip array to selectively irradiate tips of the tip array and pattern the substrate, wherein the second pattern of radiation corresponds to a tip irradiation pattern for the second frame section. The positioning and projecting steps can be repeated for each frame section in the set of frame sections. The tip array can be positioned in the patterning location by moving the tip array and holding the substrate still, moving the substrate and holding the tip array still, or by moving both the tip array and the substrate.

In one embodiment of the disclosure, a system for projected lithography includes a tip array and a projector for projecting an irradiation pattern onto the tip array to selectively illuminate (e.g., irradiate) and/or actuate one or more tips of the tip array. The projector can be communicatively coupled to a computer device for manipulating the irradiation pattern projected onto the tip array based on the spatial location of the tip array and the portion of the image to patterned in that spatial location.

Figure 1A:
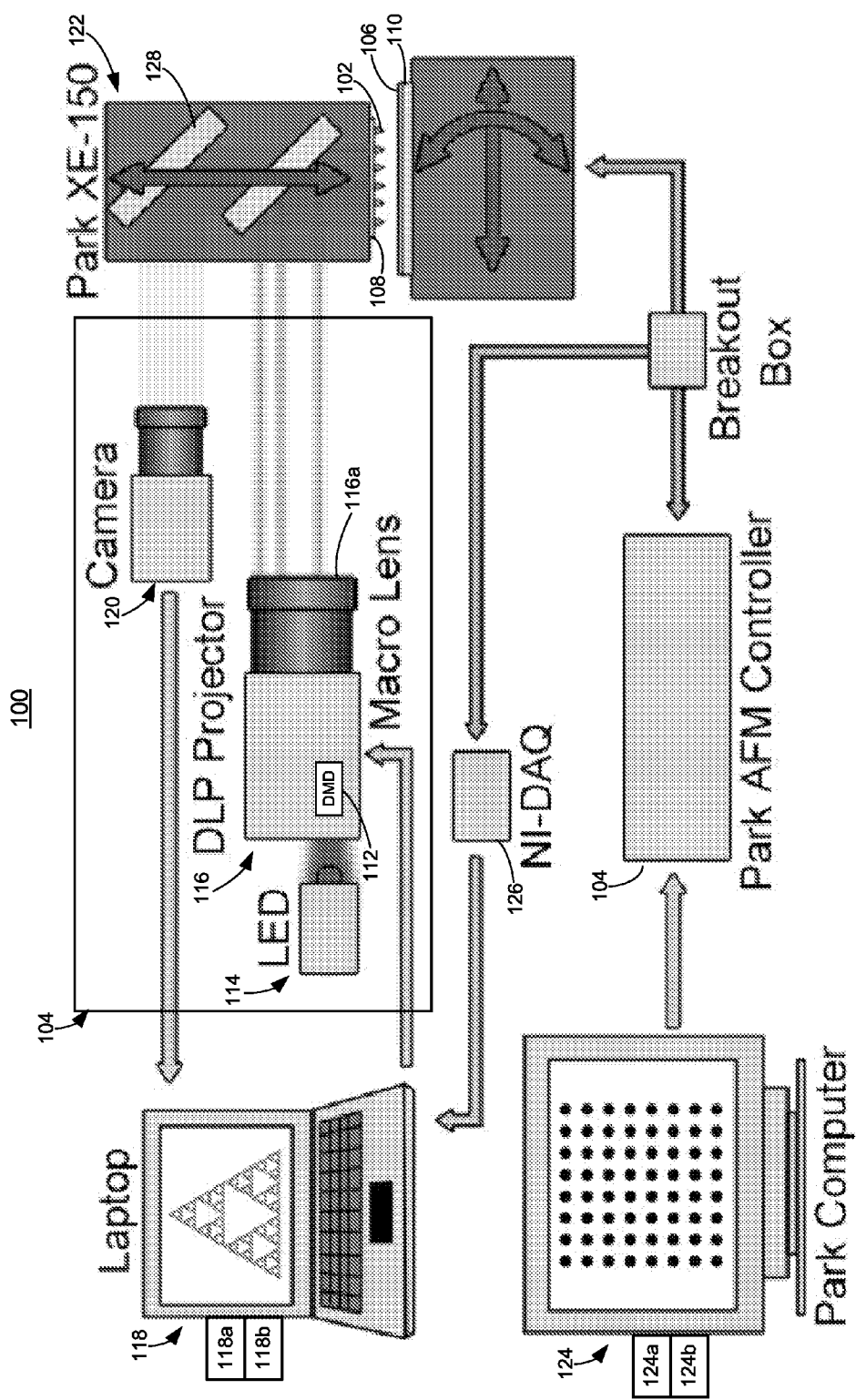
FIG. 1a is a high-level illustration of one embodiment of a lithography system according to the disclosure herein.

FIG. 1a illustrates an embodiment of projected lithography and specifically pBPL. As shown in FIG. 1a, pBPL includes an array of tips having near-field apertures that are each individually addressed by a light source. For example, collimated light from a light source, such as a UV light emitting diode (LED) can be spatially modulated by micromirrors of a digital micromirror device (DMD) and directed onto the back of the tip array in registry with the tips. The light addressing each of the tips can be modulated by tilting the mirrors in the DMD directed at that tip. Once the light reaches the tip array, the mechanical compliance of the tips in the array and the nanoscale size of the apertures in the array allow the tip array to perform near-field lithography (for example, in the embodiment illustrated in FIG. 1a) or to selectively actuate the tips by activating heaters disposed on the tip array, as described in detail below.

Figure 28:
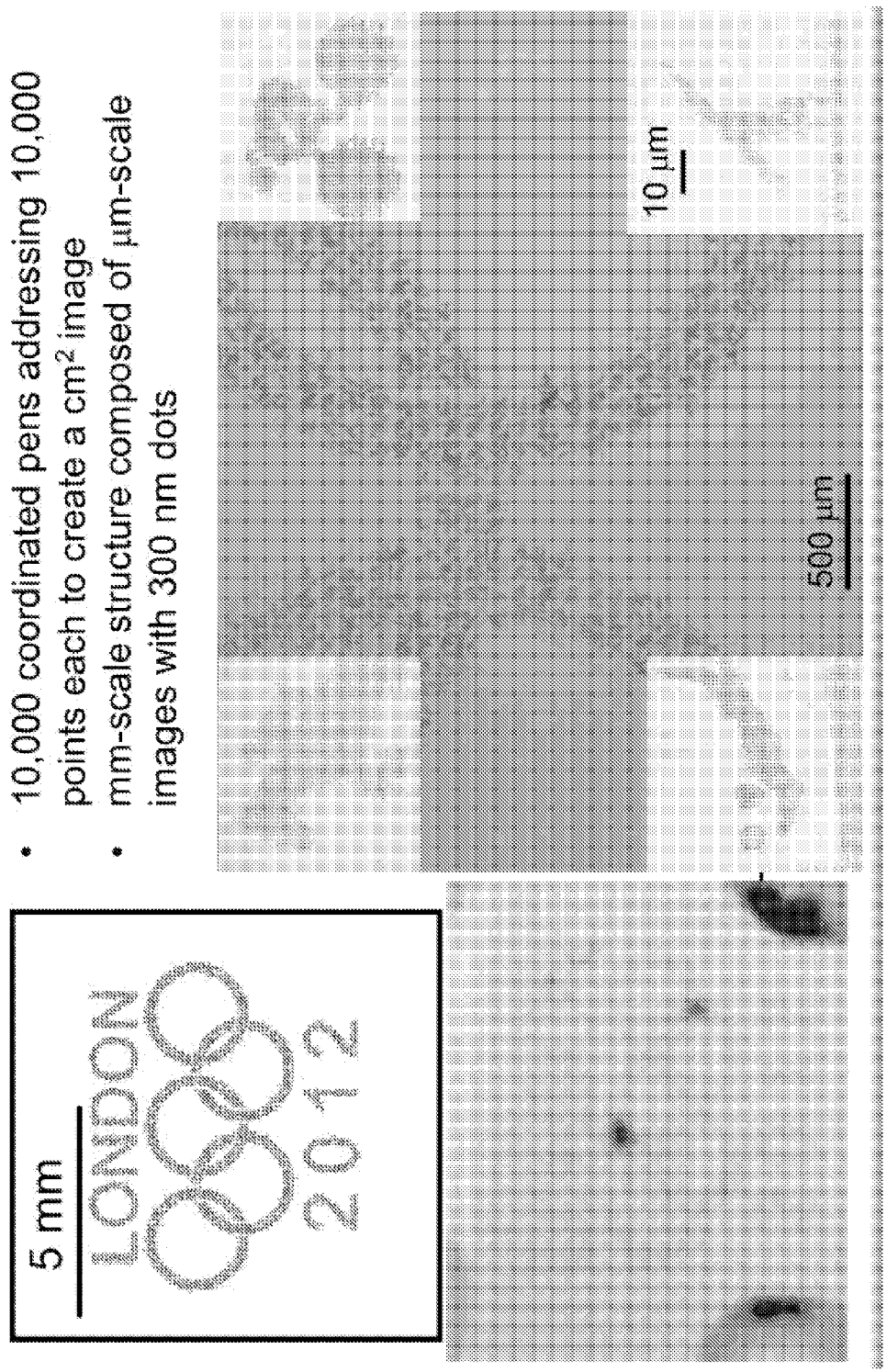
FIG. 28 is an SEM image of a pattern formed by projected lithography according to the disclosure herein; the pattern was formed using 10,000 coordinated tips addressing 10,000 points each creating a $cm^2$ image; the pattern includes mm-scale structures composed of micron-scale images with 300 nm dots
Figure 31:
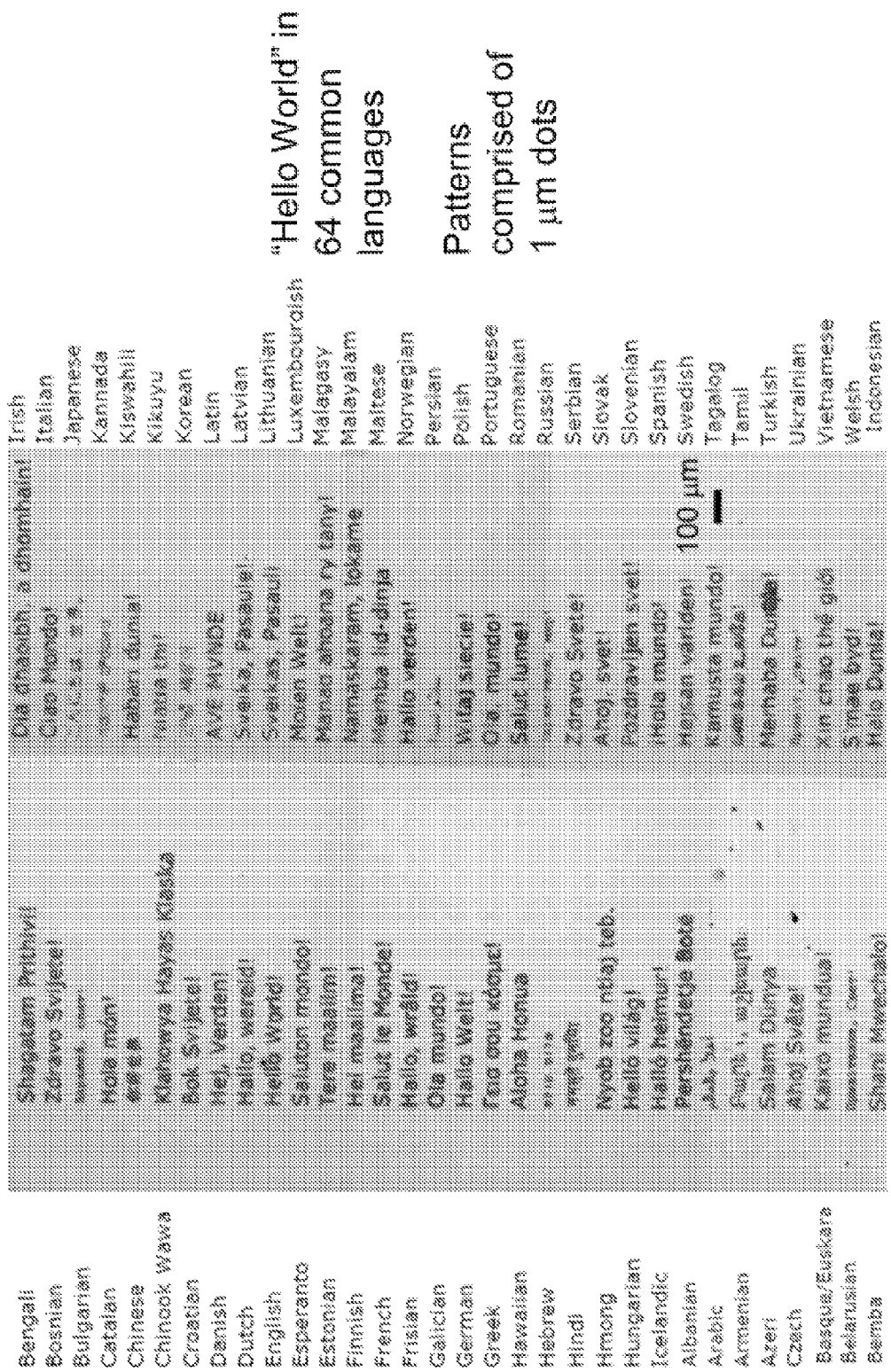
FIG. 31 is an SEM image of a pattern formed by projected lithography according to the disclosure herein; the pattern is the phrase "Hello World" written in sixty-four languages with patterns comprised of 1 μm dots.

FIGS. 28 and 31 illustrate examples of complex patterns that can be advantageously formed using projected lithography.

Figure 10A:
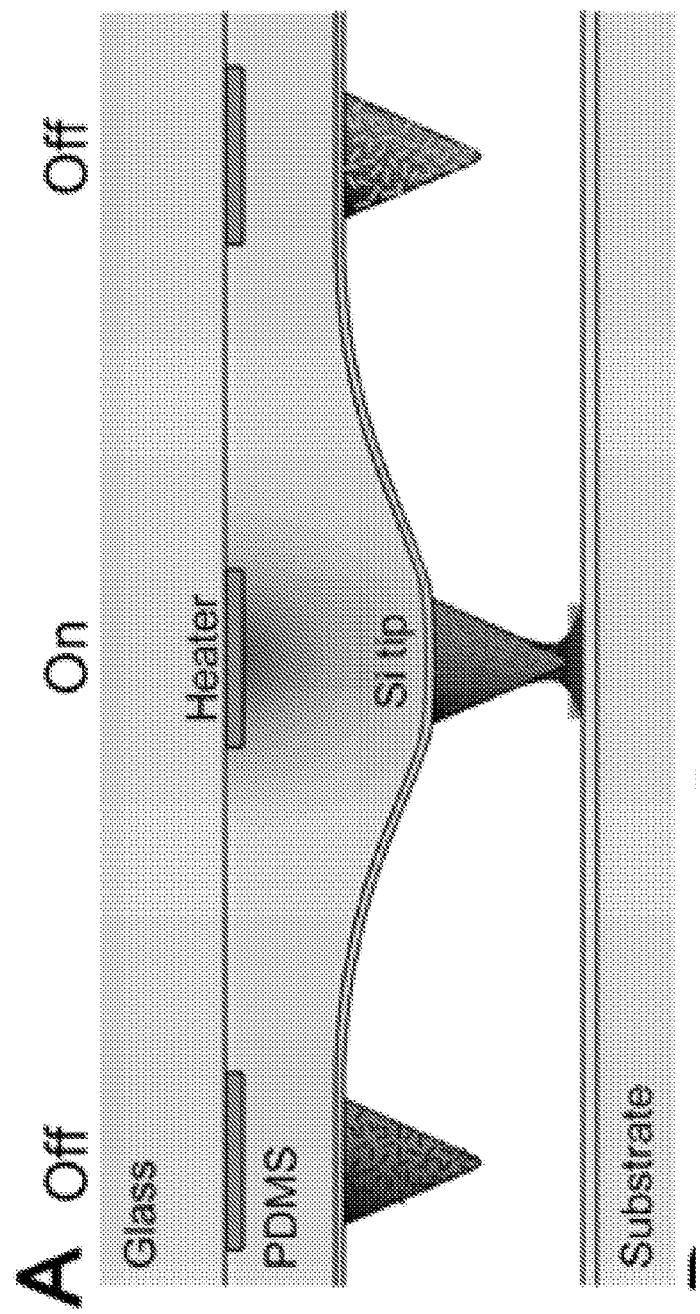
FIG. 10a is a schematic illustration of thermal actuation of a tip array in accordance with an embodiment of the disclosure herein.
Figure 10B:
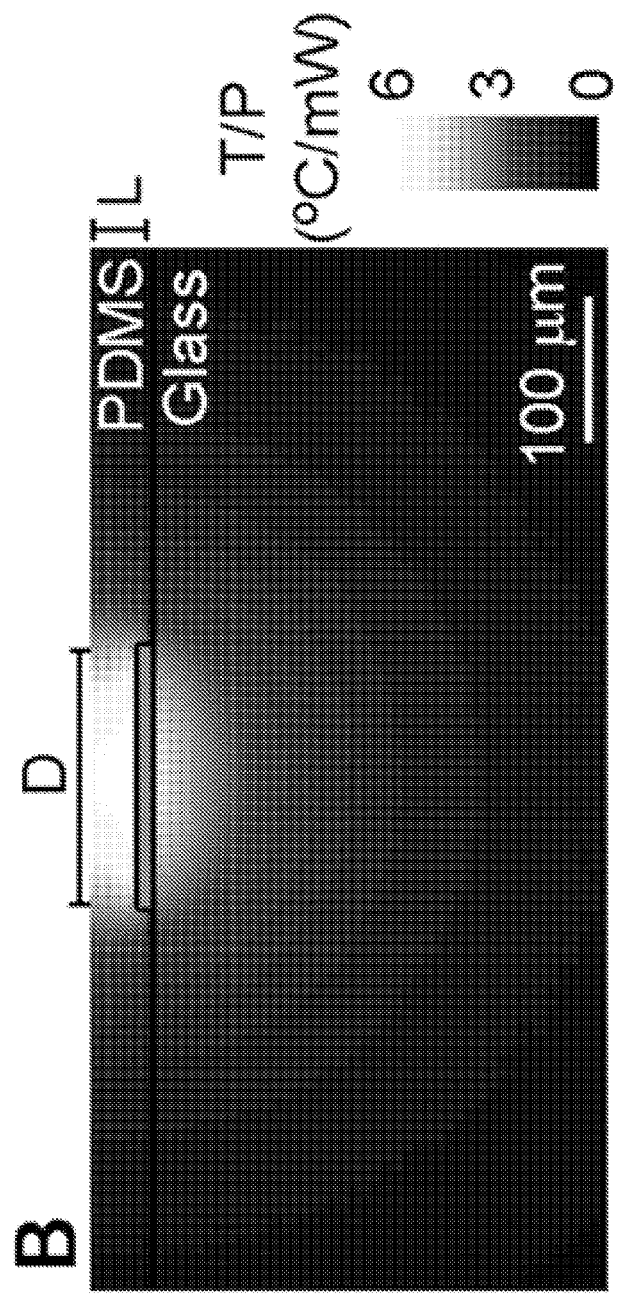
FIG. 10b is a simulation of the heat profile in a PDMS and glass substrate according to the disclosure herein.

In accordance with embodiments of the disclosure, a tip array having individual addressability of tips provided by selectively and locally heating the tips of a tip array is provided. The heat actuable tip arrays can be used alone or in connection with the pBPL system described herein. As discussed in detail below, the heat actuable tip arrays include tips disposed on a common elastomeric tip substrate layer and can be selectively actuated by selective heating of portions of the elastomeric tip substrate layer in the region of the tip or tips to be actuated. As illustrated in FIG. 10a, heating of the tip substrate layer thermally expands the heated region of the tip substrate layer, thereby lowering (in the orientation illustrated) the tip disposed in the heated region relative to tips disposed in an unheated region of the tip substrate layer. In one type of embodiment, heaters are disposed on the common substrate layer to provide for the selective actuation of the tips. In another, non-exclusive type of embodiment, heaters are disposed on the backs of the tips to provide for the selective actuation of the tips. Advantageously, the heaters can be photo-activated heaters, for example, and can optionally be activated in connection with the projected lithography system described herein, although non-photo-activated heaters are also contemplated.

In any of the patterning methods disclosed herein, it should be understood that the tip arrays can be intentionally tilted relative to the substrate, such as is described in International Patent Publication No. WO 2011/071753.

Projected Lithography System

Projected pen lithography is a lithography system that may include a tip array coupled with a projector, for example, a digital micromirror device (DMD), to direct light to specific locations on a surface with spatial high resolution. Various embodiments of tip arrays may be used with projected lithography including a beam pen lithography tip array and a heat actuated tip array as described in detail below.

In a projected lithography system, a tip array may be combined with a projection system to allow for rapid patterning of sub-100 nm features in arbitrary arrangements across a large (e.g., cm-scale) surface. Some embodiments of projected lithography may represent a significant advance in capabilities over conventional tip-based lithography systems. For example, in projected lithography systems, a projector may allow the substrate to be patterned in any conceivable pattern, versus conventional lithography in which typically copies of the same pattern are written in parallel by all tips. Further, in embodiments in which the tip array is a beam pen lithography tip array, the size of features may be controlled through the intensity of light used in pBPL. Thus, pBPL may allow for different tips in the array to create different sized features.

FIG. 1a illustrates a system for projected lithography 100, though any suitable lithography platform may be used in the systems and methods described herein (e.g., a Park AFM platform such as a XEP made by Park Systems Co., Suwon, Korea or platforms made by NanoInk Inc., Skokie, Ill.). The system 100 may include any number of computing devices and components that are communicatively coupled via a network such as the Internet or other type of networks (e.g., LAN, a MAN, a WAN, a mobile, a wired or wireless network, a private network, or a virtual private network, etc.). Each component of the system 100 may include a processor configured to execute instructions of one or more instruction modules stored in computer memory.

The system 100 may combine a tip array 102 on a translational stage with a light projection system 104 to form a platform for writing patterns on a surface 106. The tip array 102 may include millions of elastomeric pyramidal tips. It should be understood herein that radiation sources other than light can be used with the systems described herein. The use of the term "light" should be understood to include any suitable wavelength of radiation and any suitable radiation source unless specified otherwise. Various types of tips arrays may be used, as described in detail below. In one embodiment, the projected lithography system includes a beam pen tip array, which includes tips having a near field aperture for exposing a substrate with irradiation. The projected radiation selectively activates the tips of the tip array by passing through activated tips to expose the substrate. In another embodiment, the projected lithography system includes a heat actuated tip array. As discussed in detail below, such tip arrays include a tip substrate layer having tips extending from a first surface of the tip substrate layer and an array of heaters disposed on a second surface opposite the first surface. The heaters can be photoconductive heaters, which are activated upon exposure to radiation. In such embodiments, the projected lithography system projects a pattern of radiation onto the heaters of the tip array to selectively activate irradiated heaters and thereby heat the tip substrate layer in the region of the heater and lower (as shown in the orientation of FIG. 10a) the tip in the region of the heated tip substrate layer. Methods of patterning using heat actuation of tips are described in detail below. The projected lithography system described herein can be used as the radiation source and control system for the selective activation of the heaters.

Various hardware and software components may direct light to the surface of the tip array 102 at predetermined times in coordination with scanning, for example, raster scanning, of the tip array with respect to a surface. The array 102 may include any of the various embodiments for a tip array as herein described.

The projected lithography system 100 can utilize a modified Park Systems XE-150 Scanning probe platform. The tip array 102 may be magnetically mounted on a scanner head 108. The head 108 may include a square frame with a 1×1 cm$^2$ aperture to allow optical addressing of each tip in the array 102. The scanner head 108 may be vertically (z-direction) positioned by a piezoelectric driver on the head. Samples for lithography may be held on a vacuum chuck on a stage 110 below the head which may be positioned in X and Y dimensions with stepper motors for coarse positioning and piezoelectric scanners for fine positioning. Additionally, the sample may be rotated with stepper motors (roll and pitch) to level the sample with respect to the beam tip array 102. A digital micromirror device (DMD—DLP LightCommander—Logic PD) 112 can allow the system 100 to project spatial patterns onto the tip array 102. A collimated light source 114 (e.g., a collimated 440 mW 405 nm LED light source such as a M405L2 made by Thor Labs USA) may be used in conjunction with a digital light processing projector (DLP) with a macro lens (e.g., AF Micro-Nikkor 200 mm f/4D IF-ED) 116 to focus an image generated by the DMD 112 onto the surface of the beam tip array 102. The image projected by the DMD 112 onto the surface of the tip array 102 may be controlled by a first computer 118 including a processor 118a and memory 118b. In some embodiments, the processor 118a executes instructions stored in the memory 118b. For example, the instructions may include custom software written in a technical computing language (e.g., MATLAB, The Mathworks Inc.). Alignment between the projected image and the tip array 102 may be monitored by a camera 120 (e.g., a digital camera such as a CCD camera like the PLB782 made by PixeLINK). This alignment may be adjusted using an interface (e.g., a MATLAB interface executing on the first computer 118). During printing, the motion of a scanning probe microscope 122 (e.g., a Park XE-150) may be controlled by a second computer 124 including a processor 124a and memory 124b that stores scanning probe software instructions for execution using the processor 124a. The state of the projector 116 may be controlled by the first computer 118. To coordinate the actions of the first computer 118 and the second computer 124, the first computer 118 may monitor the voltage supplied to the z-piezo through a data acquisition module (DAQ) 126 (e.g., a NI-USB 6212). As described herein, arbitrary patterns may be created by projecting a series of images as the scanning probe instrument scans across the surface to be patterned.

In another embodiment, the system 100 may include a Zeiss microscope with a light source having a wavelength in a range of about 360 nm to about 450 nm. Movement of the tip array 102 when using the Zeiss microscope may be controlled, for example, by the microscope stage 108.

In various embodiments, the projector 116 includes the DMD 112 and the macro lens 116a for focusing the irradiation pattern emitted by the DMD 112 onto the tip array 102. The digital micromirror device can include any commercially available device having a suitable radiation source for the desired patterning. Historically, photolithography has used ultraviolet light from gas-discharge lamps using mercury, sometimes in combination with noble gases such as xenon. These lamps produce light across a broad spectrum with several strong peaks in the ultraviolet range. This spectrum is filtered to select a single spectral line, for example the "g-line" (436 nm) or "i-line" (365 nm). More recently, lithography has moved to "deep ultraviolet," for example wavelengths below 300 nm, which can be produced by excimer lasers. Krypton fluoride produces a 248-nm spectral line, and argon fluoride a 193-nm line. In principle, the type of radiation used with the present apparatus and methods is not limited. One practical consideration is compatibility with the tip array 102 materials chosen and the digital micromirror device. For example, the radiation can be in the wavelength range of about 300 nm to about 600 nm. For example, the radiation optionally can have a minimum wavelength of about 300, 350, 400, 450, 500, 550, or 600 nm. For example, the radiation optionally can have a maximum wavelength of about 300, 350, 400, 450, 500, 550, or 600 nm. In some embodiments, the wavelength can be greater than 400 nm to avoid damage to a digital micromirror device 112. For example, the wavelength can be about 405 nm. An exemplary commercially available digital micromirror device 102 is the DLP5500 (Texas instruments). In various embodiments, the commercially provided light source can be replaced with a collimated 440 mW 405 nm LED light source (M405L2—Thor Labs USA). The digital micromirror device DLP550 chip is a 0.55" chip with 10.8 μm pitch pixels with XGA resolutions (1024/758 independent pixels).

Any commercially available lens having a suitable minimum focal length, for example, of about one foot, can be used for the macro lens 116a. Nikon f-mount lens, such as 105 mm f/2.8G ED-IF AF-S VR Micro-Nikkor Lens (Nikon), are exemplary commercially available lenses suitable for use in pBPL. In various embodiments, a macro lens 116a having an adjustable focal length is used. The macro lens 116a can be used to selectively allow the light from multiple mirrors of the digital micromirror device 112 to be focused onto a single pen of the tip array, and thus adjust the intensity. Selection of the focal length of the macro lens 116a in combination with the distance between the tip array 102 and the lens 116a can be used to tailor the number of mirrors that focus light on a single pen. For example, the ratio of mirrors focusing light onto a pen can be in a range of about 1:1 to about 100:1, about 10:1 to about 90:1, about 20:1 to about 80:1, about 30:1 to about 70:1, about 40:1 to about 60:1, about 50:1 to about 75:1, 1:1 to about 40:1, about 5:1 to about 35:1, about 10:1 to about 30:1, and about 15:1 to about 25:1. Other suitable ratios include, for example, about 1:1, 5:1, 10:1, 15:1, 20:1, 25:1, 30:1, 35:1, 40:1, 45:1, 50:1, 55:1, 60:1, 65:1, 70:1, 75:1, 80:1, 85:1, 90:1, 95:1, and 100:1.

Methods of Patterning Using Projected Lithography

While the system 100 illustrated in FIG. 1a may include one or more instruction modules stored in the memory 118b for execution by the processor 118a of the first computer 118, some or all of the components and functions of the system 100 described herein may also be incorporated on the second computer 124, the controller 104, the DAQ 126, etc. Further, any instruction module of the system 100 may be implemented as a separate module or system.

The irradiation pattern projected by the projector 116 can be controlled using the first computer 118 including computer software executed by the processor 118a and stored in the memory 118b to interface with the control system of the lithography system 100. In some embodiments, the system 100 may execute instructions for alignment and then execute a lithography printing process.

Hardware Alignment of the Projector and Tip Array

The projector and the tip array can be aligned by positioning the projector, for example, a digital mirror device, a suitable distance from the tip array. In various embodiments, the distance is substantially equal to the focal length of a macro lens of the projector.

The macro lens, the digital mirror device, and optionally a beam splitter can be aligned in a generally parallel plane. For example, alignment can be achieved using an optical breadboard in which the holes of the optical breadboard are utilized to achieve parallel alignment. A test pattern, for example, a pattern of dots, can be projected from the projector (for example, the digital mirror device) onto a back plane of the tip array. When a beam splitter is used, a camera can be focused to observe the back plane of the tip array through the beam splitter. The position of the digital mirror device can then be adjusted to center the test pattern on the tip array.

In embodiments utilizing a beam splitter, the position of the beam splitter can be adjusted until a roughly focused irradiation pattern is observed, for example, by a camera focused on the beam splitter.

The focal length of the macro lens can then be adjusted until the edge of the test pattern is sharp and clearly observed by a camera, if used. In various embodiments, the focal length of the macro lens can be adjusted to selectively adjust the number of mirrors focusing irradiation on a single pen of the tip array. For example, about 1 to about 50 mirrors can focus irradiation on a single pen. Other examples of the number of mirrors that can focus irradiation on a single pen include a range of about 2 to about 45, about 4 to about 40, about 6 to about 35, about 8 to about 30, about 10 to about 25, about 12 to about 20, and about 14 to about 18. For example, about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 tips can focus irradiation onto a single pen.

The test pattern can then be checked for distortion across the entire tip array to ensure that the focal plane of the macro lens is parallel to the plane of the tip array.

Figure 2A:
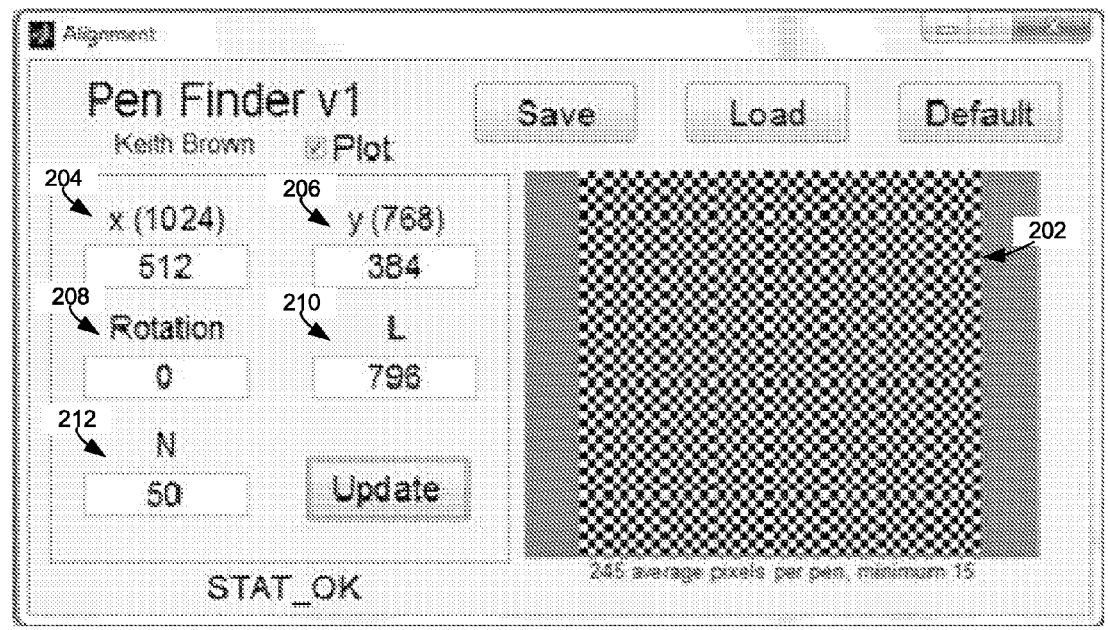
FIG. 2a is a user interface for computer-implemented alignment of a lithography system according to the disclosure herein.

FIG. 2a illustrates an alignment user interface 200 and FIG. 2b illustrates a block diagram of a method 250 for aligning the system 100 for executing a lithography printing process. As described below, the user interface 200 may facilitate execution of other instructions stored in the memory 118b to complete the alignment.

The method 250 may include one or more blocks, modules, functions, or routines in the form of computer-executable instructions that are stored in a tangible computer-readable medium and executed using a processor (e.g., processor 118a) of a computing device (e.g., the first computing device 118). The methods may be included as part of any modules of a computing environment for the lithography system 100, or as part of a module that is external to such a system. For example, the methods may be part of the second computer 124, the controller 104, an AFM 122, a DAQ 126, or other system component. FIGS. 2a and 2b will be described with reference to other figures for ease of explanation, but the methods may of course be utilized with other objects and user interfaces.

Alignment between the light projected from the projector 116 and the beam tip array 102 is necessary to achieve individual addressability of each tip in the array. Since the DMD 112 is not transparent and designed to redirect light at a specific angle of incidence, it cannot be directly attached to the tip array 102. In some embodiments, the DMD 112 may be positioned in a far field projection mode where focusing optics reproduce an image directed by the projector 116 on the surface of the DMD 112 on a distant object. With a combination of optical and software adjustments, the alignment process may ensure that the pattern generated by the DMD is reproduced in focus and in the correct location of the beam tip array 102.

With reference to FIG. 2b, at block 252, a light pattern generated by the DMD may be focused on the plane of tip array 102 with minimum distortion. In one embodiment, a lens with a minimum focal length of twelve inches (30.5 cm) may be employed to focus the light from the DMD. At block 254, the light pattern may be guided onto the scanning probe platform and reflected onto the beam tip array by a beam splitter. Generally, the distance between lens 116a and tip array 102 should be identical to the focal length of the lens 116a and the focal plane of the light pattern needs to be parallel to the plane of tip array 102, otherwise only part of the tip array 102 will be in focus. To accomplish this manual adjustment, at block 256, the light pattern on the tip array 102 may be monitored by the camera 120.

FIG. 2c illustrates one method 275 for monitoring the light pattern using the camera 120. At block 276, the DMD 112 may be positioned a fixed distance from a head of the scanning probe microscope 122. In some embodiments, the method 275 may position the DMD ten inches (25.4 cm) from the scanning probe head. At block 278, the method 275 may align the center lens 116a, a beam splitter, and a mirror 128. In some embodiments, block 278 may include instructions to use a rectangular array of holes in the optical breadboard of the microscope 122 as a starting point. At block 278, the method may display a test pattern with the projector 116 and use the visible light to fine tune this alignment. At block 280, the method may fine tune the alignment by engaging the camera 120 to observe the back plane of tip array 102 through a beam splitter. At block 282, the method 275 may focus the camera until a clear image of the tips of the tip array is observed. At block 284, the method may adjust the position of DMD 112 in both horizontal and vertical direction to make sure the light pattern is centered on the tip array 102. In some embodiments, the position of the DMD may be adjusted with finely adjustable mechanical standings. At block 286, the method may adjust the position of the beam splitter until a roughly focused light pattern is observed by the camera and at block 288, the method may adjust the focal length of the projector lens until the edge of light pattern is sharp and clearly observed by the camera. At block 289, the method may check the distortion of light pattern across the whole beam array to make sure the focal plane of lens is parallel to the plane of tip array. If the pattern is out of focus, the method may repeat blocks 282-288 until the pattern is as crisp as possible.

Software Alignment of the Projected Image and the Tip Array

Figure 2E:
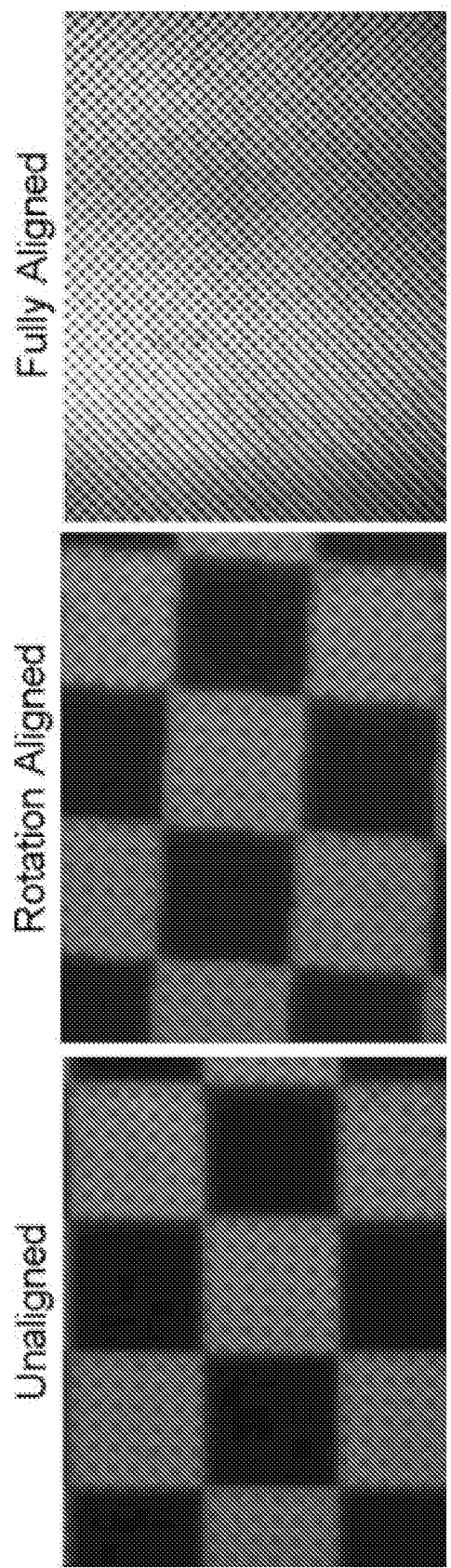
FIG. 2e is an optical image illustrating the checkerboard alignment process in accordance with an embodiment of the disclosure herein.

Referring to FIG. 2e, the projected image and coordination of the software program controlling the projection of the irradiation patterns can be aligned using a checkerboard irradiation test pattern. A first test pattern can be projected onto the tip array. For example, the first test pattern can be a checkerboard pattern. The first test pattern has a large ratio of L/N, such that each illuminated region of the test pattern contains at least a 5×5 array of tips (FIG. 2e, left and center images). N refers to the number of tips on an edge of the test pattern and L is the number of mirrors on an edge of the test pattern. The ratio L/N describes how many mirrors address each tip. $N^2$ is the total number of tips in the test pattern. For example, in a checkerboard test pattern, N2 is the total number of tips in a single illuminated square. L2 is the total number of mirrors in the illuminated portion of the test pattern, for example an illuminated square of a checkerboard test pattern. The arrangement of the tips of the tip array in the test pattern is observed, for example, using a camera focused on a beam splitter, to determine whether any of the tips in the illuminated square region cross an edge of the square region. If one or more tips cross the illuminated square region, the test pattern is rotated until the tips are aligned along the edge of the illuminated square region. Rotation of the test pattern accounts for any rotation of the tip array. Once rotational alignment of the first test pattern and the tips of the tip array is achieved, a second test pattern, for example, a checkerboard test pattern, is projected onto the tip array. The second checkerboard test pattern has an increased N value such that a single pen is in a single illuminated square of the second test pattern (FIG. 2e, right image). For example, where the first test pattern is selected such that each illuminated square of the test pattern contains a 5×5 array of tips, the second test pattern is selected to have a value of 5N, while maintaining the same L value of the first test pattern. The second checkerboard pattern is then observed on the tip array, for example using a camera through a beam splitter, and the second test pattern is adjusted in the x and y directions to center each pen in the illuminated square, thereby aligning the projected pattern with the tip array. The rotational and translational adjustments made to align the test patterns are maintained within the software program, which utilizes such values when projecting irradiation patterns for patterning a substrate to ensure alignment of the projected irradiation pattern and the tip array.

FIG. 2d illustrates a block diagram of a method 290 to further align the system 100 for executing a lithography printing process. While method 275 aligns the optical hardware 104 to the tip array 102, there may still be no registry between the tips in the array and the pixels in the DMD 112. Thus, the method 290 generally adjusts the parameters of the DMD 112. With reference to FIG. 2a, a checker board pattern image 202 may be displayed on the projector 116. The size, orientation, and position of the image 202 may be adjusted in software until the projected image matches the tips in the array 102. For example, "X" 204 and "Y" 206 may determine the center of the checker board; "Rotation" 208 may allow for compensation if the beam tip array is slightly rotated, "L" 210 may include the edge length of the board counted as mirrors in the DMD while "N" 212 may include the edge length of the board in tips on the tip array. "L/N" may give the period of the checker board, and also dictates how many mirrors direct light to each pen. Mirrors in the DMD are grouped in this way by the method 290 to achieve one to one correspondence with the BPL tips. To tune this alignment, the method 290 may monitor the image 202 projected on the surface of the beam tip array 102.

At block 291, the rotational mismatch is the first parameter to be tuned. A large value of L/N may be selected so that more than 5×5 tips are located in one square. By checking across the tip array 102, the method 290 may determine if any row or column of tips crosses the edge of square. If they do, the rotational angle needs to be adjusted. A value of the Rotation 208 may be changed to ensure the light pattern is finally in the same rotational angle of the tip array. At block 292, the method may adjust the L value 210 and the N value 212 to approach a coarse value of L and N.

Figure 3:
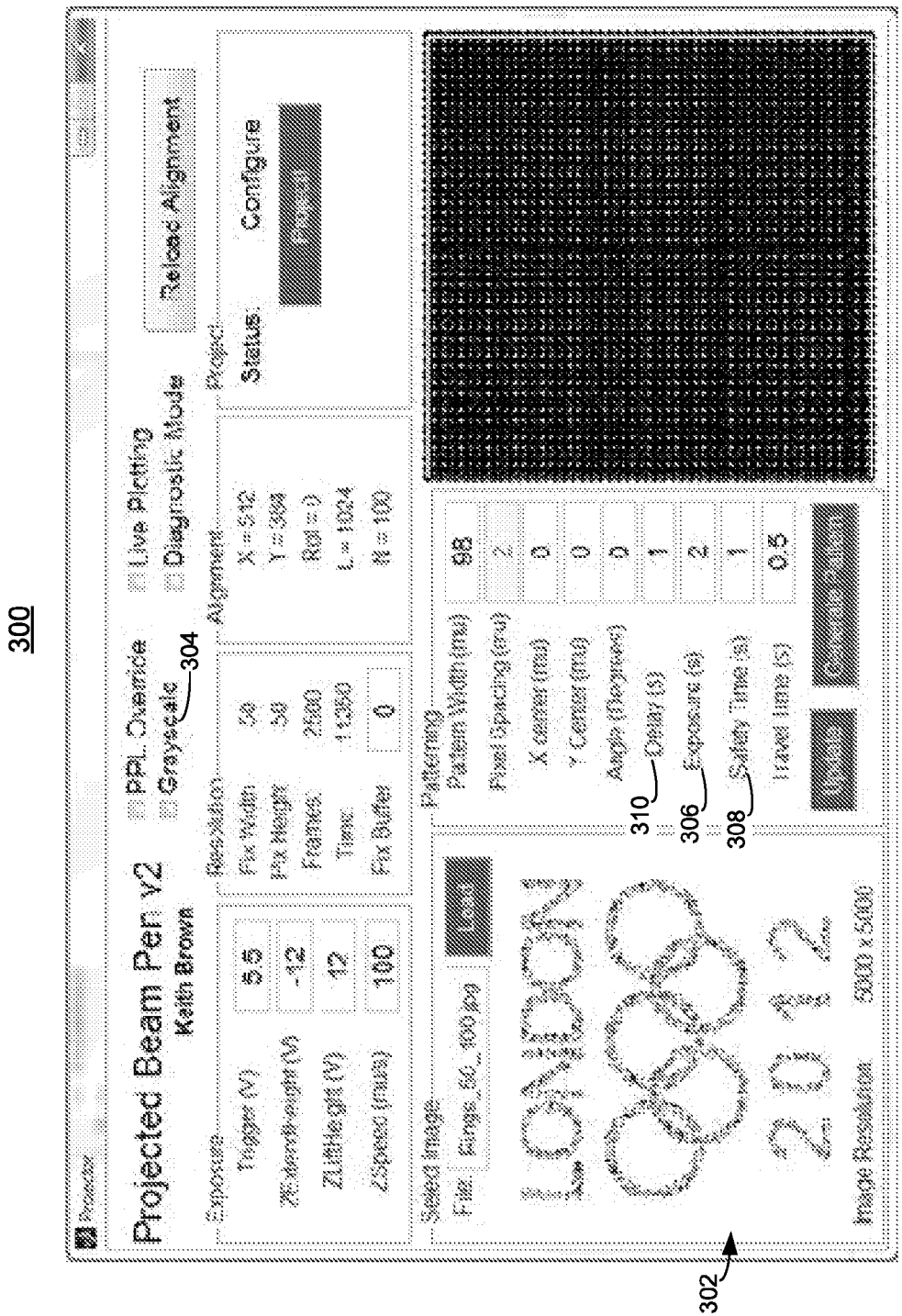
FIG. 3 is a user interface for controlling a lithography process using the system of FIG. 1.

In some embodiments, the values are adjusted to have 5×5 tips in each square. At block 293, the method may adjust the X value 204 and the Y value 206 to center the tips in the squares. At block 294, the N value 212 may be changed to the number reflecting the number of tips in each square. In some embodiments, the method adjusts the N value to five. At block 295, the method may further adjust X and Y values slightly to make sure each pen is in the center of each square. At block 296, the method may check all the tips across the whole array to see if any mismatches still exist. If mismatches still exist, then the method 290 may return to block 291. If not, then the alignment process may end. At the completion of the method 290, the optical path is aligned and the correspondence between mirrors in the DMD and tips in the tip array is saved in the system (e.g., memory 118b, 124b). With reference to FIG. 3, instructions stored in the memory 118b may cause the processor 118a to display a user interface 300 on the first computer 118. As described below, the user interface 300 may facilitate execution of other module instructions to complete the lithography process using the system 100.

Figure 4:
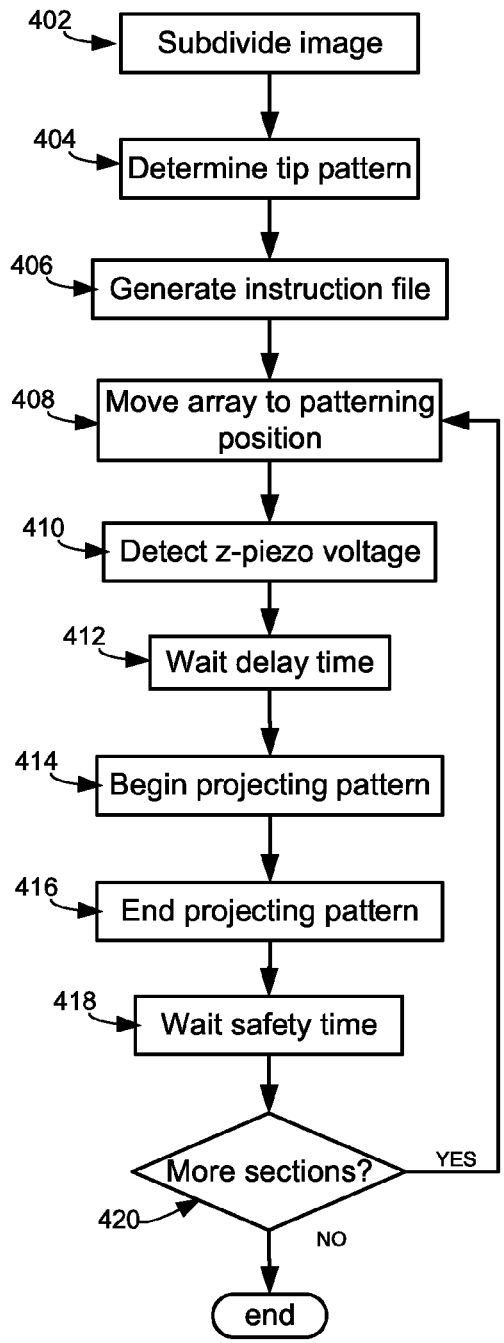
FIG. 4 is a flowchart for a method of completing a lithography process according to the disclosure herein.

FIG. 4 is a flow diagram of example a method 400 for completing a lithography process using the system 100. The method may include one or more blocks, modules, functions, or routines in the form of computer-executable instructions that are stored in a tangible computer-readable medium (e.g., memory 118b) and executed using a processor (e.g., processor 118a) of a computing device (e.g., the first computing device 118). The method may be included as part of any modules of a computing environment for the lithography system 100, or as part of a module that is external to such a system. FIG. 4 will be described with reference to other figures for ease of explanation, but the method 400 may of course be utilized with other objects and user interfaces.

At block 402, a module stored in the memory 118b may cause the processor 118a to subdivide a selected image 302 to be patterned on substrate into geometric sections (also referred to herein as "frames"). The geometric sections can have substantially the same size and shape as the tip array 102. For example, where the tip array has tips generally arranged in a rectangle or square, the frame section can be correspondingly shaped in a rectangle or a square. Other frame section shapes, including, hexagonal and triangular, can be used where the tips are arranged in such shapes on the tip array. The image 302 can be divided into any suitable number of geometric sections such that each pixel of the image is addressed by a tip of the array 102 in a geometric section. The geometric sections can optionally overlap such that pixels having spacing of less than the tip pitch, and thus not addressable by a tip in a first geometric section, can be addressed by a tip in a second, overlapping geometric section.

Once the image is divided into the geometric sections, block 404 may cause the processor 118a to execute an instruction stored in the memory 118b to determine a tip pattern for each geometric section. The tip pattern corresponds to the portion of the image 302 to be patterned by the tips of the tip array in a given geometric section. Determination of the tip pattern can include determining which tips will be selectively illuminated to pattern the portion of the image 302 in the geometric shape and optionally the intensity of the radiation that will be supplied to each tip that is selectively illuminated. For example, within a given tip pattern radiation directed to one or more tips can be selectively modulated during patterning to allow for patterning in with variable intensity (e.g. "grayscale" 304), whereby tips of the tip array are capable of patterning different sized features in a single printing operation.

At block 406, the method 400 may generate an instruction file for the tip array system 100. The instruction file may include further instructions to control movement of the tip array across the substrate to each geometric section. The instruction file can further dictate to the tip array system the allotted time for each patterning operation in given geometric section, as well as the travel time of the tip array between geometric sections. For example, the user interface 300 may receive a desired patterning or exposure time 306, a safety time 308 to ensure patterning is complete and the tip array is no longer illuminated before the tip array is moved to the next geometric section. The safety time 308 may avoid patterning contamination during movement of the tip array. In embodiments, the safety time 308 can be zero, if no delay is needed. Additionally, the interface 300 may receive a delay time 310, which may ensure that the tip array is in position for patterning prior to illumination of the tip array. For example, the instruction file may include instructions to cause the system 100 to maintain a tip array in a given geometric section for a time equal to the sum of the delay time 310, the patterning or exposure time 306, and the safety time 308. By generating the instruction file for instruction movement of the tip array 102, the location of the tip array is known and predictable such that a given pattern of radiation can be generated by the projector 116 to selectively illuminate the tip array in a given tip pattern for a given geometric section.

In one exemplary patterning operation, at block 408, the system 100 can manipulate the tip array 100 to a first geometric section and lower the tip array into a patterning position. For example, block 408 may cause the tip array to be lowered adjacent to the substrate, but not contacting the substrate or can be contacting the substrate at a selected degree of pressure, depending on the desired feature size. At block 410, the method may detect a z-piezo voltage of the tip array 102. The z-piezo voltage may indicate a vertical position of the tip array 102 relative to the substrate 106. Once a threshold voltage is detected, block 412 may cause the system 100 to wait a set delay time 310 before, at block 414, causing the projector 116 to project the a first pattern of radiation to selectively illuminate the tip array 102 and expose the substrate 106 in a first tip pattern corresponding to the portion of the image to be patterned in the first geometric section. The threshold voltage is indicative of the tip array being in the patterning position. Selective illumination of the tip array 102 results in exposure of the substrate in the first tip pattern. After lapse of a set exposure or patterning time, at block 416, the method 400 may cause the projector 116 to cease projection of any radiation into the tip array. At block 418, the method 400 may cause the tip array to be maintained in the first geometric section for a set safety time 308 before, at block 420, determining if other sections require patterning. If so, then the method 400 may return to block 408 and cause the array 102 to be lifted away from the substrate and moved to a second geometric section. Once at the second geometric section, the tip array is again lowered into a patterning position, generating a threshold voltage for detection by the program. Once the threshold voltage is again detected, the program instructs the projector to project a second pattern of radiation to selectively illumination the tip array and expose the substrate in a second tip pattern corresponding to the portion of the image to be patterned in the second geometric section. This process can be repeated until each geometric section has been addressed by the tip array and the method 400 ends. As the person of ordinary skill in the art will appreciate, if patterning is performed without the array touching the substrate, then the raising and lowering of the array may be unnecessary, and the method can omit such steps.

Figure 5:
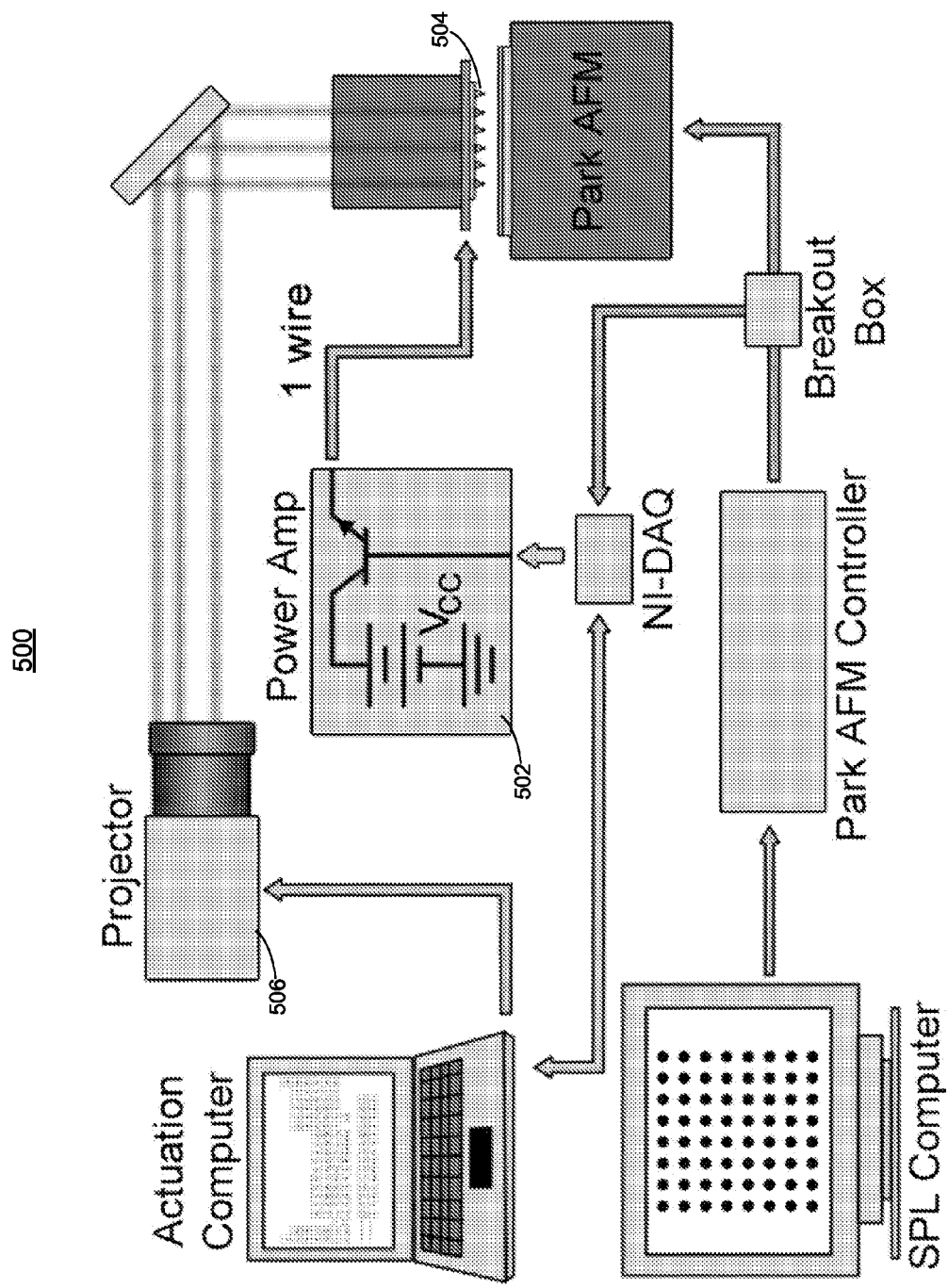
FIG. 5 is a high-level illustration of another embodiment of a lithography system according to the disclosure herein.

In some embodiments, the system 100 may include thermally-actuated tip array. With reference to FIG. 5, a system 500 may include a power amp 502 to provide a voltage to heaters at the tip array 504. For example, projecting the a pattern of radiation (as described above in FIGS. 1-4 and the accompanying text) may selectively expose the heaters to such radiation to selectively activate the exposed heaters to locally heat a heating zone of the tip substrate layer and lower (as pictured) one or more tips disposed in the heating zone into contact or closer contact with the substrate, as further described below.

The pattern of radiation projected by the projector can include selective illumination of the tips of the tip array, as well as selection of the dose of radiation illuminating each tip. For example, the projector 116 can include a digital micromirror device 112, in which one or more mirrors selectively illuminate a tip and such mirrors can be actuated at a given rate or duty cycle to control the dose of the radiation illuminating a given tip. Such control can allow for the patterning in "grayscale" in which different tips are capable of patterning different feature sizes in a single patterning operation and with the tip array being oriented level with respect to the substrate. In various embodiments, the instruction file can further include instructions for tilting the tip array for generation of varying features sizes in given geometric section by patterning with the tilted array.

Thermal Actuation of Tips of the Tip Arrays

In various embodiments of the disclosure, a tip array having a plurality of tips disposed on a common elastomeric tip substrate layer can be selectively actuated by selective heating portions of the elastomeric tip substrate layer in the region of the tip or tips to be actuated. As illustrated in FIG. 10a, heating of the tip substrate layer thermally expands the heated region of the tip substrate layer, thereby lowering (in the orientation pictured) the tip disposed in the heated region relative to tips disposed in an unheated region of the tip substrate layer. Individual actuation can advantageously allow the tip arrays to print continuous patterns over cm-scales, print independent patterns with different patterning compositions, and/or use different dwell times and extensions for different tips to print different size features with different tips of the tip array. Individual actuation can also allow for simple and rapid selective inking of tips of a tip array with one or more patterning compositions.

In accordance with an embodiment of the disclosure, the tip arrays generally include an array of heaters disposed on a second surface of the tip substrate layer opposite the first surface having the tips. The one or more heaters of the array can be selectively activated to locally heat a region of the tip substrate layer and lower the tip or tips located in the heated region as compared to the tips located in a region of the tip substrate layer that remains unheated. For example, the method of selectively actuating a tip array using heat can include leveling the tip array relative to the substrate. Optical and force feedback leveling methods can be used as is known in the art. In an embodiment, the tips of the tip array can be held a distance above the substrate, for example, a few micrometers away from the substrate. The activation of the heater can then be used to selectively bring each tip or a region of tips into contact with the substrate. In another embodiment, the tips of the tip array can be placed into contact with the substrate. Activation of one or more heaters can be used to selectively bring each tip or a region of tips into closer contact with the substrate, thereby forming pattern features of different sizes by relying on the force dependent nature of feature size when patterning with the various tips.

The tip array generally includes a tip substrate layer comprising a first surface and an oppositely disposed second surface. A variety of tip array systems including polymer pen tip arrays, beam pen tip arrays, hard tip soft spring arrays (also referred to herein as silicon pen tip arrays), a graphene coated tip arrays are described in detail below. Each of these tip arrays can be modified to include a heater disposed on the tip substrate layer to achieve thermal actuation of the tips in accordance with embodiments of the disclosure. In each of the various types of tip arrays, for purposes of thermal actuation the tip substrate layer is formed of an elastomeric material capable of thermally expanding when heated. The tip substrate layer can be selected to have a high coefficient of thermal expansion, for example, about $10^4$ per degree Kelvin, which allows a tip to be actuated a significant distance upon localized heating of the tip substrate layer. PDMS has a coefficient of thermal expansion of about $3 \times 10^4$ per degree Kelvin. Additionally, the small volume of material in the locally heated region of the substrate layer allows the material to be rapidly heated and cooled. The tip substrate layer can also be an elastomeric material having a low thermal conductivity, such as PDMS. Using low thermal conductivity materials can allow the heat generated by the heater to be localized in the tip substrate layer. Additionally, by virtue of the elastomeric nature of the materials, once the heat dissipates from the material, the thermally expanded material will recover, returning to its original non-expanded form, thereby raising the selectively actuated tip.

The tip array further includes a plurality of tips fixed to the first surface of the tip substrate layer and having a tip end disposed opposite the first surface of the tip substrate layer. A detailed description of the tips of various suitable tip arrays is provided below.

Figure 10C:
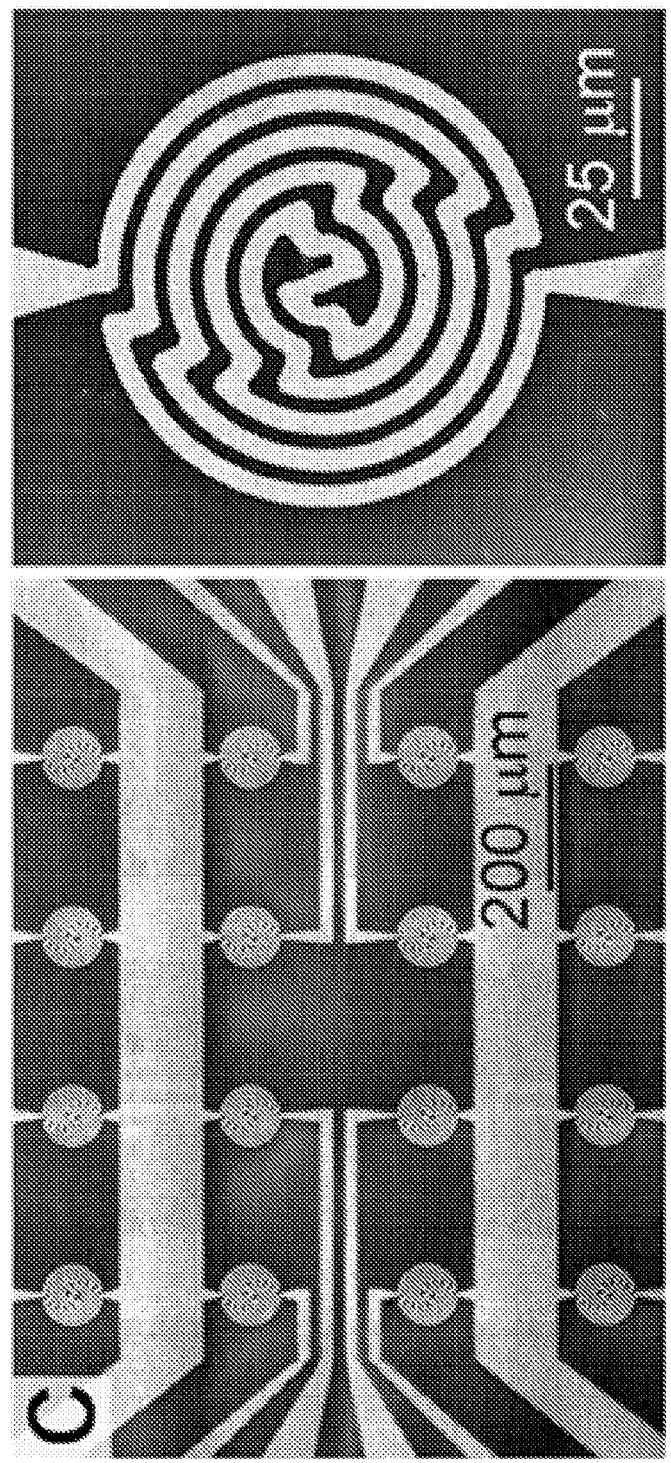
FIG. 10c is an SEM image of a micro-heater array with a close up of a single coil according to the disclosure herein.
Figure 10D:
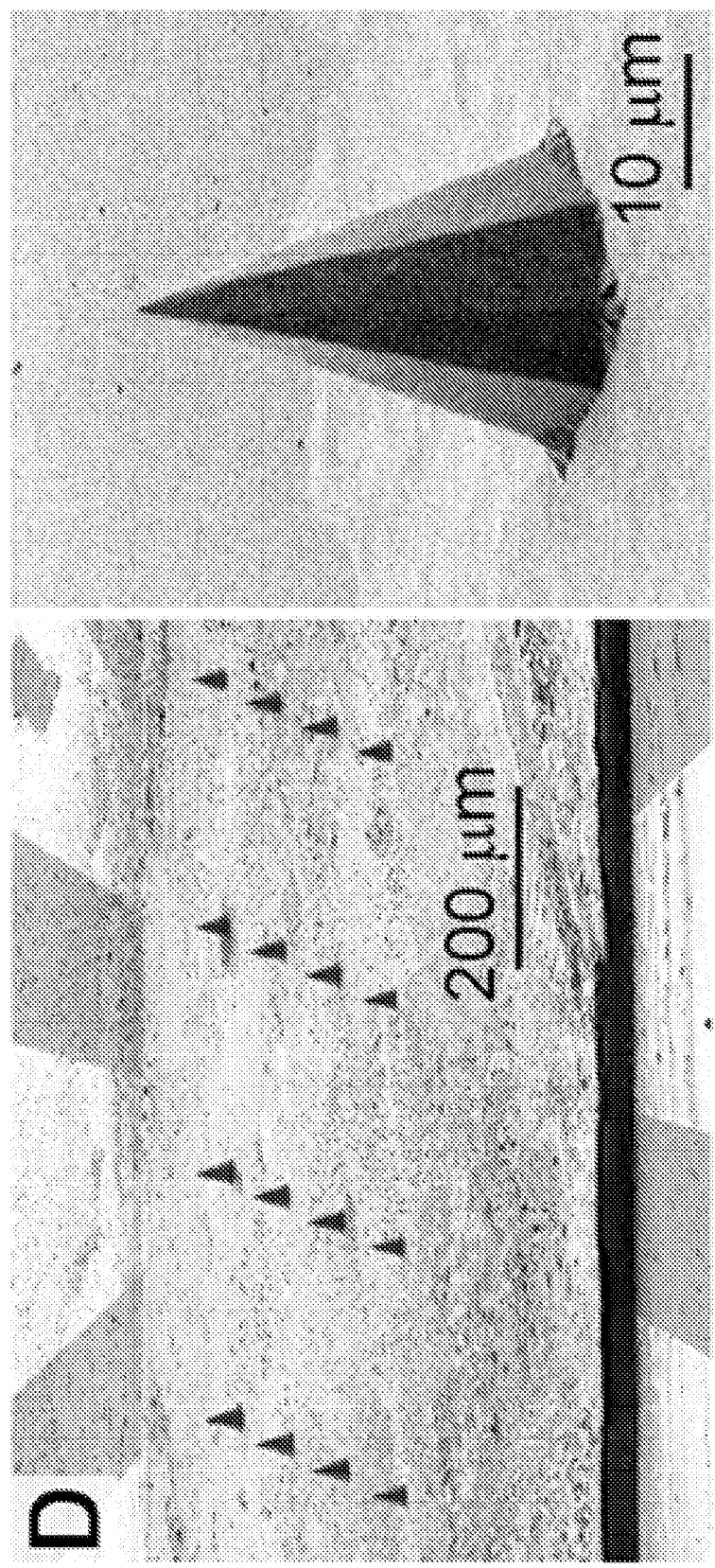
FIG. 10d is an SEM image of a 4×4 tip array fabricated on top of micro coil heaters according to the disclosure herein.

One or more heaters are disposed on the second surface of the tip substrate layer. For example, the heaters can be disposed on a support layer, and between the support layer and the tip substrate layer. In one embodiment, the tip array includes a plurality of heaters such that a single heater is disposed above each tip of the tip array. For example, FIG. 10c illustrates an embodiment in which a single heater corresponds to each single tip of the tip array. In another embodiment, the tip array can include one or more heaters disposed in a zone of the tip substrate layer corresponding to a heating zone that includes a subset of the tips of the tips array. Any suitable number of tips can be included in the subset of tips. In such an arrangement, activation of a heater can result in the actuation of the subset of tips of the tip array.

In an embodiment, the heater in a zone can be adapted to heat the zone in a gradient fashion such that regions of the tip substrate layer in the zone disposed nearest the heater exhibit increased thermal expansion as compared to regions of the tip substrate in the zone disposed away from the heater. This, in turn, can result in a gradient of lowering of the tips disposed in the zone. A tip array can be divided into any suitable number of zones having any number of tips in each zone. The zones can each include the same or a different number of tips depending on the application.

Actuation of the heaters can be controlled, for example, by wiring each heater directly to an electronic switch. For example, a distinct wire can be connected to the heater of each tip or each heating zone and an electrical control can be used to activate the heaters selectively. The heaters can be formed of indium tin oxide (ITO), graphene, poly(3,4-ethylenedioxythiophene) (PEDOT), gold, copper, platinum, and combinations thereof.

As described in detail below, a control system can be used to control actuation of the tips. In another embodiment, active memory elements can be fabricated on the same substrate as the tip array. Using such a memory system, the state of the entire array can be loaded using fewer wires by dividing the signal in time. In some embodiments, the tip array need not remain translucent allowing for increased flexibility in heater material and the application of such memory systems. In such embodiments, the tip array can be leveled by force feedback leveling as known in the art.

Alternatively, the heaters can be made out of a photoconductive material that can be activated by irradiating the heater with an irradiation source, for example, visible and/or UV light. Photoconductive materials experience a dramatic change in electrical conductivity in response to irradiation. For example, the irradiation can cause the electrical conductivity of the heater to increase, thereby allowing the heater to heat. A voltage can be applied across the photoconductive heaters, which act as a radiation-controlled electrical switch that only allows the current will only flow if irradiation is applied. In this way, the irradiation can be used to select which heater is activated while the power for heating is supplied electrically using only two wires for a much simpler array design. Any suitable photoconductive material can be used. If optical leveling is utilized, the photoconductive material is preferably translucent, and more preferably transparent. Suitable materials include, for example, amorphous hydrogenated silicon, zinc oxide, graphene, CdS, CdSe, ZnS, ZnSe, PbS, SnS, $Bi_2S_3$, $Bi_2Se_3$, $Sb_2S_3$, CuS, CuSe. Each of these materials can achieve a ratio of illuminated to dark conductivity, for example, of over $10^2$.

In one embodiment, the heat actuation tip array can include multiple photoconductive heaters, the heaters being activated at different wavelengths. The heaters can be selectively activated by controlling various irradiation sources having wavelengths for selectively activating only certain heaters. This can advantageously be used to allow for general irradiation of a tip array with an irradiation having a wavelength for only a subset of the heaters, thereby allowing for selective actuation without selective irradiation. In other embodiments, the tip array can be selectively actuated by selectively irradiating photoconductive heaters. For example, the tip arrays can further include an array of spatial light modulators disposed on the tip substrate layer to selectively expose a heater to allow for selective irradiation of the heaters. The spatial light modulators can be, for example, dynamically controllable. In another embodiment, as described in detail below, the heat actuation tip arrays can be used in connection with the projected lithography system and irradiation images can be projected onto the heaters of the tip array to active the heaters and selectively actuate the tips. In one embodiment, tip array is a beam pen tip array that includes an array of heaters for selectively actuating the beam pen tips. In such embodiments, the wavelength for activating the heaters and for patterning (i.e., exposure of the substrate) can be the same or can be different wavelengths. For example, in one embodiment, the beam pen tip array can be placed in a patterning position not in contact with the substrate. A radiation source for patterning can be focused on the tip array and an radiation source for activating the heaters can be used in connection with the projected lithography and projected onto the heaters in patterns of radiation for selectively actuation the tips to be in contact or near-field contact with the tip array, thereby activating the tip to expose the substrate. In the patterning position, the tips are disposed at a distance at which exposure does not occur, despite the tips being illuminated. Thus, it is upon selective actuation of the tips by the activation of a heater that the tips are activated for patterning.

Figure 15:
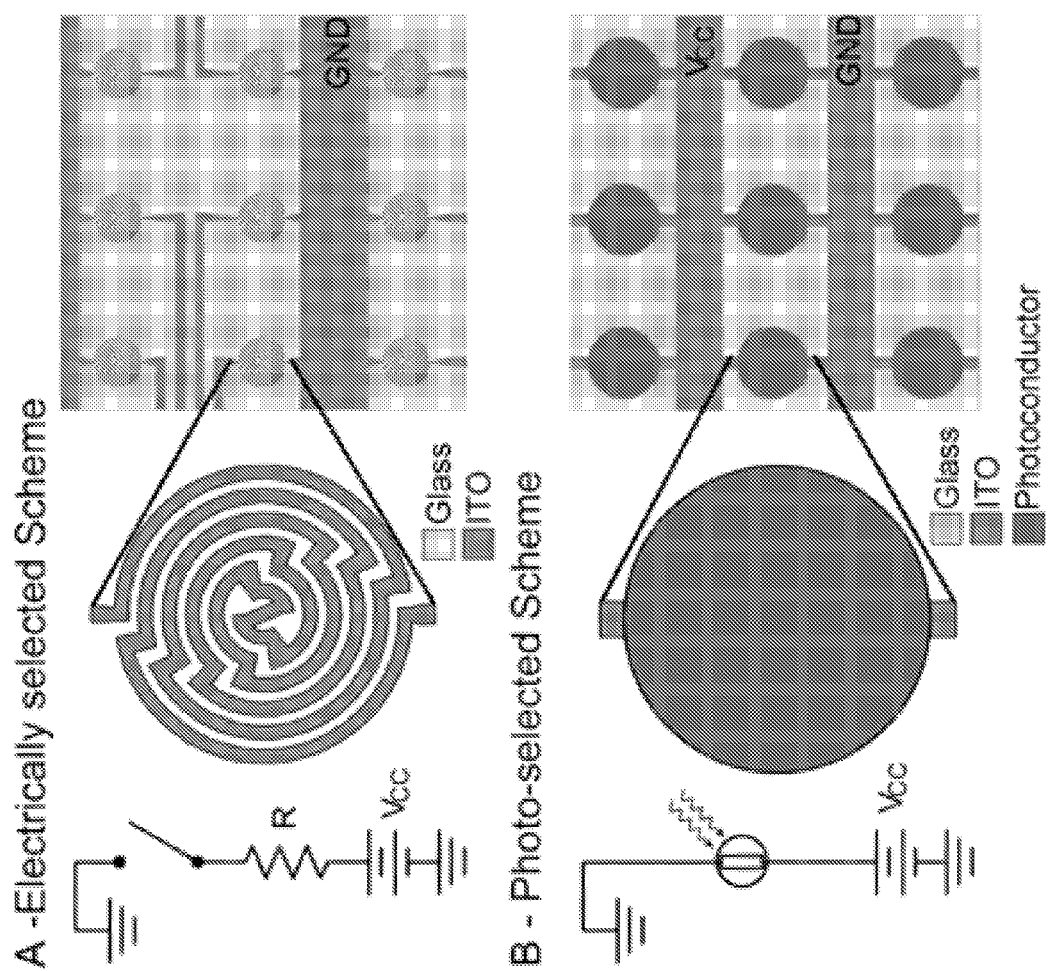
FIG. 15a is a schematic of an electrically addressable heater scheme according to the disclosure herein, wherein when electricity is allowed to flow by an external switch (here an NPN transistor), it heats a resistive coil pattern.
FIG. 15b is a schematic of a photo-selected heater scheme according to the disclosure herein, wherein when the photoconductive discs are exposed to an irradiation source (e.g., light), electricity is allowed to flow which heats the photoconductor and actuates the tip.

FIG. 15 illustrates a comparison of the heaters using the direct wire (FIG. 15A) and the photoconductive (FIG. 15B) embodiments. While the electrical actuation scheme incorporates a coil heater that is switched on an off by a transistor, in the photo-active scheme, incident irradiation increases the electrical conductivity of a photoconductive disc which functions both as the heater and as the switch.

Any suitable heaters can be used. For example, the heaters can be resistive heaters or photoconductive heaters. In various embodiments the heaters are substantially transparent. By providing substantially transparent heaters, the tip arrays can be optically leveled as is known the art. Optical leveling is described, for example, in U.S. Patent Application Publication No. 2011/0132220, the entire disclosure of which is incorporated herein by reference. In alternative embodiments, the heaters are opaque. In such embodiments, the tip arrays can be leveled using force feedback leveling, as is known in the art. Force feedback leveling is described, for example, in U.S. Patent Application Publication No. 2011/0165329.

Figure 14:
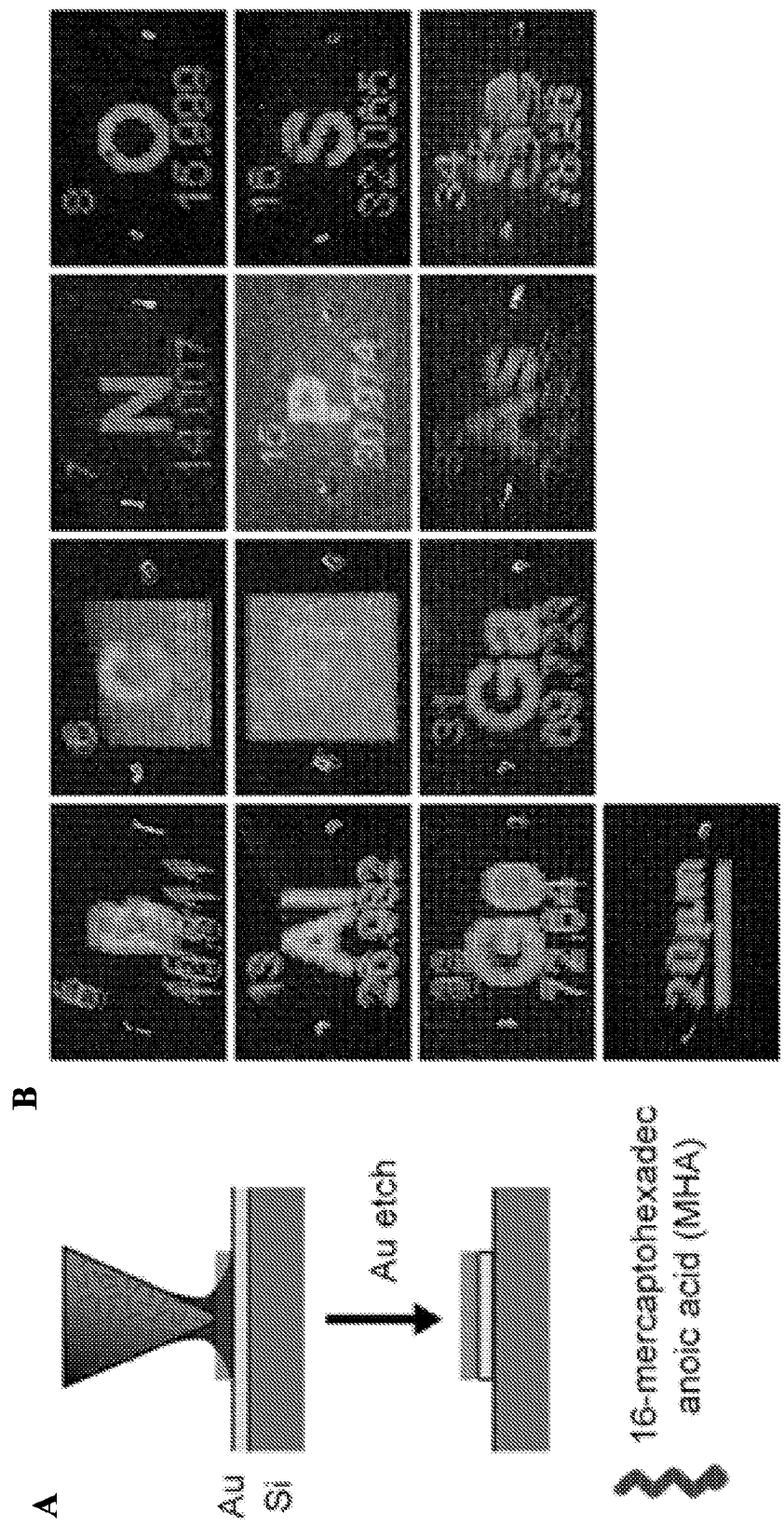
FIG. 14a is a schematic illustration of a patterning method in accordance with an embodiment of the disclosure herein.
FIG. 14b is an SEM image of patterns achieved by 13 tips of a 4×4 tip array writing MHA on gold followed by chemical etching using a method of patterning with thermal actuation of the tips of the tip array according to the disclosure herein, wherein each box represents a patterned written by a single tip.

An example of a printed pattern is shown in FIG. 14. Here, the pattern was formed by inking the tips in a solution of 16-mercaptohexadecanoic acid (MHA) in ethanol. The tips were then used to generate a pattern corresponding to a region of the periodic table of the elements. MHA transfers to the gold surface, forming a self-assembled monolayer which protects patterned regions from a chemical etch that is selective for gold. Final patterns were visualized by scanning electron microscopy. In the 4×4 actuation scheme presented here, each probe was actuated in series, meaning there is never a time when two tips are simultaneously lowered into contact with the substrate. Selectively lowering only one tip at a time can be used mitigate crosstalk between tips. In alternative embodiments, multiple tips can be selectively lowered at the same time.

Mitigating crosstalk or interference with selection of the tips can be achieved by examining the heat profile of the heaters and dividing the tip array in to sub-grids accordingly. Interference can be mitigated by only simultaneously activating sub-grid regions that do not have overlapping heat profiles. For example, based on the characterization of thermal actuation presented in FIG. 12d, this can be achieved conservatively by dividing up the array into 9 sub-grids that are all addressed in sequence. This presents a good compromise between throughput and protection against crosstalk.

In accordance with embodiments of the disclosure, a tip array having an array of heaters can be manufactured by defining the heaters on a substrate, coating the substrate with an elastomeric material layer, defining tip masks that are aligned to the heaters on the substrate, and etching the tip masks to form the tips. In an embodiment in which the tip array is a silicon tip array, the method can include defining heaters on a substrate, coating the substrate with an elastomeric material and a thin silicon wafer, defining tip masks in the silicon wafer that are aligned with the heaters on the substrate, and etching the tip masks to form the silicon tip arrays having heaters disposed on the tip substrate layer.

Heaters can be fabricated, for example of indium tin oxide (ITO) by etching an ITO coated glass slide. ITO is transparent and conductive. 25×25 mm$^2$ glass slides coated with 8 to 12 Ω/sq are commercially available from Sigma Aldrich. The coated slides can be cleaned, for example, by rinsing in acetone, DI water, and isopropanol. The samples can be dried, for example, under nitrogen, and then coated with a photoresist material. For example, a positive tone photoresist material such as SHIPLEY1805 can be used and can be spin coated at 4000 rpm for 40 seconds and then baked for 1 min at 115° C. Any suitable positive or negative tone photoresist can be used and any suitable coating method can be used as is known in the art. Samples can be aligned in a mask aligner and then exposed for a sufficient time, for example 2 seconds, and optionally post-exposure baked for about 1 minute at 115° C. Patterns can then be developed in a suitable developer, for example MF-24A (Shipley) for a suitable time, for example, about 60 seconds and then rinsed and dried. Rinsing can be done using DI water and drying can be done using nitrogen.

The heater material can be etched using any suitable etching method. For example, ITO can be etched using reactive ion etching. For example, samples can be mounted on a 4" wafer and loaded into a deep reactive ion etch apparatus such as a DRIE—STS Lpx Pegasus. The samples can be etched under 200 sccm of Argon that is held at 5 mTorr using 2500 W RF power and 40 W delivered to the platen. Under these conditions, the etch rate of ITO is approximately 1 Å/s. The completion of the etch can be verified using a multimeter to measure the background resistance and the resistance of the devices. To remove the residual resist, the samples can be soaked in a suitable remover or cleaning solution, such as Remover PG (Microchem). Heating can optionally be used to facilitate resist removal. For example, removal can be done by soaking in a suitable remover or cleaning solution at an elevated temperature, for example, 80° C. FIG. 10c is a scanning electron microscopy image of a heater fabricated by the foregoing process, which illustrates a 4×4 array of coil heaters and associated bus lines.

Once heaters are formed, the fabrication of the tip arrays can be generally in accordance with known methods of forming the various tip arrays, but using the substrate having the heaters thereon as the support layer onto which the tip array is formed.

Figure 13:
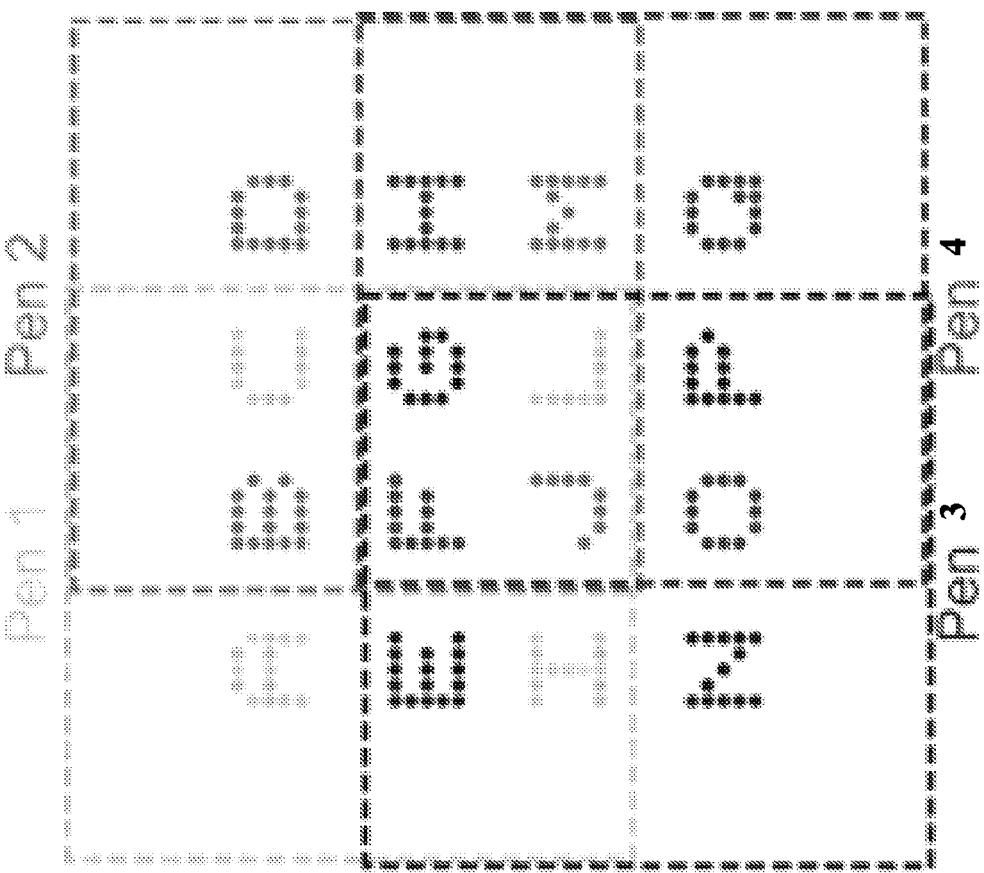
FIG. 13a is a schematic of using multiple tips to write a continuous pattern across a substrate according to the disclosure herein.
FIG. 13b is a schematic of using several tips inked with different inks having different colors to generate multiple patterns on a substrate according to the disclosure herein, wherein continuations of the unit cell patterns result in every spot on the substrate being addressable by every color.
Figure 13:
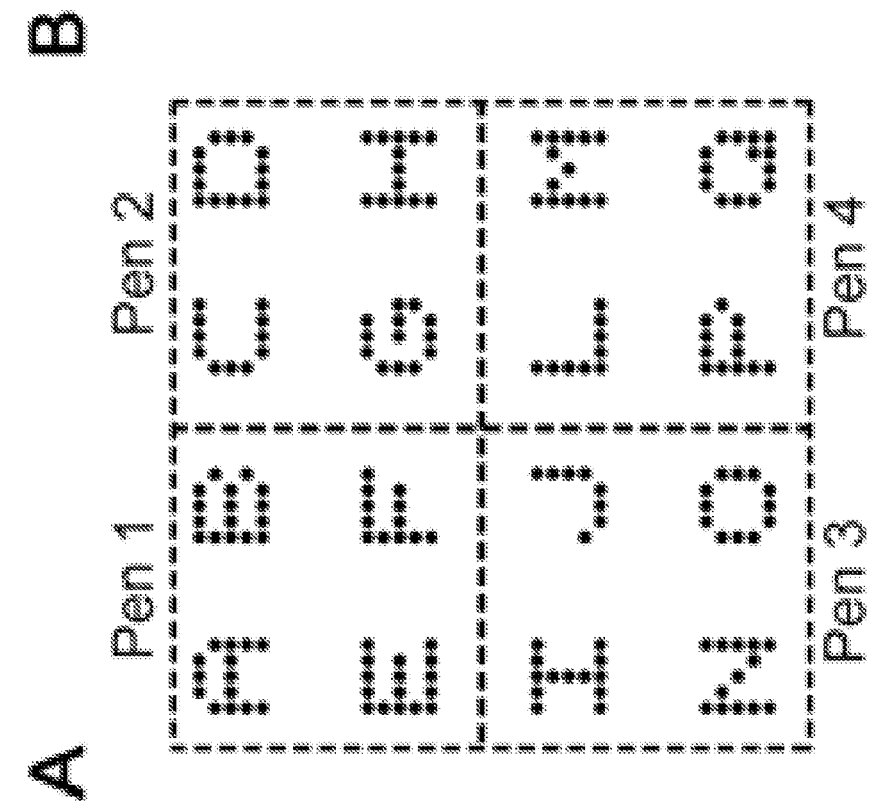

FIG. 13a illustrates an embodiment in which heat actuation of a tip array is used to generate a continuous pattern across the entire substrate. In accordance with an embodiment, heat actuation of tip arrays can be used to pattern multiple patterns such that each patterning region of the substrate is addressable by the tips. For example, the tips can be inked with different patterning compositions (also referred to herein as "inks") such that each region of the substrate can be addressed by each ink. Referring to FIG. 13b, for example, a tip array can be scanned such that each region of the substrate can be accessed by not only the closest tip, but also by the neighboring tips of the tip array. The image of FIG. 13b was generated using a tip array having tips with a 150 μm pitch and a piezoelectric scan range of 400 μm was used. Different inks can be applied to different tips, then repeating patterns of up to nine (in this example) different inks can be applied such that each region can still be addressed by a tip with each ink. In FIG. 13b, four tips of different colors were used to write overlapping patterns. This technique can be of particular use when patterning biomolecules with orthogonal chemistries for combinatorial screening or diagnostics is important.

In order to ink the tips independently, a Perkin Elmer Piezoarray microarraying system can be used. This equipment can print droplets as small as 333 pL, which corresponds to a width of about 7 μm, and pattern them with micrometer-scale accuracy and registration. Using this instrument, multiple varieties of ink can be directly deposited on the tip in a regular repeating fashion to create a multiplexed multi-ink patterning system.

In an alternative embodiment, the tip array can be independently inked by selectively actuating the tips using the heat actuation system into contact with one or more ink sources to thereby dip-coat the tips with the selected inks.

In yet another embodiment, an inking well can be formed using the master used to form the tip array. An ink or multiple inks can be inserted into the wells of the tips to ink the tips with a single ink or selectively ink the tips with multiple different inks. Any other suitable inking methods can also be used.

Figure 6:
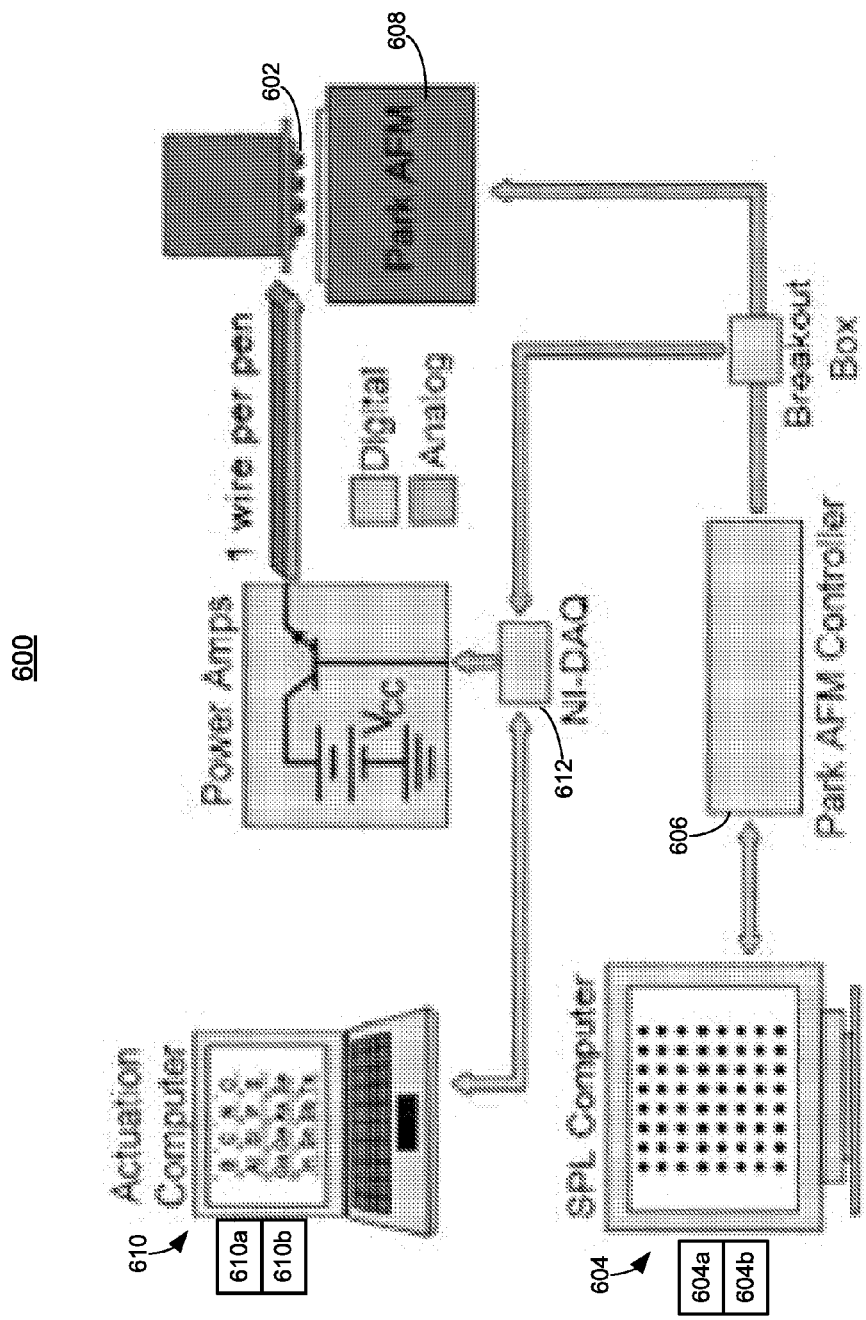
FIG. 6 is a high-level illustration of still another embodiment of a lithography system according to the disclosure herein.

FIG. 6 illustrates one example of a thermally-activated lithography system 600. With reference to FIG. 6, one embodiment of a thermally-activated lithography system 600 may include a control computer 604 including a processor 604a and memory 604b communicatively coupled to an atomic force microscopy (AFM) controller 606. The controller 606 may be communicatively coupled to an atomic force microscope (AFM) 608 such as, for example, the XE-150 AFM produced by Park Systems of Santa Clara, Calif. The AFM may include a tip array 602 (e.g., a hard-tip array) including a plurality of tips for implementing the various lithography processes described herein, in place of a traditional AFM probe. The system 600 may include other components to receive data from the AFM 508 or send data to the AFM 608 to execute lithography operations. For example, the system 600 may include an actuation computer 610 with a processor 610a and memory 610b in communication with a data acquisition component (DAQ) 612 to receive feedback data from the AFM 608 or send printing commands to the AFM 608.

The system 600 may include any number of computing devices and components that are communicatively coupled via a network such as the Internet or other type of networks (e.g., LAN, a MAN, a WAN, a mobile, a wired or wireless network, a private network, or a virtual private network, etc.). Each component of the system 600 may include a processor (e.g., 604a, 610a) configured to execute instructions of one or more instruction modules stored in computer memory (604b, 610b). For example, the actuation computer 610 memory 610b may store one or more modules including instructions for execution by the processor 610a during operation of the system 600, as herein described. In some embodiments, the modules may include instructions that, upon execution, cause the processor 610a to generate an instruction set to complete a lithography process as herein described. For simplicity, the actuation computer 610 is illustrated with a single processor 610a to execute various modules stored in the memory 610b, as described herein. The actuation computer 610 in other embodiments may include additional processing units (not shown).

The instruction module stored within the memory 610b may include instructions that, when executed by a processor (e.g., processor 610a) generate the instruction set for the AFM 608 as well as instructions for a tip array 602 to complete a lithography action. In one embodiment, the memory 610c includes instructions to break an image of a desired pattern into regions corresponding to a tip array 602 of the AFM 608; receive a plurality of patterning parameters; generate a patterning file; load the patterning file; and cause the system 600 to generate a lithography image. Of course, the memory 610b may include any number of additional instructions to generate an instruction set and complete a lithography process, as described herein.

Method for Electrical Control of Heat Actuated Tip Arrays

Figure 7:
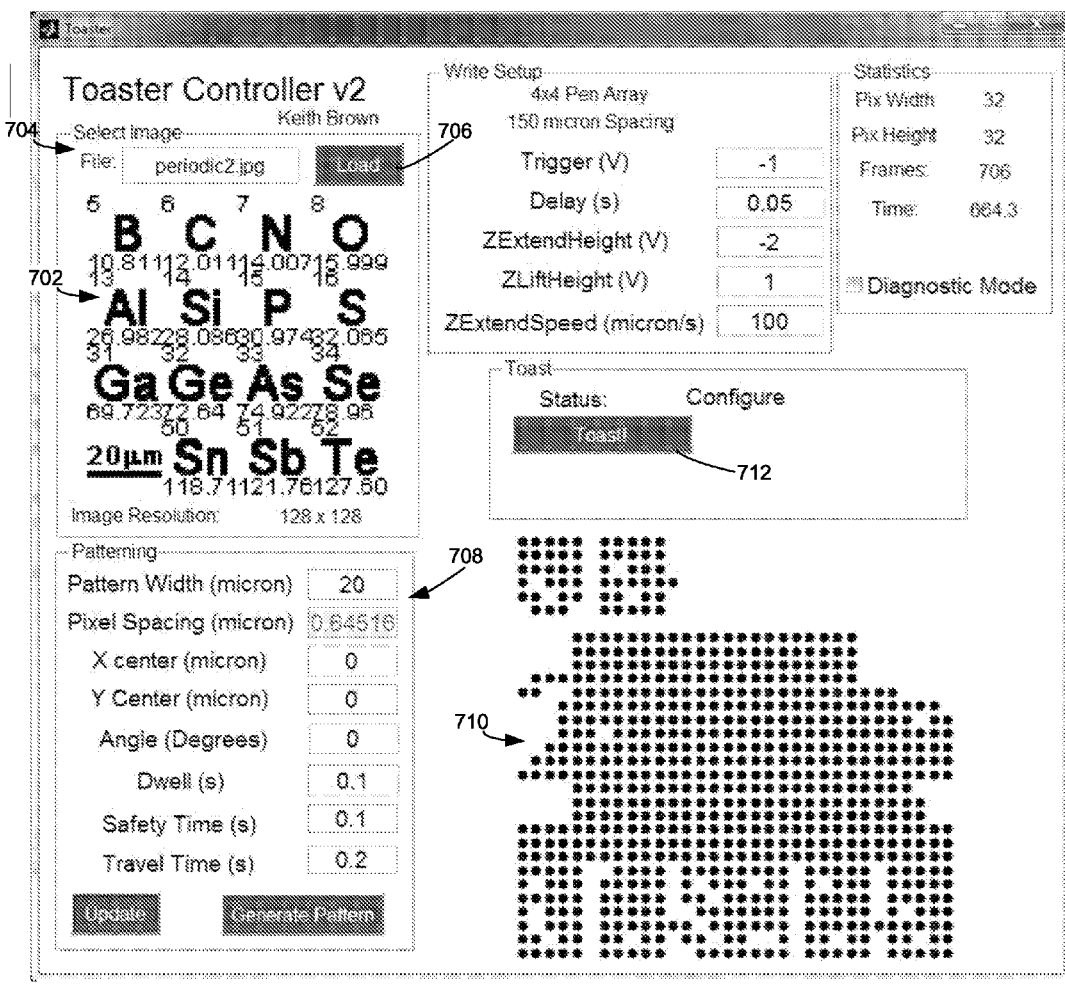
FIG. 7 is a user interface for controlling a lithography process using the system of FIG. 5 or FIG. 6.

With reference to FIG. 7, the memory 710b may also include instructions to display a user interface 700 on the module actuation computer 710. As described below, the user interface 700 may facilitate execution of other instructions to complete the lithography process.

FIGS. 8a-d are flow diagrams of example methods for completing a lithography process. The methods may include one or more blocks, modules, functions, or routines in the form of computer-executable instructions that are stored in a tangible computer-readable medium and executed using a processor (e.g., processor 604a, 610a) of a computing device. The methods may be included as part of any modules of a computing environment for the lithography system 600, or as part of a module that is external to such a system. For example, the methods may be part of the actuation computer 610, the control computer 604, the controller 606, an AFM 608, a data acquisition component 612, or other system component. FIGS. 8a-d will be described with reference to other figures for ease of explanation, but the methods may of course be utilized with other objects and user interfaces.

With reference to the figures, a method 800 (FIG. 8a) may generate an instruction set for the various lithography processes as described herein. At block 802, the method 800 may execute instruction to load an image 702 (FIG. 7) corresponding to the desired lithography pattern into the memory 610b. In some embodiments, block 802 may include instructions to both load the image 702 into the memory 610b and display the image 702 in the user interface 700. For example, the method 800 may execute instructions of block 802 in response to receiving an indication that a user has selected an image file name 704 and a button 706 for uploading and storing the image 702.

At block 804, the method 800 may execute an instruction to deconstruct the image 702 for patterning on a substrate by the lithography system 600. In some embodiments, instructions of block 804 may break the image 702 into regions corresponding to one or more tips of the tip array 602. The geometric regions may have substantially the same size and shape as the tip array. The image may be divided into any suitable number of geometric regions such that each pixel of the image is addressed by a tip of the array in a geometric section. The geometric sections can optionally overlap such that pixels having spacing of less than the tip pitch and thus not addressable by a tip in a first geometric section may be addressed by a tip in a second, overlapping geometric section. For example, an image can be pixelated into a black and white 500,000×500,000 square grid. The pixelated image can then be deconstructed into non-overlapping frames 1000×1000 pixels in size, for imaging by a 1,000,000-tip array having 1000×1000 tips in a square pattern. Thus, the image would be deconstructed into 250,000 frames in a 500×500 square grid. Parameters defining the regions may be stored in the memory as a list or regions that may be used in the lithography patterning process. For example, block 804 may include instructions to divide the image 702 into a grid of sixteen areas each corresponding to a tip within the tip array 602, where the array 602 includes a four by four array of tips. Parameters describing these sixteen areas may then be stored as a list within the memory 610a.

At block 806, the method 800 may execute instructions to receive patterning parameters 708. Generally, the patterning parameters 708 prepare the image 702 and system 600 for a lithography process. The parameters 708 may include a width of the lithography pattern determined by block 804, as written by each tip, a location of this pattern in the lateral and vertical dimensions, and an angular offset. The angular offset may be applied to the image 702 to rotate the pattern of the lithography process. In some embodiments, the angular offset parameter corrects for any angular offset between the tip array 602 and the XY piezoelectric stage. Other received patterning parameters may include a dwell time for each tip at a point of the image 702, a travel time or transit time between subsequent points in the image 702, a delay time, and a safety time. For example, a delay time may indicate a time period between when the DAQ 612 detects that the z-piezo of the AMF is extended and commencing writing. The safety time may describe an extra time period to ensure patterning is complete before the tip array 602 is moved to the next geometric section, thereby avoiding patterning contamination during movement of the tip array. Additionally, as illustrated by the parameters 708, an extension height, lift height, and speed of the z-piezo may be received as well as a trigger voltage. The method 800 may use the trigger voltage to determine when the z-piezo is in an extended or lifted configuration.

At block 808, the method 800 may execute instructions to generate a patterning file. The patterning file may ensure that the location of the tip array is known and predictable such that a given pattern may be generated so that particular tips of the array 106a may be activated to address a writing action. In some embodiments, the method 800 may execute the instructions of block 808 in response to receiving a command from the user interface 700 (e.g., a user selection of the "Update" or "Generate Pattern" button). By generating the patterning file for instruction movement of the tip array, the location of the tip array is known and predictable such that a given pattern can be generated in a given tip pattern for a given geometric section of the image.

Figure 8A:
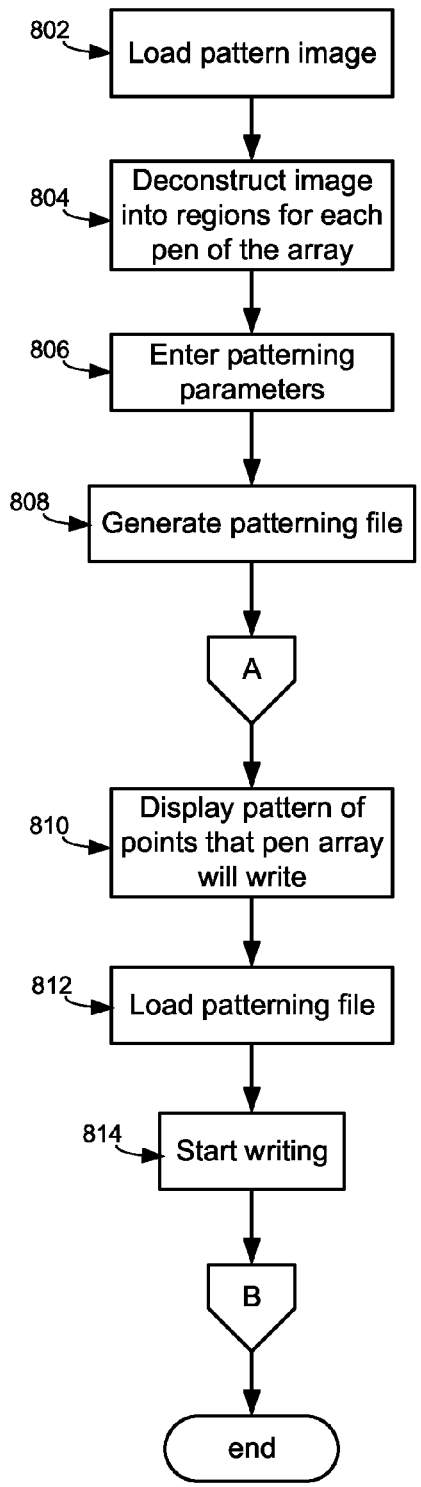
FIGS. 8a-d are flowcharts for further methods to complete a lithography process according to the disclosure herein.
Figure 8B:
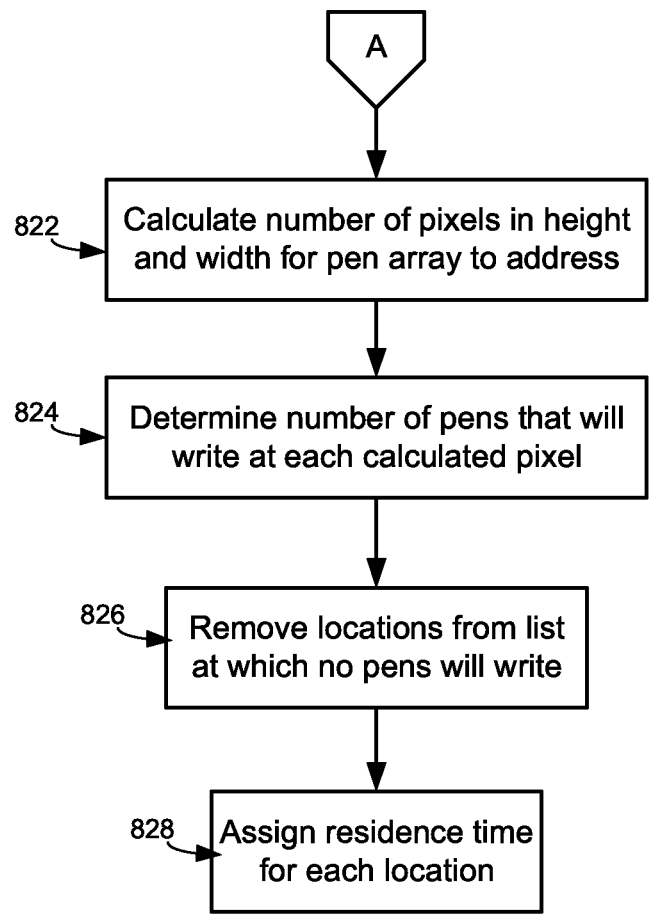

With reference to FIG. 8b, a method 820 for generating a patterning file may include a plurality of instructions that are stored in a memory 610b and executed by a processor 610a. At block 822, the method 820 may execute instructions to analyze the uploaded image 702 to calculate a number of pixels in width and height that the tip array 602 needs to address. At block 824, the method 820 may execute instructions to determine how many tips within the tip array 602 will write at each location. In some embodiments, block 824 includes instructions to step through each of the locations or points that were determined at block 804 and evaluate each point individually. In other embodiments, block 824 may include instructions to evaluate more than one point at a time to determine how many tips will write at that point. At block 826, the method 820 may execute instructions to modify the list of regions that was determined at block 804. For example, where block 824 determines that no tips will write at a particular point within the list, then the processor 610a may execute instructions of 826 to remove those location from the list. At block 828, the method 820 may execute instructions to assign a residence time for locations at which tips will write. In some embodiments, the residence time may equal:

$$T_{residence}=((T_{delay}+T_{dwell})*\#active\ tips)+T_{safety}$$  Equation 1:

Returning to FIG. 8a, block 810 may execute instructions to display a pattern of points 710 within the user interface 700. The pattern 710 may include those points that the tip array 602 will write. In some embodiments, the pattern 710 may include a region of the image as determined at block 804. At block 812, the method 800 may execute instructions to write the instruction set for the lithography system 600 using the parameters and other data of the methods 800 and 820 and store the set in the memory 610b. In some embodiments, the instruction set includes a .ppl file for the AFM 608, although the system 600 may use other types of file formats. At block 814, the method 800 may execute instructions to load the instruction set into a memory (i.e., memory 610b or a memory of the AFM 608). At block 816, the method 800 may execute instructions to write the image 702 beginning with a pattern 710. In some embodiments, the method 700 begins the writing process in response to receiving a command from the user interface indicating selection of a "write" button 712 or other user-initiated command. In other embodiments, the write process begins automatically upon generating the instruction set or other action.

Figure 8C:
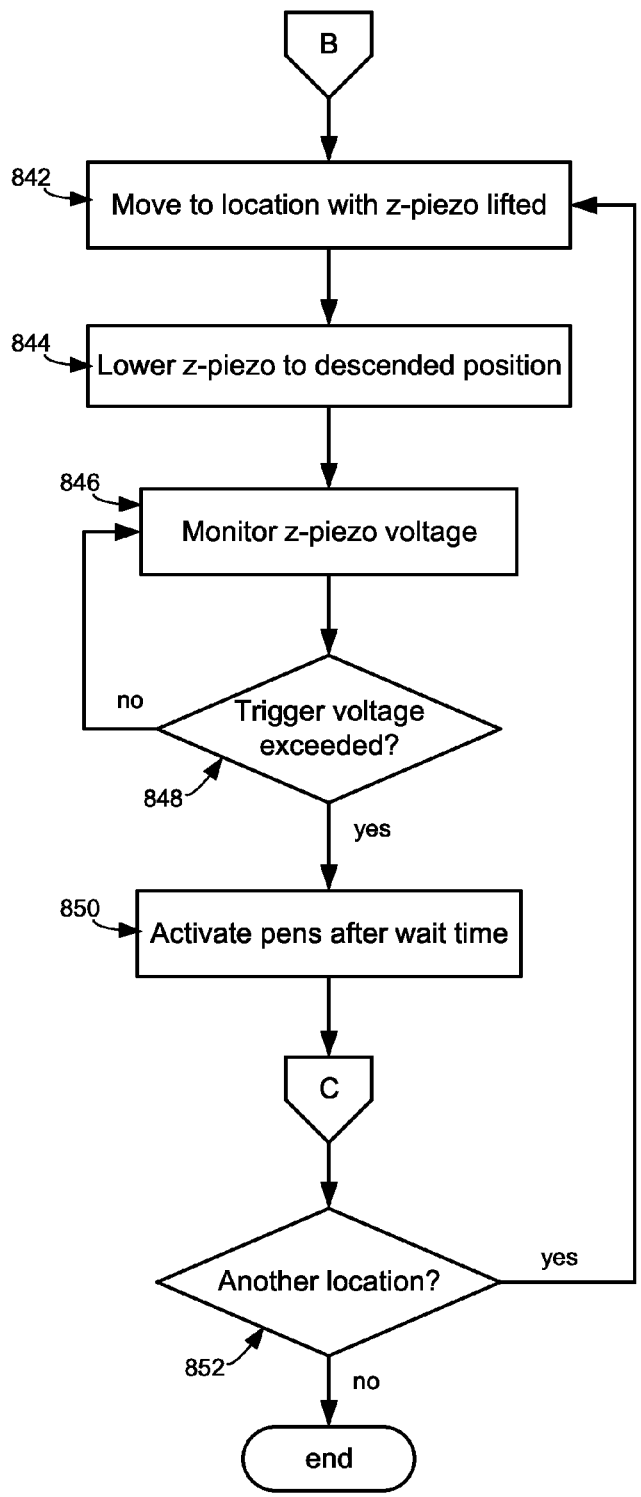

With reference to FIG. 8c, a method 840 may include instructions to write the image 702 on a substrate. At block 842, the system 600 may execute instructions to move to a first location or "patterning position" with the z-piezo of the array 602 lifted. For example, the tip array may be lowered to be adjacent to the substrate, but not contacting the substrate or can be contacting the substrate depending on the desired feature size. Once at the first location, block 844 may execute instructions to lower the z-piezo to a descended position over the substrate. At block 846, the method 840 may execute instructions to monitor the threshold voltage (i.e., the z-piezo voltage) to determine if the z-piezo is extended. For example, the z-piezo is indicative of the vertical position of the tip array relative to the substrate. In some embodiments, the method 840 instructs the DAQ 612 to monitor the z-piezo voltage and determine, at block 848, whether the z-piezo has exceeded a trigger voltage (i.e., one of the parameters entered at block 806). The threshold or z-piezo voltage is indicative of the tip array being in the patterning position. If, at block 848, the method 840 determines that the trigger voltage is exceeded (and, thus, the z-piezo is extended), then the method 840 may activate one or more tips of the array 602 to begin a projecting/writing process for a first region of the image 702. The activated tips may continue the projecting/writing process for the duration of the dwell time. In some embodiments, the method may load a next geometric region for the lithography process if the dwell time exceeds a threshold amount (e.g., 1.45 seconds). Further, block 850 may include instructions to wait a period of time (e.g., the wait time) before lifting the z-piezo away from the substrate and moving to a second geometric region of the image 702.

Figure 8D:
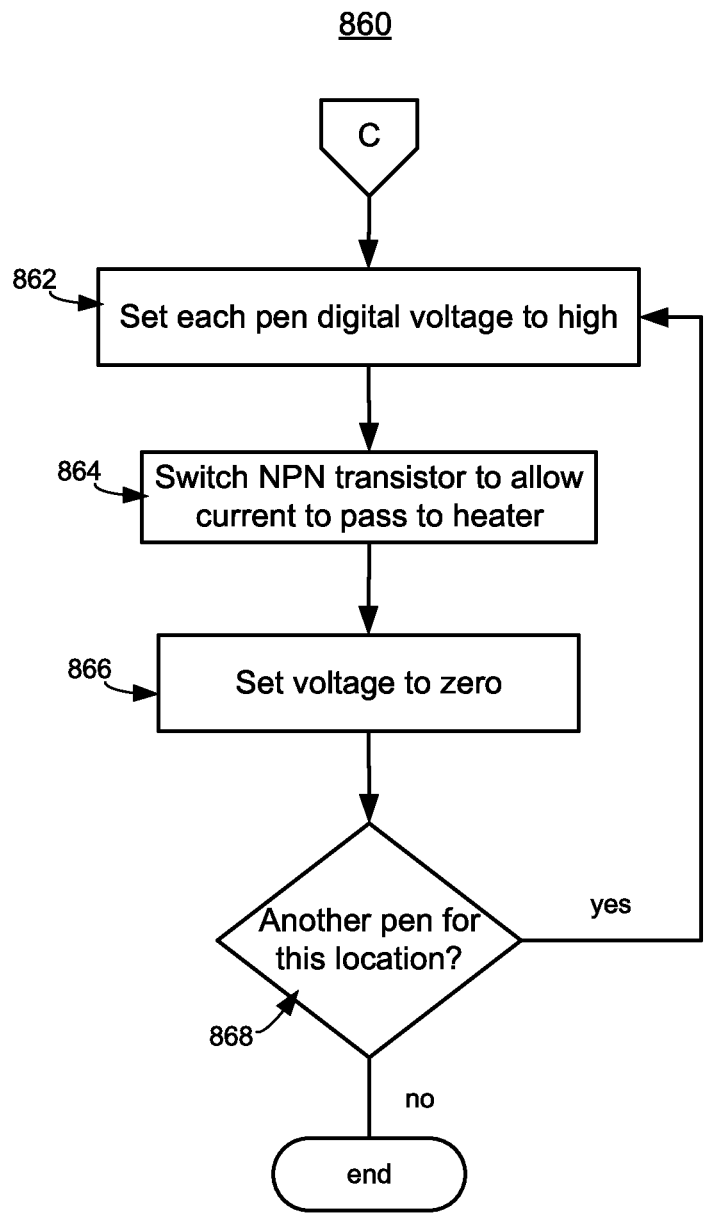

With reference to FIG. 8d, each tip of the array 602 may be activated one at a time. At block 862, the method 860 may execute instructions to set a voltage to high for a particular tip corresponding to the region 710. For example, the method 860 may instruct the system 600 to set a voltage to "high" for a tip which, at block 864, switches a transistor (i.e., an NPN transistor) to allow current to pass though a heater for the selected tip within the array 602. This voltage may be set to "high" for a variable amount of time corresponding to one of the parameters entered at block 806 (e.g., a dwell time). At the expiration of the dwell time, the high voltage for the tip may be set to zero at block 866. At block 868, the method 860 may determine if another tip at the region 710 should write and, if so, proceed to block 362. If there are no more tips for the writing process at the region 710, then the method 860 may end. Returning to FIG. 8c, following writing the entire region 710, the method 840 may execute instructions to determine if the image 702 includes another region at block 852. If the image 702 includes another region 710, then block 852 may cause the method 840 to execute instructions to lift the z-piezo of the array and travel to the next region. If the image 702 does not include another region 710, then block 852 may cause the method 840 to return to method 300 and end.

Computing System for Implementing the Methods

Figure 9:
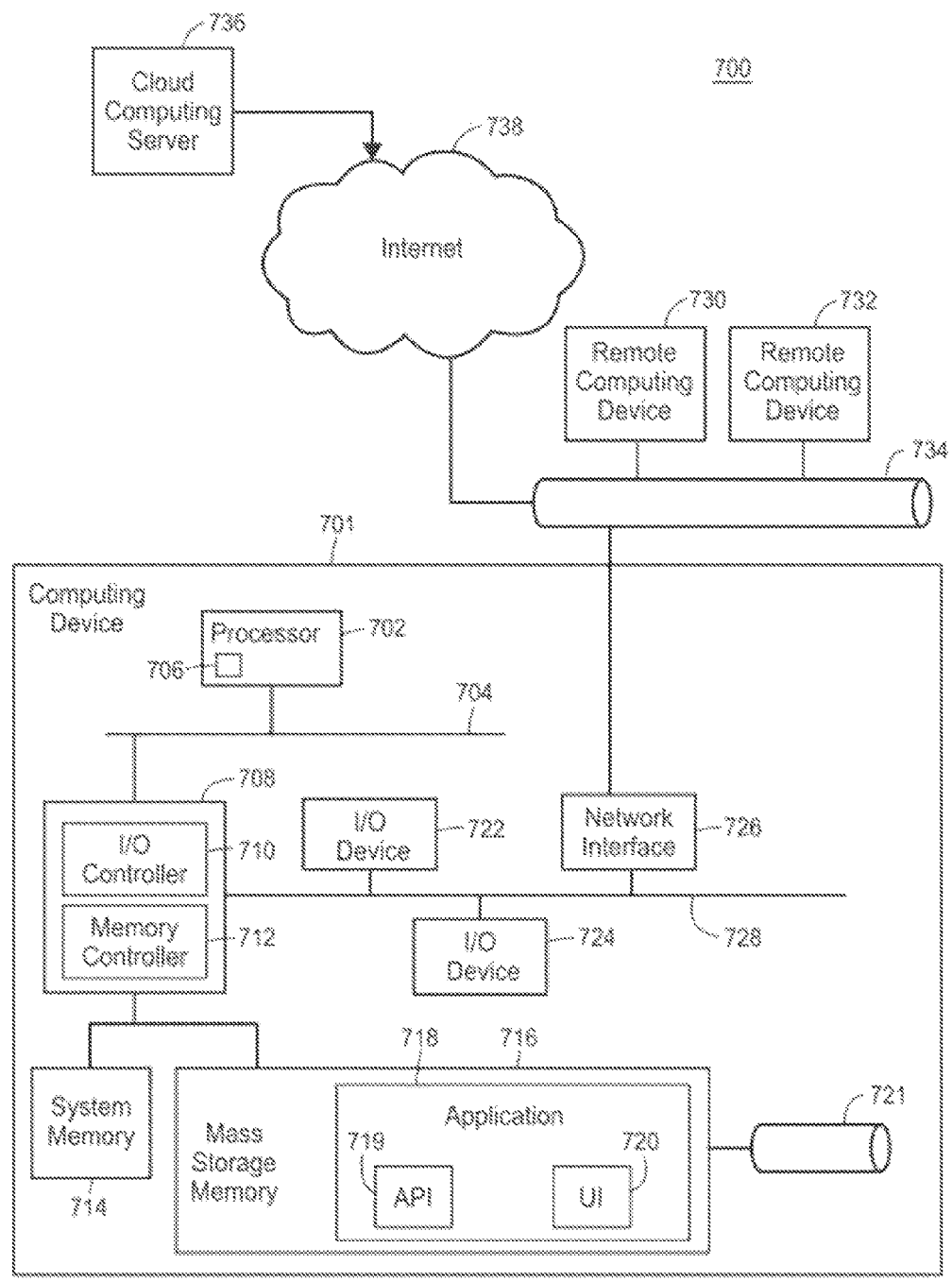
FIG. 9 is a high-level block diagram of a computing system according to the disclosure herein.

FIG. 9 is a high-level block diagram of an example computing environment for a lithography system to execute the methods as herein described. The computing device 901 may include any of the computing devices described herein (e.g., a desktop or laptop computer, a tablet computer, a Wi-Fi-enabled device or other personal computing device capable of wireless or wired communication), a thin client, or other known type of computing device. As will be recognized by one skilled in the art, in light of the disclosure and teachings herein, other types of computing devices can be used that have different architectures. Processor systems similar or identical to the example lithography systems 100, 500, and 600 may be used to implement and execute the example system of FIG. 1, the example methods, the user interfaces, and the like. Although the example systems are described as including a plurality of peripherals, interfaces, chips, memories, etc., one or more of those elements may be omitted from other example processor systems used to implement and execute the example systems. Also, other components may be added.

As shown in FIG. 9, the computing device 901 of this embodiment includes a processor 902 that is coupled to an interconnection bus 904. The processor 902 includes a register set or register space 906, which is depicted in FIG. 9 as being entirely on-chip, but which could alternatively be located entirely or partially off-chip and directly coupled to the processor 902 via dedicated electrical connections and/or via the interconnection bus 904. The processor 902 may be any suitable processor, processing unit or microprocessor. Although not shown in FIG. 9, the computing device 901 may be a multi-processor device and, thus, may include one or more additional processors that are identical or similar to the processor 902 and that are communicatively coupled to the interconnection bus 904.

The processor 902 of FIG. 9 is coupled to a chipset 908, which includes a memory controller 910 and a peripheral input/output (I/O) controller 912. As is well known, a chipset typically provides I/O and memory management functions as well as a plurality of general purpose and/or special purpose registers, timers, etc. that are accessible or used by one or more processors coupled to the chipset 908. The memory controller 910 performs functions that enable the processor 902 (or processors if there are multiple processors) to access a system memory 914 and a mass storage memory 916.

The system memory 914 may include any desired type of volatile and/or non-volatile memory such as, for example, static random access memory (SRAM), dynamic random access memory (DRAM), flash memory, read-only memory (ROM), etc. The mass storage memory 916 may include any desired type of mass storage device. For example, if the computing device 901 is used to implement a module 918 having an application programming interface (API) 919 (including functions and instructions as described by the methods of FIGS. 2b-d, 4, 8a-d), and user interfaces (UI) 200, 300, and 700 to receive user input, the mass storage memory 916 may include a hard disk drive, an optical drive, a tape storage device, a solid-state memory (e.g., a flash memory, a RAM memory, etc.), a magnetic memory (e.g., a hard drive), or any other memory suitable for mass storage. In one embodiment, non-transitory program functions, modules and routines (e.g., an application 918, an API 920, and the user interfaces, etc.) are stored in mass storage memory 916, loaded into system memory 914, and executed by a processor 902 or can be provided from computer program products that are stored in tangible computer-readable storage mediums (e.g. RAM, hard disk, optical/magnetic media, etc.). Mass storage 916 may also include a cache memory 921 storing application data, user profile data, and timestamp data corresponding to the application data, and other data for use by the application 918.

The peripheral I/O controller 910 performs functions that enable the processor 902 to communicate with peripheral input/output (I/O) devices 922 and 924, a network interface 926, via a peripheral I/O bus 928. The I/O devices 922 and 924 may be any desired type of I/O device such as, for example, a keyboard, a display (e.g., a liquid crystal display (LCD), a cathode ray tube (CRT) display, etc.), a navigation device (e.g., a mouse, a trackball, a capacitive touch pad, a joystick, etc.), etc. The I/O devices 922 and 924 may be used with the application 918 to provide an instruction set and the user interfaces as described in relation to the figures. The local network transceiver 928 may include support for Wi-Fi network, Bluetooth, Infrared, cellular, or other wireless data transmission protocols. In other embodiments, one element may simultaneously support each of the various wireless protocols employed by the computing device 901. For example, a software-defined radio may be able to support multiple protocols via downloadable instructions. In operation, the computing device 901 may be able to periodically poll for visible wireless network transmitters (both cellular and local network) on a periodic basis. Such polling may be possible even while normal wireless traffic is being supported on the computing device 901. The network interface 926 may be, for example, an Ethernet device, an asynchronous transfer mode (ATM) device, an 802.11 wireless interface device, a DSL modem, a cable modem, a cellular modem, etc., that enables the systems 100, 500, and 600 to communicate with another computer system having at least the elements described in relation to the systems.

While the memory controller 912 and the I/O controller 910 are depicted in FIG. 9 as separate functional blocks within the chipset 908, the functions performed by these blocks may be integrated within a single integrated circuit or may be implemented using two or more separate integrated circuits. The systems 100, 500, and 600 may also implement the user interfaces and instruction sets on remote computing devices 930 and 932. The remote computing devices 930 and 932 may communicate with the computing device 901 over a network link 934. For example, the computing device 901 may receive location data created by an application executing on a remote computing device 930, 932. In some embodiments, the module 918 including the user interfaces may be retrieved by the computing device 901 from a cloud computing server 936 via the Internet 938. When using the cloud computing server 936, the module 918 may be programmatically linked with the computing device 901. The module 918 may be a Java® applet executing within a Java® Virtual Machine (JVM) environment resident in the computing device 901 or the remote computing devices 930, 932. The module 918 may also be a "plug-in" adapted to execute in a web-browser located on the computing devices 901, 930, and 932. In some embodiments, the module 918 may communicate with back end components via the Internet or other type of network.

Tip Arrays

Polymer Pen and Gel Pen Tip Arrays

Polymer Pen Lithography is a direct-write method that delivers collections of molecules in a positive printing mode. Polymer Pen Lithography utilizes elastomeric tips without cantilevers as the ink delivery tool. The tips are preferably made of polydimethylsiloxane, PDMS or agarose gel. As used herein, "Gel Polymer Pen Lithography" and "Gel Pen Lithography" refer to Polymer Pen Lithography utilizing elastomeric gel polymer tips. Reference to Polymer Pen Lithography or polymer pen tip arrays herein should be understood to include Gel Pen Lithography and Gel Pen tip arrays. As used herein, references to polymers, polymer pens, and polymer pen tip arrays include gel polymer types, unless indicated otherwise in context.

Figure 16:
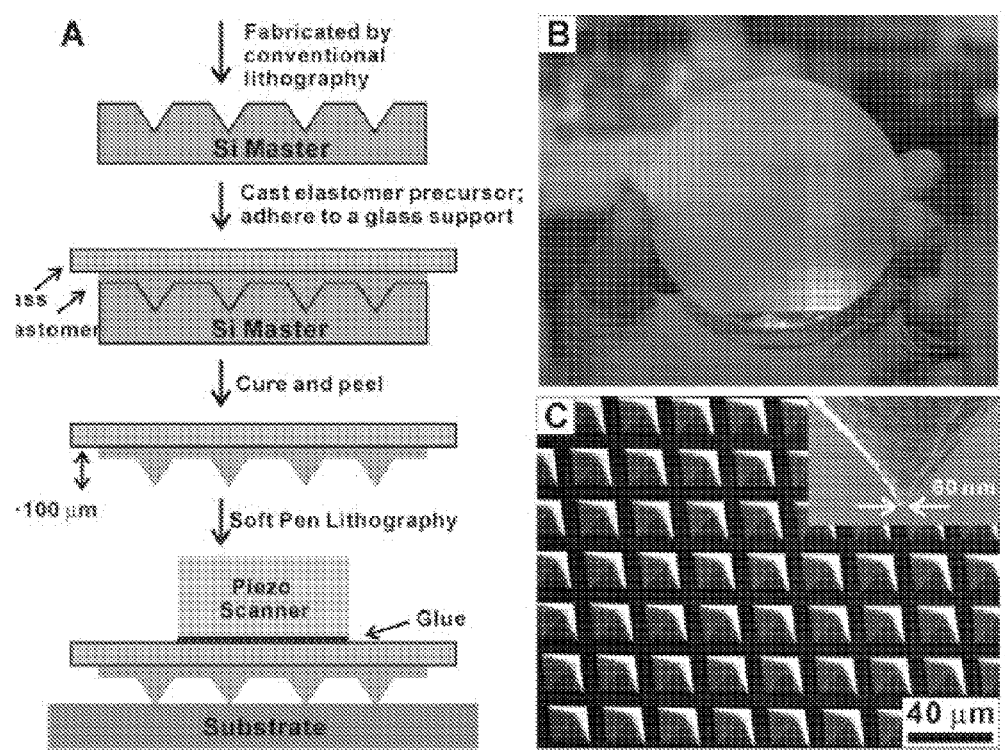
FIG. 16a is a schematic illustration of a Polymer Pen Lithography set up.
FIG. 16b is a photograph of a 11 million tip array.
FIG. 16c is a scanning electron microscopy (SEM) image of the polymer tip array of FIG. 16b.
Figure 17:
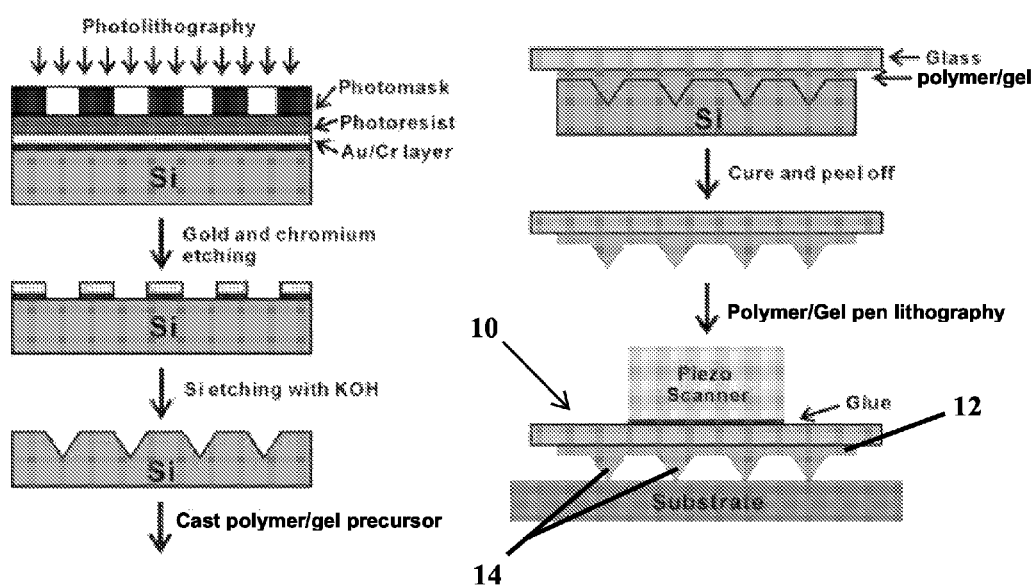
FIG. 17 is a schematic illustration of a polymer tip array fabrication.

A preferred polymer pen tip array (FIG. 16) contains thousands of tips, preferably having a pyramidal shape, which can be made with a master prepared by conventional photolithography and subsequent wet chemical etching (FIGS. 16a and 17). The tips preferably are connected by a common substrate which includes a thin polymer backing layer (50-100 μm thick), which preferably is adhered to a rigid support (e.g., a glass, silicon, quartz, ceramic, polymer, or any combination thereof), e.g. prior to or via curing of the polymer. The rigid support is preferably highly rigid and has a highly planar surface upon which to mount the array (e.g., silica glass, quartz, and the like). The rigid support and thin backing layer significantly improve the uniformity of the polymer pen tip array over large areas, such as three inch wafer surface (FIG. 16b), and make possible the leveling and uniform, controlled use of the array. When the sharp tips of the polymer pen tips are brought in contact with a substrate, ink is delivered at the points of contact (FIGS. 16a and 17). Gel pen lithography is a direct-write method that delivers collections of molecules in a positive printing mode. A gel polymer can be selected (e.g. a polysaccharide gel, e.g. agarose gel) such that the ink solution is absorbed into the gel matrix of a gel tip array.

The amount of light reflected from the internal surfaces of the tips increases significantly when the tips make contact with the substrate. Therefore, a translucent or transparent elastomer polymer tip array allows one to visually determine when all of the tips are in contact with an underlying substrate, permitting one to address the otherwise daunting task of leveling the array in an experimentally straightforward manner. Thus, preferably one or more of the array tips, backing layer, and rigid support are at least translucent, and preferably transparent.

Polymer pen or gel pen lithography can be performed, for example, with an Nscriptor™ system (NanoInk Inc., IL).

Referring to FIG. 17, an embodiment of a tip array 10 includes a tip substrate layer 12 and a plurality of tips 14 fixed to the tip substrate layer 12. The tip substrate layer 12 and the plurality of tips 14 are formed of a polymer and one or both can be formed of a transparent polymer. The tip substrate layer 12 and the tips 14 can be formed of the same polymer or can be formed of different polymers.

The tip substrate layer 12 can have any suitable thickness, for example in a range of about 50 μm to about 5 mm, about 50 μm to about 100 μm, or about 1 mm to about 5 mm. For example, the tip substrate layer 12 can have a minimum thickness of about 50, 100, 200, 300, 400, 500, 600, 700, 800, 900, 1000, 2000, 3000, 4000, or 5000 μm. For example, the tip substrate layer 12 can have a maximum thickness of about 50, 100, 200, 300, 400, 500, 600, 700, 800, 900, 1000, 2000, 3000, 4000, or 5000 μm. The thickness of the tip substrate layer can be decreased as the rigidity of the polymer used to form the tip substrate layer increases. For example, for a gel polymer (e.g., agarose), the tip substrate layer can have a thickness in a range of about 1 mm to about 5 mm. For other, more rigid, polymers (e.g., PDMS) the tip substrate layer can have a thickness in a range of about 50 μm to about 100 μm, for example. The combined thickness of the tip substrate layer 12 and the tips 14 can be in range of about 50 μm to about 5 mm. For example, for a gel polymer (e.g., agarose), the combined thickness can be up to about 5 mm. For example, for other polymers (e.g., PDMS) the combined thickness can be less than about 200 μm, preferably less than about 150 μm, or more preferably about 100 μm.

The tip substrate layer 12 can be attached to a transparent rigid support, for example, formed from glass, silicon, quartz, ceramic, polymer, or any combination thereof. The rigid support is preferably highly rigid and has a highly planar surface upon which to mount the tip array 10.

The tip arrays are non-cantilevered and comprise tips 14 which can be designed to have any shape or spacing (pitch) between them, as needed. The shape of each tip can be the same or different from other tips 14 of the array, and preferably the tips 14 have a common shape. Contemplated tip shapes include spheroid, hemispheroid, toroid, polyhedron, cone, cylinder, and pyramid (trigonal or square). The tips 14 have a base portion fixed to the tip substrate layer 12. The base portion preferably is larger than the tip end portion. The base portion can have an edge length in a range of about 1 μm to about 50 μm, or about 5 μm to about 50 μm. For example, the minimum edge length can be about 1, 2, 3, 4, 5, 6, 7, 8, 9, 10, 11, 12, 13, 14, 15, 16, 17, 18, 19, 20 22, 24, 26, 28, 30, 32, 34, 36, 38, 40, 42, 44, 46, 48, or 50 μm. For example, the maximum edge length can be about 1, 2, 3, 4, 5, 6, 7, 8, 9, 10, 11, 12, 13, 14, 15, 16, 17, 18, 19, 20, 22, 24, 26, 28, 30, 32, 34, 36, 38, 40, 42, 44, 46, 48, or 50 μm.

A preferred tip array 10 contains thousands of tips 14, preferably having a pyramidal shape. The substrate-contacting (tip end) portions of the tips 14 each can have a diameter in a range of about 50 nm to about 1 μm before coating with the graphene film. For example, the minimum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. For example, the minimum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. The substrate-contacting portions of the tips 14 are preferably sharp, so that each is suitable for forming submicron patterns, e.g., less than about 500 nm. The sharpness of the tip is measured by its radius of curvature. The tips 14 can have a radius of curvature before coating with the graphene film, for example, of below about 1 μm, and can be less than about 0.9 μm, less than about 0.8 μm, less than about 0.7 μm, less than about 0.6 μm, less than about 0.5 μm, less than about 0.4 μm, less than about 0.3 μm, less than about 0.2 μm, less than about 0.1 μm, less than about 90 nm, less than about 80 nm, less than about 70 nm, less than about 60 nm, or less than about 50 nm.

The tip-to-tip spacing between adjacent tips 14 (tip pitch) can be in a range of about 1 μm to about over 10 mm, or about 20 μm to about 1 mm. For example, the minimum tip-to-tip spacing can be about 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 200 μm, 300 μm, 400 μm, 500 μm, 600 μm, 700 μm, 800 μm, 900 μm, 1 mm, 2 mm, 3 mm, 4 mm, 5 mm, 6 mm, 7 mm, 8 mm, 9 mm, or 10 mm. For example, the maximum tip-to-tip spacing can be about 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75

μm, 80 μm, 85 μm, 90 μm, 95 μm, 100 μm, 200 μm, 300 μm, 400 μm, 500 μm, 600 μm, 700 μm, 800 μm, 900 μm, 1 mm, 2 mm, 3 mm, 4 mm, 5 mm, 6 mm, 7 mm, 8 mm, 9 mm, or 10 mm.

The tips 14 of the tip array 10 can be designed to have any desired thickness, for example in a range of about 50 nm to about 50 μm, about 50 nm to about 1 μm, about 10 μm to about 50 μm, about 50 nm to about 500 nm, about 50 nm to about 400 nm, about 50 nm to about 300 nm, about 50 nm to about 200 nm, or about 50 nm to about 100 nm. For example, the minimum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 μm, 5 μm, 10 μm, 15 μm, 20 μm, 25 μm, 30 μm, 35 μm, 40 μm, 45 μm, or 50 μm. For example, the maximum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 μm, 5 μm, 10 μm, 15 μm, 20 μm, 25 μm, 30 μm, 35 μm, 40 μm, 45 μm, or 50 μm. The thickness of the tip array 10 can be decreased as the rigidity of the polymer used to form the tip substrate layer increases. For example, for a gel polymer (e.g., agarose), the tip array 10 can have a thickness in a range of about 10 μm to about 50 μm. For other polymers (e.g., PDMS), for example, the tip array 10 can have a thickness of about 50 nm to about 1 μm. As used herein, the thickness of the tip array 10 refers to the distance from the tip end to the base end of a tip. The tips 14 can be arranged randomly or in a regular periodic pattern (e.g., in columns and rows, in a circular pattern, or the like).

Polymeric materials suitable for use in the tip array 10 can have linear or branched backbones, and can be crosslinked or non-crosslinked, depending upon the particular polymer and the degree of compressibility desired for the tip. Cross-linkers refer to multi-functional monomers capable of forming two or more covalent bonds between polymer molecules. Non-limiting examples of cross-linkers include such as trimethylolpropane trimethacrylate (TMPTMA), divinylbenzene, di-epoxies, tri-epoxies, tetra-epoxies, di-vinyl ethers, tri-vinyl ethers, tetra-vinyl ethers, and combinations thereof.

Thermoplastic or thermosetting polymers can be used, as can crosslinked elastomers. In general, the polymers can be porous and/or amorphous. A variety of elastomeric polymeric materials are contemplated, including polymers of the general classes of silicone polymers and epoxy polymers. Polymers having low glass transition temperatures such as, for example, below 25° C. or more preferably below −50° C., can be used. Diglycidyl ethers of bisphenol A can be used, in addition to compounds based on aromatic amine, triazine, and cycloaliphatic backbones. Another example includes Novolac polymers. Other contemplated elastomeric polymers include methylchlorosilanes, ethylchlorosilanes, and phenylchlorosilanes, polydimethylsiloxane (PDMS). Other materials include polyethylene, polystyrene, polybutadiene, polyurethane, polyisoprene, polyacrylic rubber, fluorosilicone rubber, and fluoroelastomers.

Further examples of suitable polymers that may be used to form a tip can be found in U.S. Pat. No. 5,776,748; U.S. Pat. No. 6,596,346; and U.S. Pat. No. 6,500,549, each of which is hereby incorporated by reference in its entirety. Other suitable polymers include those disclosed by He et al., Langmuir 2003, 19, 6982-6986; Donzel et al., Adv. Mater. 2001, 13, 1164-1167; and Martin et al., Langmuir, 1998, 14-15, 3791-3795. Hydrophobic polymers such as polydimethylsiloxane can be modified either chemically or physically by, for example, exposure to a solution of a strong oxidizer or to an oxygen plasma.

The polymer of the tip array 10 can be a polymer gel. The gel polymer can comprise any suitable gel, including hydrogels and organogels. For example, the polymer gel can be a silicon hydrogel, a branched polysaccharide gel, an unbranched polysaccharide gel, a polyacrylamide gel, a polyethylene oxide gel, a cross-linked polyethylene oxide gel, a poly(2-acrylamido-2-methyl-1-propanesulfonic acid) (polyAMPS) gel, a polyvinylpyrrolidone gel, a cross-linked polyvinylpyrrolidone gel, a methylcellulose gel, a hyaluronan gel, and combinations thereof. For example, the polymer gel can be an agarose gel. By weight, gels are mostly liquid, for example the gel can be greater than 95% liquid, yet behave like a solid due to the presence of a cross-linked network within the liquid.

The material used to form the tip array 10 has a suitable compression modulus and surface hardness to prevent collapse of the tip during contact with the surface, but too high a modulus and too great a surface hardness can lead to a brittle material that cannot adapt and conform to a substrate surface during exposure. As disclosed in Schmid, et al., Macromolecules, 33:3042 (2000), vinyl and hydrosilane prepolymers can be tailored to provide polymers of different modulus and surface hardness. Thus, in another type of embodiment, the polymer can be a mixture of vinyl and hydrosilane prepolymers, wherein the weight ratio of vinyl prepolymer to hydrosilane crosslinker is about 5:1 to about 20:1, about 7:1 to about 15:1, or about 8:1 to about 12:1.

The material used to form the tip array 10 can have a surface hardness of about 0.2% to about 3.5% of glass, as measured by resistance of a surface to penetration by a hard sphere with a diameter of 1 mm, compared to the resistance of a glass surface (as described in Schmid, et al., Macromolecules, 33:3042 (2000) at p 3044). The surface hardness optionally can be about 0.3% to about 3.3%, about 0.4% to about 3.2%, about 0.5% to about 3.0%, or about 0.7% to about 2.7% of glass. The polymers of the tip array 10 can have a compression modulus of about 10 MPa to about 300 MPa. The tip array 10 preferably comprises a compressible polymer which is Hookean under pressures of about 10 MPa to about 300 MPa. The linear relationship between pressure exerted on the tip array 10 and the feature size allows for control of the near field and feature size using the disclosed methods and tip arrays.

A Polymer Pen Lithography tip array can comprise a polymer that has adsorption and/or absorption properties for the patterning composition, such that the tip array acts as its own patterning composition reservoir. For example, PDMS is known to adsorb patterning inks. See e.g., U.S. Patent Publication No 2004/22962, Zhang et al., Nano Lett. 4, 1649 (2004), and Wang et al., Langmuir 19, 8951 (2003).

Polymer Pen Lithography tip arrays can be made with a master prepared by conventional photolithography and subsequent wet chemical etching. The mold can be engineered to contain as many tips arrayed in any fashion desired. The tips of the tip array can be any number desired, and contemplated numbers of tips 14 include about 1000 tips 14 to about 15 million tips, or greater. The number of tips 14 of the tip array 10 can be greater than about 1 million, greater than about 2 million, greater than about 3 million, greater than about 4 million, greater than 5 million tips 14, greater than 6 million, greater than 7 million, greater than 8 million, greater than 9 million, greater than 10 million, greater than 11 million, greater than 12 million, greater than 13 million, greater than 14 million, or greater than 15 million tips.

Figure 18:
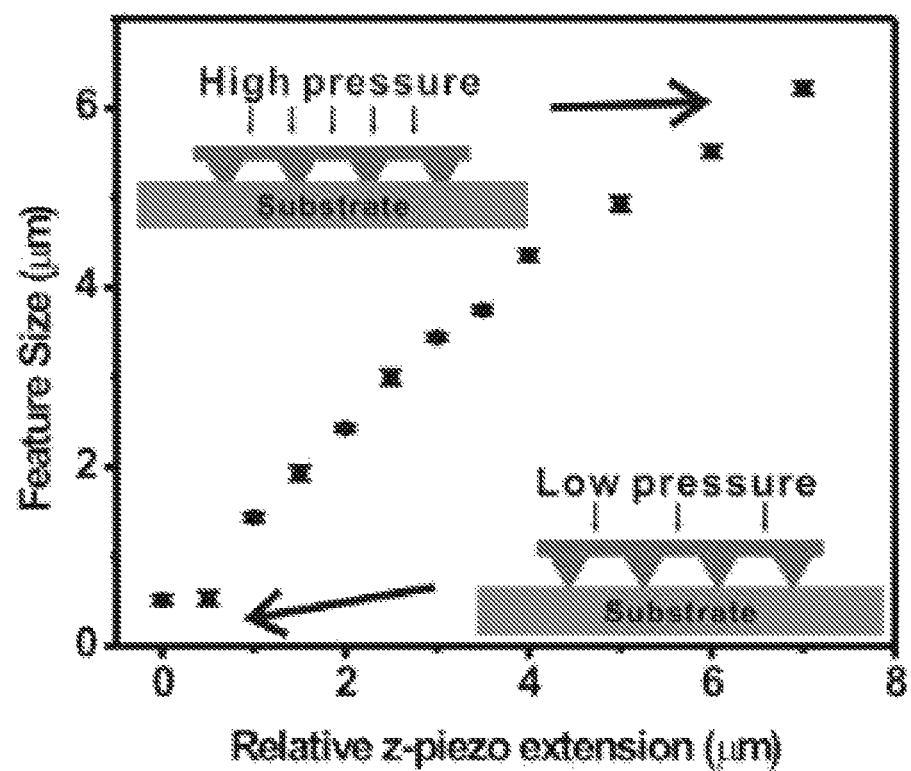
FIG. 18 is a graph illustrating feature size as a function of relative z-piezo extension, demonstrating the pressure dependence of feature size when patterning with polymer pen or gel pen or beam pen lithography.

Polymer Pen Lithography exhibits both time- and pressure-dependent ink transport. Polymer Pen Lithography probes having a graphene film coated thereon also exhibit both time- and pressure-dependent ink transport. This property of Polymer Pen Lithography, which is a result of the diffusive characteristics of the ink and the small size of the delivery tips, allows one to pattern sub-micron features with high precision and reproducibility (variation of feature size is less than 10% under the same experimental conditions). The pressure dependence of Polymer Pen Lithography derives from the compressible nature of the elastomer pyramid array and is not inhibited by the graphene film. Indeed, the microscopic, preferably pyramidal, tips can be made to deform with successively increasing amounts of applied pressure, which can be controlled by simply extending the piezo in the vertical direction (z-piezo). The controlled deformation can be used as an adjustable variable, allowing one to control tip-substrate contact area and resulting feature size. Within the pressure range allowed by z-piezo extension of about 5 to about 25 µm, one can observe a near linear relationship between piezo extension and feature size at a fixed contact time of 1 s (FIG. 18). Interestingly, at the point of initial contact and up to a relative extension 0.5 µm, the sizes of the MHA dots do not significantly differ and are both about 500 nm, indicating that the backing elastomer layer, which connects all of the pyramids, deforms before the pyramid-shaped tips do. This type of buffering is fortuitous and essential for leveling because it provides extra tolerance in bringing all of the tips in contact with the surface without tip deformation and significantly changing the intended feature size. When the z-piezo extends 1 µm or more, the tips exhibit a significant and controllable deformation (FIG. 3). With the pressure dependency of Polymer Pen Lithography, one does not have to rely on the time-consuming, meniscus-mediated ink diffusion process to generate large features. Indeed, one can generate either nanometer or micrometer sized features in only one printing cycle by simply adjusting the degree of tip deformation.

Polymer Pen Lithography allows for the combinatorial patterning of molecule-based and solid-state features with dynamic control over features size, spacing, and shape. The maskless nature of Polymer Pen Lithography allows one to arbitrarily make many types of structures without the hurdle of designing a new master via a throughput-impeded serial process. In addition, Polymer Pen Lithography can be used with sub-100 nm resolution with the registration capabilities of a closed-loop scanner.

Beam Pen Lithography

The tips 14 of a Beam Pen Lithography tip array can be used to both channel the radiation to a surface in a massively parallel scanning probe lithographic process and to control one or more parameters such as the distance between the tip and the substrate, and the degree of tip deformation. Control of such parameters can allow one to take advantage of near-field effects. In one embodiment, the tips 14 are elastomeric and reversibly deformable, which can allow the tip array 10 to be brought in contact with the substrate without damage to the substrate or the tip array 10. This contact can ensure the generation of near-field effects.

Referring to FIG. 4, an embodiment of a Beam Pen Lithography tip array 10 includes a tip substrate layer 12 and a plurality of tips 14 fixed to the tip substrate layer 12. The tip substrate layer 12 and the plurality of tips 14 are formed of a transparent polymer. The tip substrate layer 12 and the tips 14 can be formed of the same polymer or can be formed of different polymers. Details regarding the tips and tip arrays, including, for example, the tip and tip substrate dimensions, shape, spacing, materials, and number of tips, are provided above.

Figure 19:
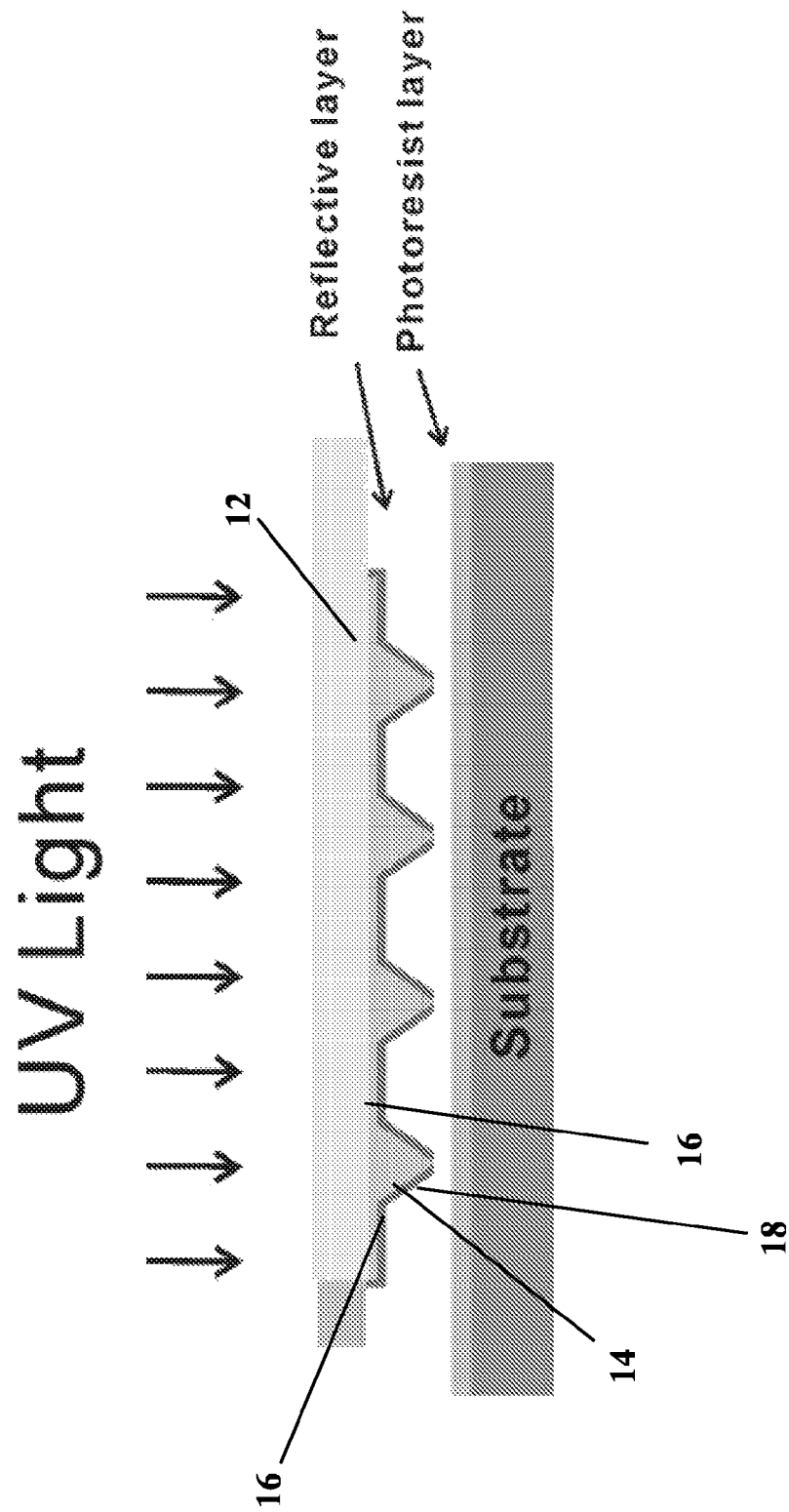
FIG. 19 is a schematic illustration of a beam tip array and a beam pen lithography method.
Figure 20:
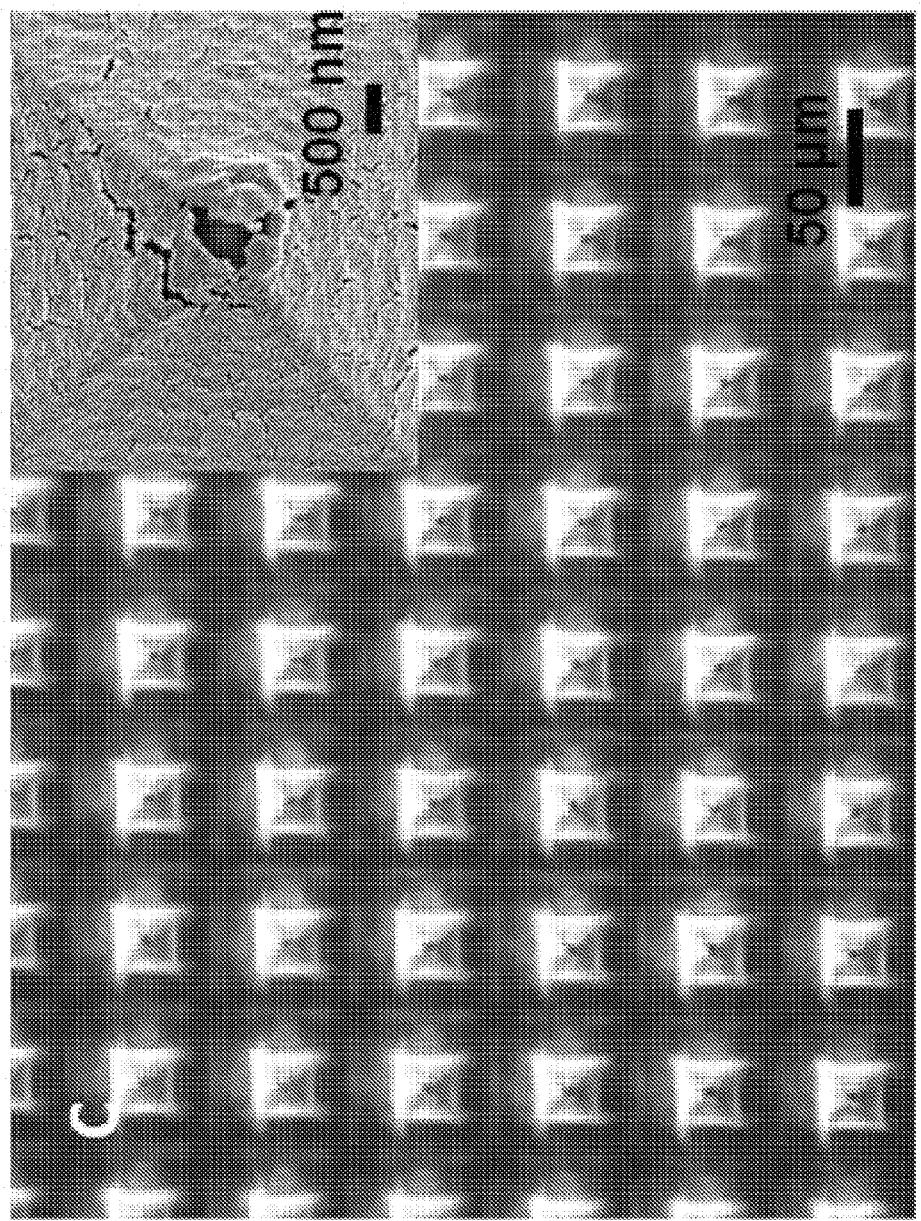
FIG. 20 is an SEM image of a beam pen tip array, with the inset showing an aperture formed in a tip end.

A Beam Pen Lithograph tip array 10 further includes a blocking layer 16 coated on the sidewalls of the tips 14 and on the portions of the tip substrate layer 12 between adjacent tips 14. Referring to FIG. 19, an aperture 18 is defined in the blocking layer 16 at the tip end (e.g., the photosensitive layer-contacting end of each of the tips 14), such that the transparent polymer tip end is exposed through the aperture 18. The tips 14 are formed from a material which is at least translucent to the wavelength of radiation intended for use in patterning, e.g. in a range of 300 nm to 600 nm, and preferably the tips 14 are transparent to such light. Each tip can have a blocking layer 16 disposed thereon, with an aperture 18 defined in the blocking layer 16 and exposing the tip end. The blocking layer 16 serves as a radiation blocking layer 16, channeling the radiation through the material of the tip and out the exposed tip end.

The blocking layer 16 on the polymer tip sidewalls serves as a radiation blocking layer 16, allowing the radiation illuminated on a surface of the substrate layer opposite the surface to which the tips 14 are fixed to be emitted only through the tip end exposed by the aperture 18 defined in the blocking layer 16. The exposure of a substrate pre-coated with a resist layer 20 with the radiation channeled through the tip ends 18 of the tip array 10 can allow for the formation of a single dot per tip for each exposure. The blocking layer 16 can be formed of any material suitable for blocking (e.g., reflecting) a type of radiation used in the lithography process. For example, the blocking layer 16 can be a metal, such as gold, when used with UV light. Other suitable blocking layers include, but are not limited to, gold, chromium, titanium, silver, copper, nickel, silicon, aluminum, opaque organic molecules and polymers, and combinations thereof. The blocking layer 16 can have any suitable thickness, for example in a range of about 40 nm to about 500 nm. For example, the minimum thickness can be about 40, 45, 50, 55, 60, 65, 70, 75, 80, 85, 90, 95, 100, 150, 200, 250, 300, 350, 400, 450, or 500 nm. For example, the maximum thickness can be about 40, 45, 50, 55, 60, 65, 70, 75, 80, 85, 90, 95, 100, 150, 200, 250, 300, 350, 400, 450, or 500 nm.

The pressure dependence exhibited by polymer pen lithography tip arrays and described above is similarly exhibited by beam pen lithography tip arrays. As noted above, the graphene film does not inhibit or otherwise adversely affect the pressure dependent properties of beam pen lithography.

As described above, the tip portion of the tip arrays can be made with a master prepared by conventional photolithography and subsequent wet chemical etching. The mold can be engineered to contain as many tips 14 arrayed in any fashion desired. The tips of the tip array can be any number desired, and contemplated numbers of tips 14 include about 1000 tips 14 to about 15 million tips, or greater. The number of tips 14 of the tip array 10 can be greater than about 1 million, greater than about 2 million, greater than about 3 million, greater than about 4 million, greater than 5 million tips 14, greater than 6 million, greater than 7 million, greater than 8 million, greater than 9 million, greater than 10 million, greater than 11 million, greater than 12 million, greater than 13 million, greater than 14 million, or greater than 15 million tips.

Optionally, the tips 14 can be cleaned, for example, using oxygen plasma, prior to coating with the blocking layer 16. The blocking layer 16 can be disposed on the tips 14 by any suitable process, including coating, for example, spin-coating, the tips 14 with the blocking layer 16

An aperture 18 in the blocking layer 16 can be formed by any suitable method, including, for example, focused ion beam (FIB) methods, dry and wet chemical etchings, or using a lift-off method. The lift-off method can be a dry lift off method. Referring to FIG. 6A, one suitable approach includes applying an adhesive 22, such as poly(methyl methacrylate) (PMMA) on top of the blocking layer 16 of the tip array 10, and removing a portion of the adhesive 22 material disposed at the substrate contacting end of the tips 14 by contacting the tip array 10 to a clean and flat surface, for example a glass surface. The tips 14 can then be immersed in an etching solution to remove the exposed portion of the blocking layer 16 to form the aperture 18 and expose the material of the tip, e.g. the transparent polymer. The remaining adhesive 22 material protects the covered surfaces of the blocking layer 16 from being etched during the etching step. The adhesive can be, for example, PMMA, poly(ethylene glycol) (PEG), polyacrylonitrile, and combinations thereof.

Figure 21A:
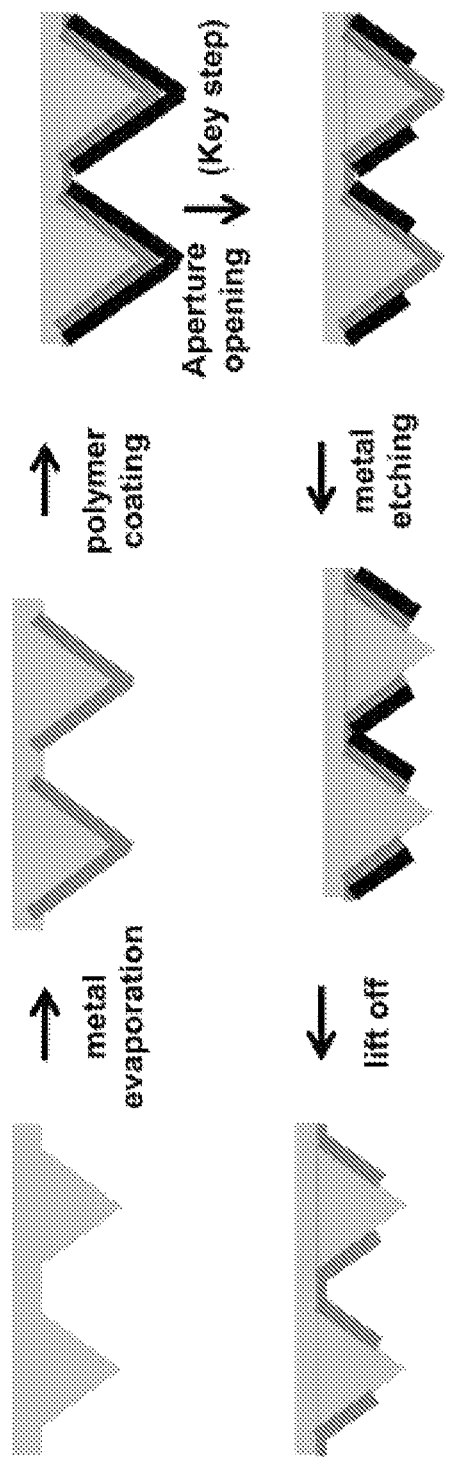
FIGS. 21a and 21b are schematic illustrations of methods of making a beam pen tip array.
Figure 21B:
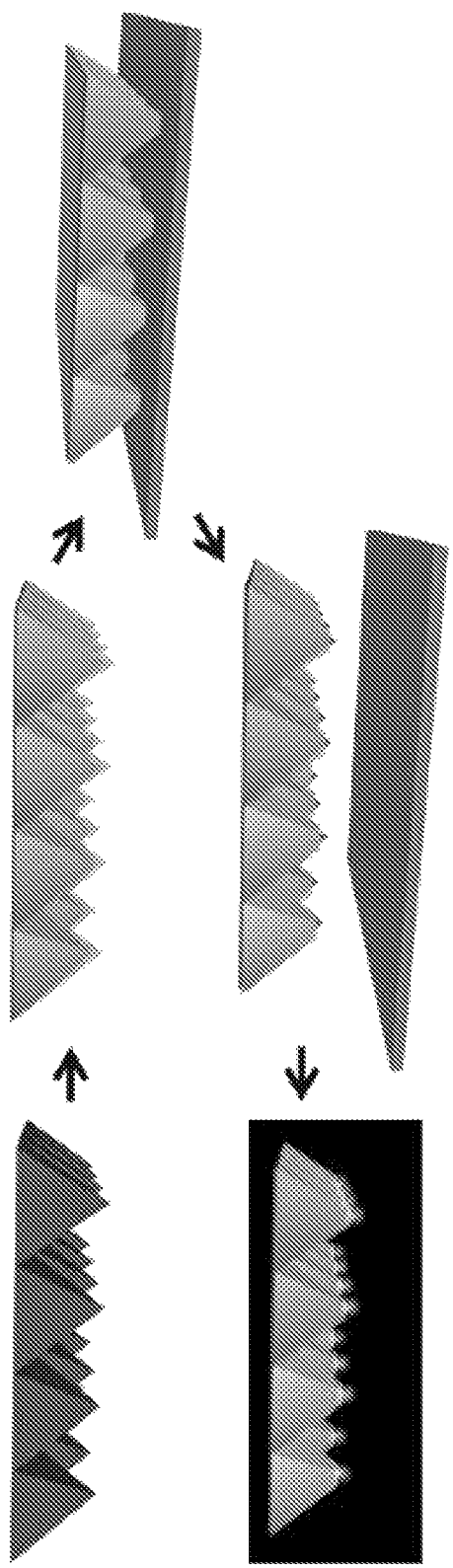

Referring to FIGS. 21b and 26, alternatively, a simple contact approach can be used in which a tip array 10 having the blocking layer 16 is brought in contact with a glass slide or other surface coated with an adhesive 22 material, such as PMMA. Other suitable adhesive 22 materials include, for example, PMMA, PEG, polyacrylonitrile, and combinations thereof. Upon removal of the pen tip from surface coated with the adhesive 22 material, the adhesive 22 material removes the contacted portion of the blocking layer 16, thereby defining an aperture 18 and exposing the tip material, e.g. the transparent polymer.

In either of the above described aperture 18 forming methods, the size of the aperture 18 formed can be controlled by applying different external forces on the backside of the BPL tip array 10. As a result of the flexibility of elastomeric tips 14, the application of force on the backside of the BPL tip array 10 can be used to control the contact area between the tips 14 and adhesive 22 material surface. The contact force optionally can be in a range of about 0.002 N to about 0.2N for a 1 cm² tip array.

Referring to FIG. 26, in an embodiment, the aperture is formed by coating the tip array having the blocking layer with a polymer layer, such as a layer of PMMA. The tip array can be repeatedly coated with the polymer layer to ensure complete coverage of the tips. The polymer layer can be coated on the blocking layer, for example, using spin coating or any other suitable coating methods, as is well known in the art. Reactive ion etching can then be used to etch the polymer layer and expose the apexes of the tips. The reactive ion etching process can be monitored, for example, using optical microscopy to ensure that etching is stopped when only the apexes are exposed or to ensure the desired amount of etching be done to form a selected aperture size. The size of the aperture can be controlled by controlling the etching of the polymer layer to expose more or less of the apex of the tip. The blocking layer exposed through the etched portion of the polymer layer can then be etched using any known etching process, for example, a chemical etching process, and using the remaining polymer layer as an etch mask. The exposed blocking layer can be etched to expose the underlying polymer layer of the tips and thereby form the aperture. The polymer layer can be removed using any suitable methods. For example, the polymer layer can be removed by rinsing with acetone.

Any of the above-described approaches can be utilized when forming a blocking layer on a tip having a graphene film coated thereon.

The BPL tip array 10 can include pyramidal tips 14, with each pyramid-shaped tip being covered by a gold blocking layer 16 having a small aperture 18 defined in the blocking layer 16 at the very end of the tip. The size of the aperture 18 does not significantly change from tip to tip. For example, the size of the aperture 18 can vary less than about 10% from tip to tip. The size of the aperture 18 can be tailored over the 200 nm to 1 to 10 µm ranges, for example, by controlling contact force. For example, the aperture 18 can have a diameter in a range of about 5 nm to about 5 µm, about 30 nm to about 500 nm, or about 200 nm to about 5 µm. For example, the minimum aperture 18 diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm. For example, the maximum aperture 18 diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm.

A PDMS array of pyramid-shape tips 14 can be fabricated by known methods. (17, 20). For example, each pyramid tip can have a square base with a several tens of µm edge length and can come to a tip that has tip diameter of about 100 nm. The entire array, including tips 14, can then be cleaned, for example, by oxygen plasma and covered with a blocking layer 16 (e.g. gold), by a thermal evaporation method, for example. The coating can include, for example, a layer of gold that is about 80 nm thick with an about 5 nm thick Ti adhesion layer. The tip array 10 is then brought in contact with a glass slide coated with PMMA, an adhesive 22 material, which subsequently removes the Au/Ti layer from the PDMS tips 14 and exposes the underlying transparent PDMS.

In one class of embodiments, the graphene film is coated on the tips prior to forming the blocking layer. In such embodiments, the graphene film is transparent and therefore can remain on the tip end without inhibiting the photolithography performance of the beam tip array. In another class of embodiments, the blocking layer is formed on the tips and the graphene film is coated on the blocking layer. In such embodiments, the aperture can be formed prior to forming the graphene film and the graphene film can be coated over the blocking layer and the aperture.

Hard Tip Soft Spring Lithography

Figure 22:
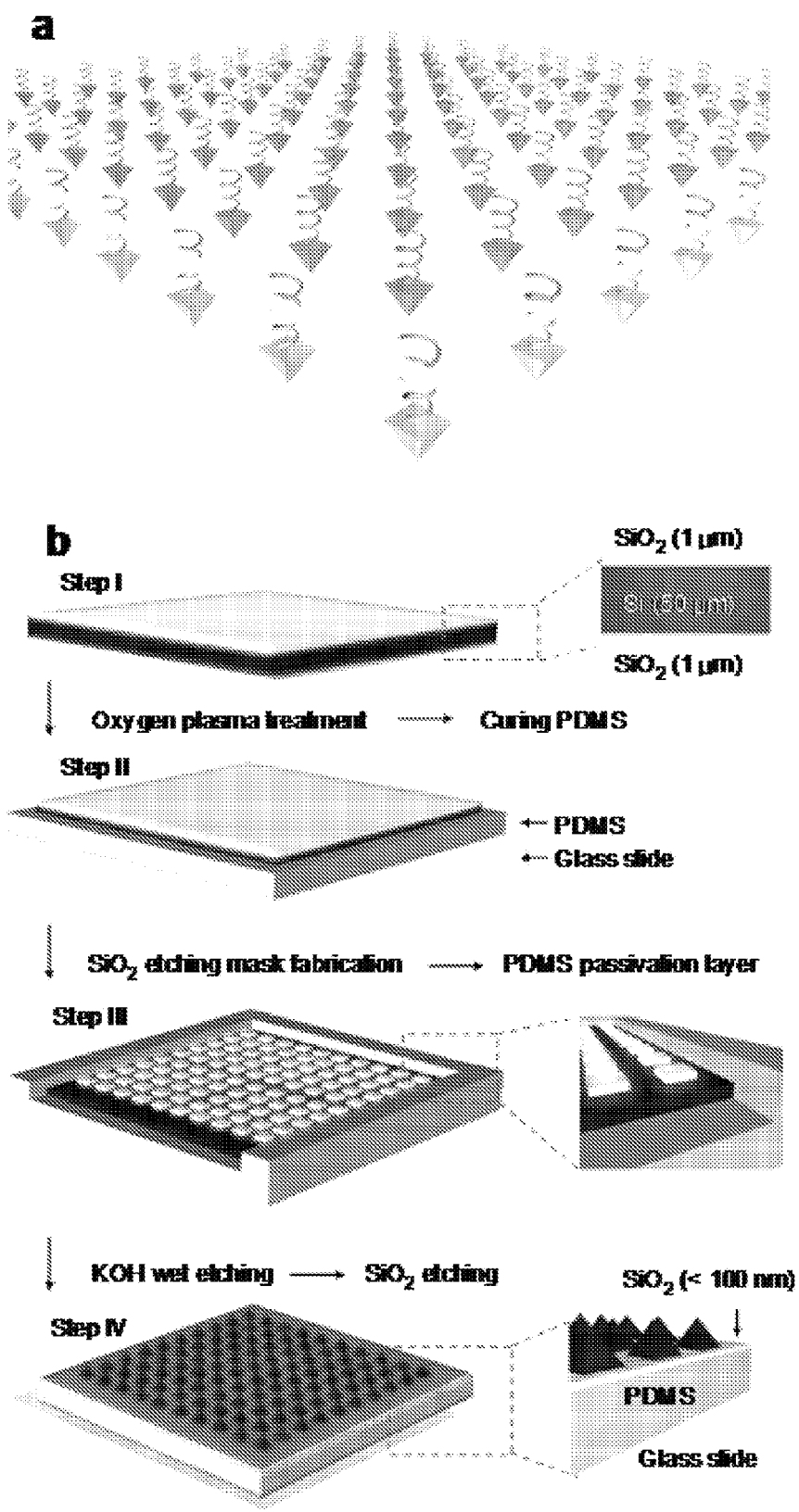
FIG. 22a is a schematic illustration of a hard tip soft spring lithography tip array.
FIG. 22b is a schematic illustration of a method of making a hard tip soft spring lithography tip array.

Referring to FIGS. 22a and 22b, Hard tip soft spring lithography is a massively parallel, hybrid tip-based molecular printing method. When silicon is used for the tip material, Hard tip soft spring lithography is also referred to as Silicon Pen Lithography. The method and apparatus employs an array of tips, e.g. Si tips, mounted onto a backing layer to create patterns of molecules on surfaces with features as small as 30 nm in diameter over large area. While the tips described herein are described in the context of silicon or silicon-containing tips, the tips can also comprise a metal, metalloid, a semi-conducing material, and/or combinations thereof. For example, silicon nitride AFM probes, metal carbide coated AFM probes, plasma treated AFM probes, silanized AFM probes, diamond AFM probes, gallium containing materials (e.g., gallium nitride, gallium sulfide, gallium arsenide), and other semi-conducting materials are known in the art. The tips can have an average radius of curvature of, e.g., down to 22 nm or even less. Hard tip soft spring lithography tips arrays demonstrate time-dependent feature size that is analogous to DPN, but there is no relation between the force and the feature size, which is distinct from polymer pen lithography. Hard tip soft spring lithography tips can write features as small as 34 nm, and can transfer energy to the surface to form a pattern.

The tip arrays disclosed herein comprise a plurality of tips (e.g., silicon or silicon-containing) fixed to an elastomeric backing layer. The backing layer can be at least translucent, or preferably substantially transparent. The backing layer can have any suitable thickness, for example in a range of about 50 µm to about 1000 µm, about 50 µm to about 500 µm, about 50 µm to about 250 µm, or about 50 µm to about 200 µm, or about 50 µm to about 100 µm.

The elastomeric backing layer comprises an elastomeric polymeric material. Polymeric materials suitable for use in the backing layer can have linear or branched backbones, and can be crosslinked or non-crosslinked. Cross-linkers refer to multi-functional monomers capable of forming two or more covalent bonds between polymer molecules. Non-limiting examples of cross-linkers include such as trimethylolpropane trimethacrylate (TMPTMA), divinylbenzene, di-epoxies, tri-epoxies, tetra-epoxies, di-vinyl ethers, tri-vinyl ethers, tetra-vinyl ethers, and combinations thereof.

Thermoplastic or thermosetting polymers can be used, as can crosslinked elastomers. In general, the polymers can be porous and/or amorphous. A variety of elastomeric polymeric materials are contemplated, including polymers of the general classes of silicone polymers and epoxy polymers. Polymers having low glass transition temperatures such as, for example, below 25° C. or more preferably below −50° C., can be used. Diglycidyl ethers of bisphenol A can be used, in addition to compounds based on aromatic amine, triazine, and cycloaliphatic backbones. Another example includes Novolac polymers. Other contemplated elastomeric polymers include methylchlorosilanes, ethylchlorosilanes, and phenylchlorosilanes, polydimethylsiloxane (PDMS). Other materials include polyethylene, polystyrene, polybutadiene, polyurethane, polyisoprene, polyacrylic rubber, fluorosilicone rubber, and fluoroelastomers.

Further examples of suitable polymers that may be used in the backing layer can be found in U.S. Pat. No. 5,776,748; U.S. Pat. No. 6,596,346; and U.S. Pat. No. 6,500,549, each of which is hereby incorporated by reference in its entirety. Other suitable polymers include those disclosed by He et al., Langmuir 2003, 19, 6982-6986; Donzel et al., Adv. Mater. 2001, 13, 1164-1167; and Martin et al., Langmuir, 1998, 14-15, 3791-3795. Hydrophobic polymers such as polydimethylsiloxane can be modified either chemically or physically by, for example, exposure to a solution of a strong oxidizer or to an oxygen plasma. In some cases, the elastomeric polymer is a mixture of vinyl and hydrosilane prepolymers, where the weight ratio of vinyl prepolymer to hydrosilane crosslinker is about 5:1 to about 20:1, about 7:1 to about 15:1, or about 8:1 to about 12:1.

The tips of the tip array can be any number desired, and contemplated numbers of tips include about 100 tips to about 15 million tips, or greater. The number of tips of the tip array can be greater than about 1 million, greater than about 2 million, greater than about 3 million, greater than about 4 million, greater than 5 million tips, greater than 6 million, greater than 7 million, greater than 8 million, greater than 9 million, greater than 10 million, greater than 11 million, greater than 12 million, greater than 13 million, greater than 14 million, or greater than 15 million tips.

The tip array comprising tips and backing layer can have any suitable thickness, for example in a range of about 50 µm to about 5 mm, about 50 µm to about 100 µm, or about 1 mm to about 5 mm. For example, the tip array can have a minimum thickness of about 50, 100, 200, 300, 400, 500, 600, 700, 800, 900, 1000, 2000, 3000, 4000, or 5000 µm. For example, the backing layer can have a maximum thickness of about 50, 100, 200, 300, 400, 500, 600, 700, 800, 900, 1000, 2000, 3000, 4000, or 5000 µm.

The tip array can be attached to a rigid support. The rigid support, when present, is disposed opposite the tips of the tip array and parallel to the backing layer. In some cases, the rigid support is at least translucent, or is substantially transparent. In some cases, the backing layer and rigid support together are at least translucent or are substantially transparent. Non-limiting examples of rigid supports include formed from glass, silicon, quartz, ceramic, polymer, or any combination thereof. The rigid support is preferably highly rigid and has a highly planar surface upon which to mount the tip array. The combined thickness of the tip array and optional rigid support can be of any desired thickness, for example in range of about 50 µm to about 5 mm. The combined thickness can be less than about 5 mm, less than 1 mm, less than about 750 µm, or less than about 500 µm, for example.

The tip arrays are non-cantilevered and comprise tips (e.g. silicon or silicon-containing) which can be designed to have any shape or spacing (pitch) between them, as needed. The shape of each tip can be the same or different from other tips of the array, and preferably the tips have a common shape. Contemplated tip shapes include spheroid, hemispheroid, toroid, polyhedron, cone, cylinder, and pyramid (e.g., trigonal or square or octagonal). The tips can be arranged randomly or preferably in a regular periodic pattern (e.g., in columns and rows, in a circular pattern, or the like).

The tips have a base portion fixed to the backing layer. The base portion preferably is larger than the tip end portion. The base portion of the tips can have diameter of any suitable dimension, for example in a range of about 1 µm to about 50 µm, or about 5 µm to about 50 µm, or less than 100 µm, or less than 50 µm. For example, the minimum diameter of the base of the tips can be about 1, 2, 3, 4, 5, 6, 7, 8, 9, 10, 11, 12, 13, 14, 15, 16, 17, 18, 19, 20 22, 24, 26, 28, 30, 32, 34, 36, 38, 40, 42, 44, 46, 48, or 50 µm. For example, the maximum diameter of the base of the tips can be about 1, 2, 3, 4, 5, 6, 7, 8, 9, 10, 11, 12, 13, 14, 15, 16, 17, 18, 19, 20, 22, 24, 26, 28, 30, 32, 34, 36, 38, 40, 42, 44, 46, 48, or 50 µm.

A preferred shape of the tips is pyramidal, more preferably octagonal pyramidal. The substrate-contacting (tip end) portions of the tips each can have a radius of curvature of any suitable dimension, for example in a range of about 5 nm to about 1 µm. For example, the minimum radius of curvature can be about 5, 10, 15, 20, 21, 22, 23, 24, 25, 26, 27, 28, 29, 30, 35, 40, 45, 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. The substrate-contacting portions of the tips are preferably sharp, so that each is suitable for forming submicron patterns, e.g., a radius of curvature of less than about 500 nm, less than 100 nm, less than 50 nm, or less than 25 nm.

The tip-to-tip spacing between adjacent tips (tip pitch) can be of any desired dimension, for example in a range of about 1 µm to about over 10 mm, or about 20 µm to about 1 mm. For example, the minimum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm. For example, the maximum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm.

The tips of the tip array can be designed to have any desired height, for example in a range of about 50 nm to less than 100 µm, about 50 nm to about 90 µm, about 50 nm to about 80 µm, about 50 nm to about 70 µm, about 50 nm to about 60 µm, about 10 µm to about 50 µm, about 50 nm to about 40 µm, about 50 nm to about 30 µm, about 50 nm to about 20 µm, about 50 nm to about 500 nm, about 50 nm to about 400 nm, about 50 nm to about 300 nm, about 50 nm to about 200 nm, or about 50 nm to about 100 nm. For example, the minimum height can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 50 µm. For example, the maximum height can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 100 µm.

The tip array can optionally include an adhesion-enhancing layer between the tips and the backing layer. This layer can increase the stability of the tip-backing layer adhesion and/or increase the facility with which the tips and backing layer are adhered. The adhesion-enhancing layer can be disposed over the entire elastomeric backing layer, or optionally only in selected regions (e.g. between each tip and the elastomeric backing layer). One non-limiting example of an adhesion-enhancing layer is a silicon dioxide layer. Other examples include epoxy resins or other adhesive materials.

The tip array can optionally include a coating disposed on the exposed surfaces of the tips and further optionally also over the surfaces of the backing layer adjacent to the tips. This coating can comprise a conductive material (e.g., a material capable of conducting electrical energy), for example. Non-limiting examples of a conductive coating include gold, silver, titanium, nickel, copper, conductive metals, conductive metal alloys, or combinations thereof.

The Si tips, prepared by a self-sharpening wet etching protocol, can have a radius of curvature of about 22 nm, thereby enabling the easy preparation of sub-50 nm features in a pattern. Because the tip arrays can be prepared on a glass slide, these arrays can be easily mounted onto the piezoelectric actuators of a conventional AFM, which provides the precise tip positioning and registration that are hallmarks of scanning probe lithographies. Both the elastomer and glass onto which the arrays are mounted can be selected to be transparent, which enables the compression of the elastomer that occurs when the tips touch the surface of a substrate to be observed visually, thereby enabling a straightforward, optical method for leveling the plane of the tip array with respect to the substrate surface, when desired.

The preferred tip-array fabrication protocol described herein involves two major steps, photolithography and a self-sharpening etching step (22*b*). Importantly, no micromachining steps are required, thereby reducing significantly the manufacturing costs to about $10 for a 1×1 cm tip array, whereas a single, cantilever-bound AFM probe costs about $40. Depending on the intended use, the pitch of a tip array can be deliberately set between 100 and 200 µm, corresponding to tip densities of 10,000/cm2 and 2,500/cm2, respectively, and the density can be as high as 111,110/cm2 (9,007,700 tips in a 4-inch wafer) with a pitch of 30 µm, for example.

The method can include the steps of providing a substrate wafer (e.g., silicon) from which the tips will be formed; adhering an elastomeric backing layer to the wafer to form a structure; and etching the wafer material to form tips attached to the backing layer. Preferably, a mask pattern is formed over the wafer prior to etching, to form pre-tip regions.

As an example, to make the tip arrays, a Si wafer (e.g., 1×1 cm piece of a 50 µm-thick (100)), optionally with a layer of silicon dioxide (SiO2) (e.g., 1 µm thick) on each side of the wafer, was placed onto uncured elastomer. The top layer of SiO2 can serve as an etching mask material, while the SiO2 layer of the wafer in contact with the backing layer can increase adhesion between the two surfaces, so that the tips do not fall off a certain PDMS elastomeric backing material once the wafer has been etched (FIG. 23). Following an optional curing of elastomer of the backing layer, an array of square SiO2 masks over silicon (e.g., pre-tip regions) are prepared from the top SiO2 layer along the <110> axis of the wafer by conventional photolithography and a subsequent buffered hydrofluoric acid (HF) etch. The tips are prepared by etching the Si of the pre-tip regions and Si between pre-tip regions in an etching solution, e.g., 40% (w/v) aqueous potassium hydroxide (KOH) solution that etches the (311) and the (100) planes of the wafer at rates of 88 and 50 µm/hr, respectively. In one preferred embodiment, during the etching, the Si wafer is embedded in the elastomer or backing layer (e.g., PDMS) so that the sides of the wafer are not exposed to the etching solution, thereby protecting the (110) crystal face exposed on the sides that would etch faster than the (100) face on the surface. In other embodiments, the sides of the wafer can be protected from etchant by any other suitable methods and materials, as would be recognized by the skilled artisan. The sidewall etching rate, Rw/cos θ (θ is a slope of sidewall), must exceed the surface etching rate, Rf in order to form sharp Si tips. Thus the anisotropy ratio $\eta_c$ and the condition for self-sharpening points is expressed as $\eta=R_f/R_w \leq 1/\cos\theta = \eta_c$ which indicates that faster etching rate for sidewall than that of floor is required to form a sharp tip. For (311) sidewall and (100) floor, the experimental $\eta=R_{(100)}/R_{(311)}$ was measured as 0.56 in 40 wt % KOH at 70° C., while theoretical $\eta_c$ is 3.33. This parameter can be changed to altering the weight % of the KOH and/or the temperature at which the etching occurs. Other etching solutions that etch silicon anisotropically include ethylenediamine/pyrocathecol/water and tretramethylammonium hydroxide.

Figure 23A:
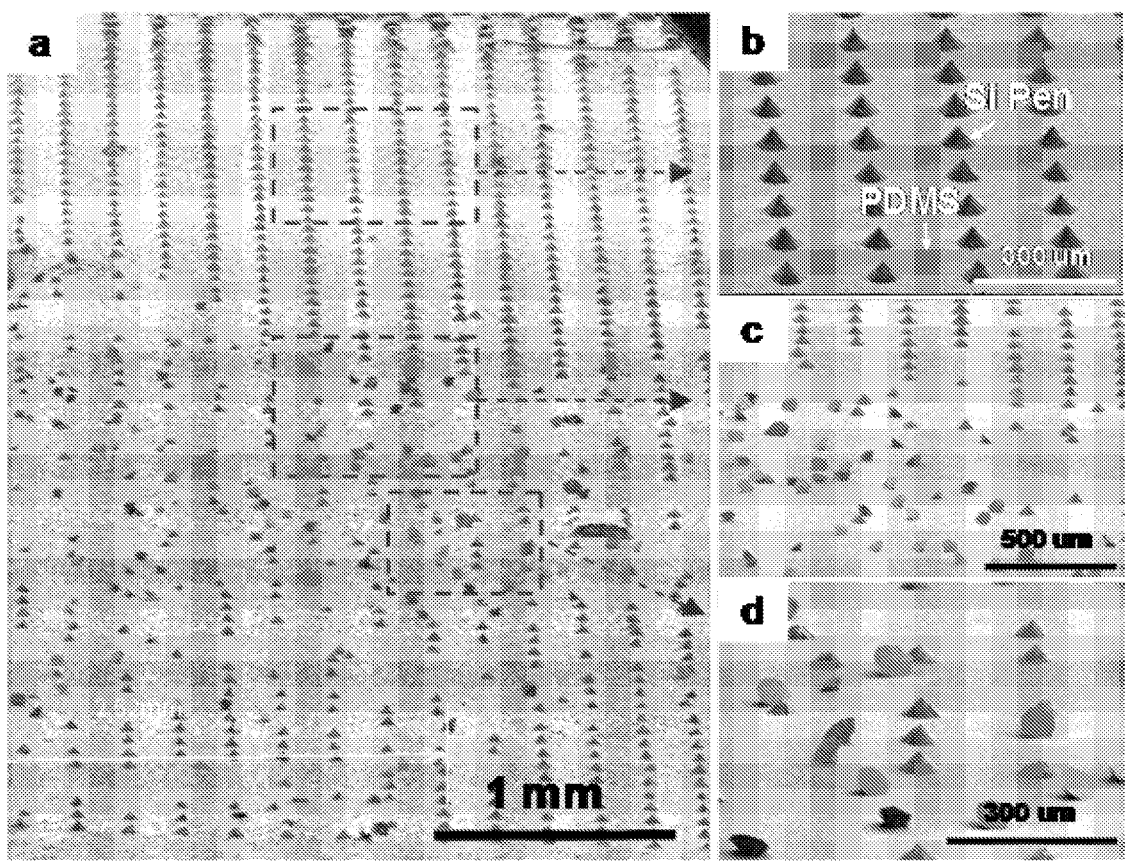
FIG. 23a is an SEM image of Si tip array after KOH etching (40 wt %, 75° C. for 65 min) with isopropyl alcohol, wherein Si substrate attached directly to PDMS without $SiO_2$ passivation layer resulted in Si tips falling from PDMS surface during etching; the welling of PDMS in solution at relatively high temperatures may cause the interfacial stress that weakens the adhesion of Si to PDMS; employing a $SiO_2$ passivation layer was found to significantly improve the stability of Si pen on a surface during etching.
Figure 23:
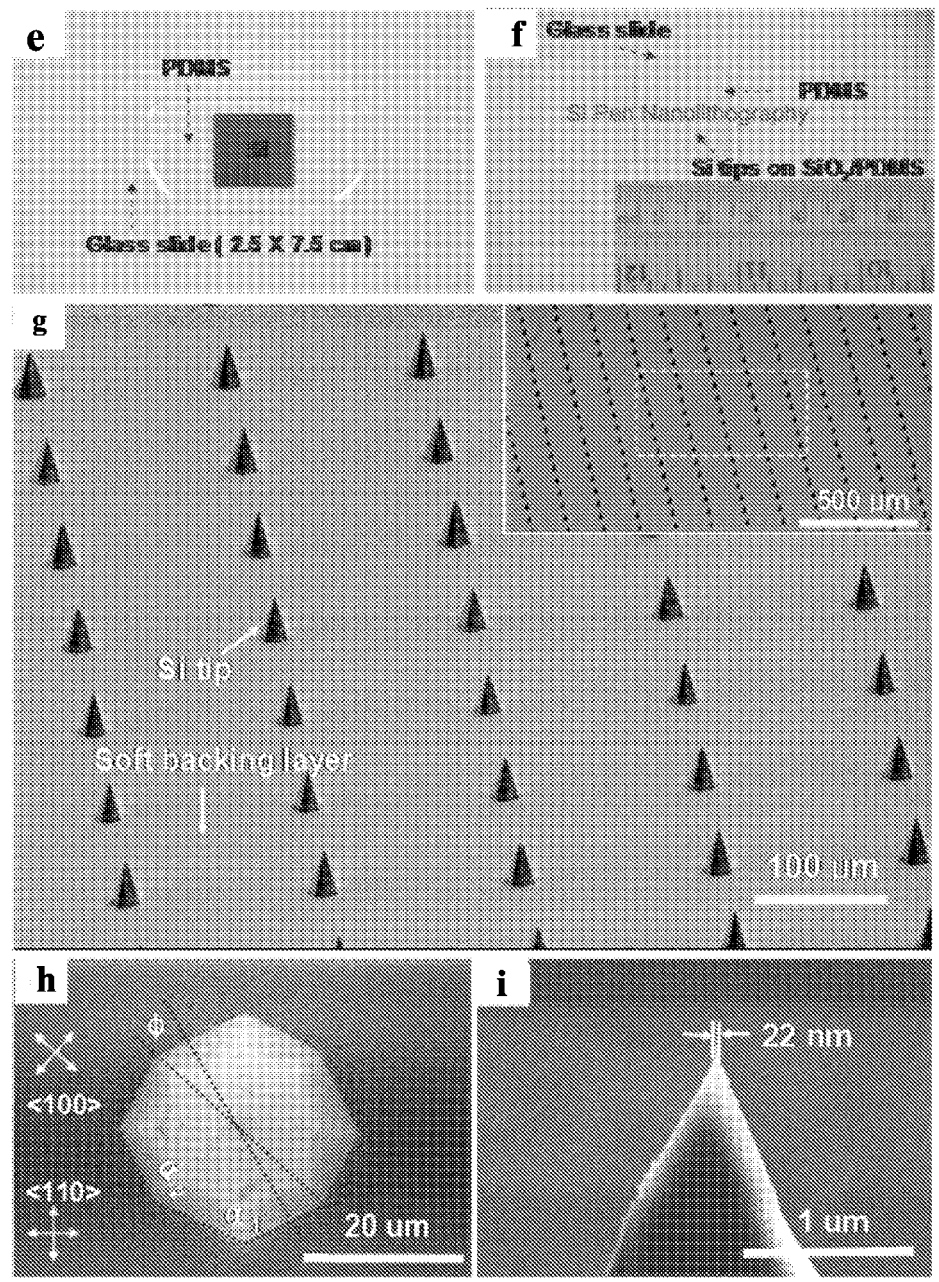
Figure 24:
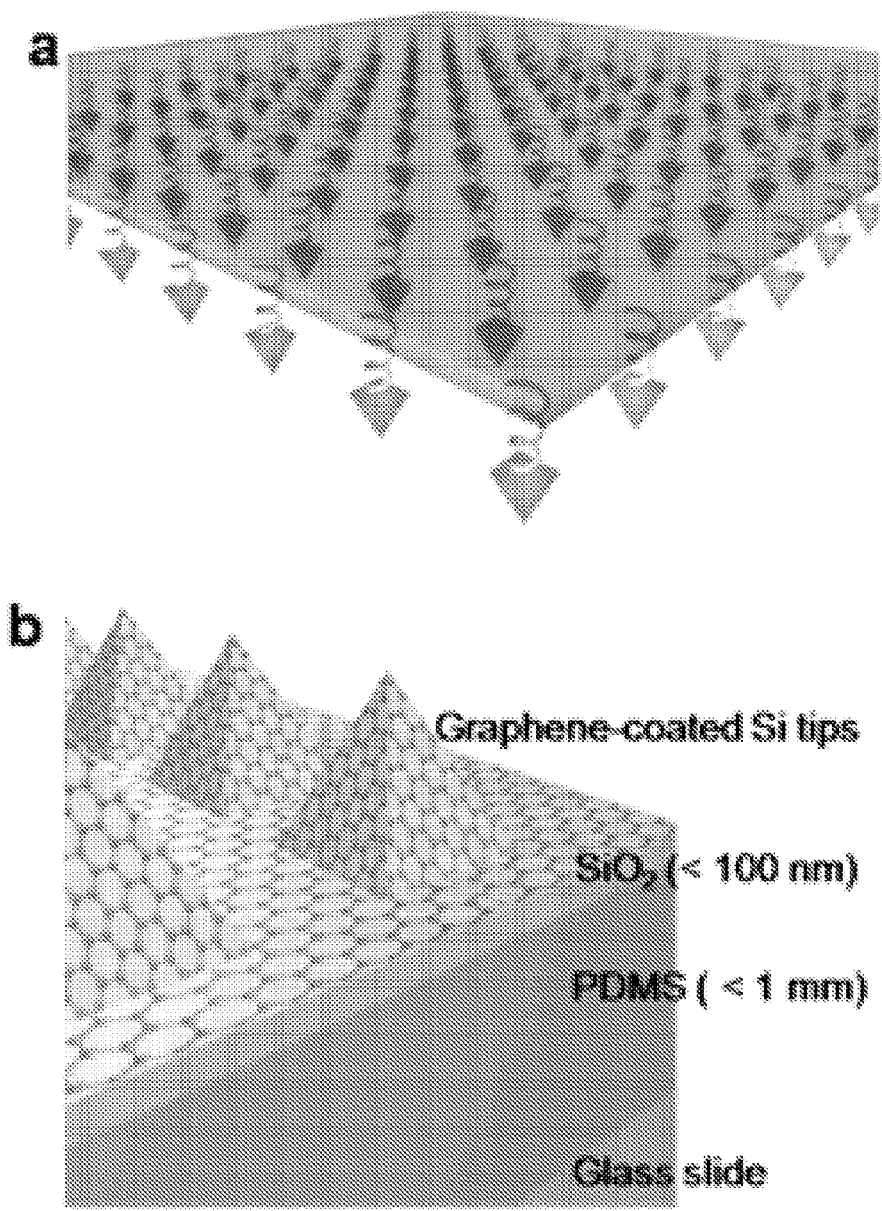
FIGS. 24a and 24b are schematic illustrations of a hard tip soft spring lithography tip array coated with a graphene film.

Analysis of the resulting tip arrays reveals that this fabrication protocol does indeed achieve massively parallel Si tip arrays with tip radii of about 22 nm (FIG. 23E-23I). The massively parallel Si tip array is immobilized onto a glass slide (FIG. 23E), which is a rigid support for the arrays, allows handling of the fragile tip array without damage, and is a platform for mounting the arrays onto the AFM. In a preferred embodiment, the elastomeric backing and rigid support together are transparent (FIG. 23*f*), which enables the visual leveling alignment of the tips onto a surface. A scanning electron microscope (SEM) image of the tips with 160 µm in pitch shows that the tips are remarkably uniform with bottom width 30±0.6 µm, corresponding to a tip height of 47±0.9 µm, and that they adhere well to the elastomer surface (FIG. 23G). It was found by SEM that the surface intersection angles, α1, α2, and the rotation of the intersection of the planes to the <100> plane of the wafer, φ, are 127.2, 143.3, and 18.3° (FIG. 23H), respectively, which demonstrates that the sidewall of the tips is (311) plane because the value of angles correspond perfectly to theoretical value of those for (311) of 126.9, 143.1, and 18.4°, respectively. Importantly, the Si tip radius of the arrays is found to be 22±3 nm (FIG. 23I), demonstrating that self-sharpening has been achieved under the etching conditions of 40% KOH in H2O. The tip radius can be reduced to 5 nm by changing the etching conditions, e.g., changing the KOH concentration and solution temperature during etching. This etching protocol, with a SiO2 etching mask and homogeneous KOH etching provides a tip yield >99%. Since the wafer used in this experiment has a thickness variation of 10% (50±5 µm, NOVA Electronic Materials Ltd., TX), the tip height can vary up to 10%.

In one exemplary embodiment, Hard tip soft spring lithography (HSL) tip arrays were formed using Si wafers (NOVA Electronic Materials; resistivity 1-10 Ω·cm, (100) orientation, 50±5 µm thick) with a 10,000-Å (±5%) SiO2 layer on each side were used for fabricating the tip arrays. The wafers were cleaned in acetone and ethanol, and then rinsed with water before use. In preparing the elastomer base, PDMS and a curing agent (Sylgard 184 Silicone) were mixed in a 20:1 ratio (W/W), and then degassed under vacuum (10-3 torr) for 30 minutes. Oxygen-plasma-treated (30 W at a pressure of 100 mTorr) wafers were then placed on drop-coated PDMS on clean glass slides, followed by curing at 75° C. for 1 h. Before curing, the bubbles that can form at the interface between the wafer and the uncured PDMS must be removed with additional degassing. To create HSL arrays, an array of squares must be defined on the surface of the silicon wafer to act as etch masks. These squares must be between 120 and 140 µm on edge (depending on the thickness of the silicon wafer) and the edges of the squares and aligned along the Si layers <110> direction. This array of squares is created by photolithography then transferred into the silica layer to form a hard mask for wet etching. The photolithography proceeds by treating with oxygen plasma for 1 minute at 30 W, then spin coating photoresist (Shipley; S1805 positive photoresist) at 500 r.p.m. for 10 s followed by 4,000 r.p.m. for 60 s onto the wafer/PDMS/glass slide. After spin-coating, the photoresist was baked at 105° C. for 90 s due to the thermal insulation of the PDMS layer (on a conventional substrate this photoresist is usually baked for only 60 s). The photoresist/wafer/PDMS/glass slide was exposed (UV light source) through a photomask defining the etch mask and subsequently developed (15 s, Shipley; Micoposit MF-319 Developer and washed with water). The sample edge was passivated with PDMS to prevent etching in from the sides. The exposed SiO2 was selectively etched in isotropic buffered hydrofluoric acid (Transene, 9% HF, BUFFER-HF Improved) etchant for 9 min in a polystyrene petri dish and then washed with water. To remove the photoresist, the wafer was cleaned in acetone, ethanol, and subsequently dried with flowing nitrogen. The wafer was then cleaned with oxygen plasma (1 min at 30 W at a pressure of 100 mTorr). Oxygen plasma cleaning prior to Si etching was found to improve the uniformity of the tips. Samples were immediately transferred into 40 wt % KOH (333 g KOH in 500 ml DI water) (KOH from Sigma-Aldrich; 99.99% metal basis, semiconductor grade, product no. 306568) at 75° C. and held in the centre of the etchant in a Teflon holder. The solution was continuously stirred to reduce the effect of micro-masking by hydrogen bubbles generated by the reaction at the Si surface. After 60-65 min, the sample was removed from the etchant, was rinsed in water, rinsed in ethanol, and then dried in air. As the etching rate of Si(100) in 40 wt % KOH at 75° C. is ~50 µm·h−1, the minimum required thickness of SiO2 was found to be 250 nm for an experimentally viable fabrication procedure, which motivated our choice for a 1 µm thick SiO2 layer.

Method of Coating the Tip Array with Graphene

Figure 25A:
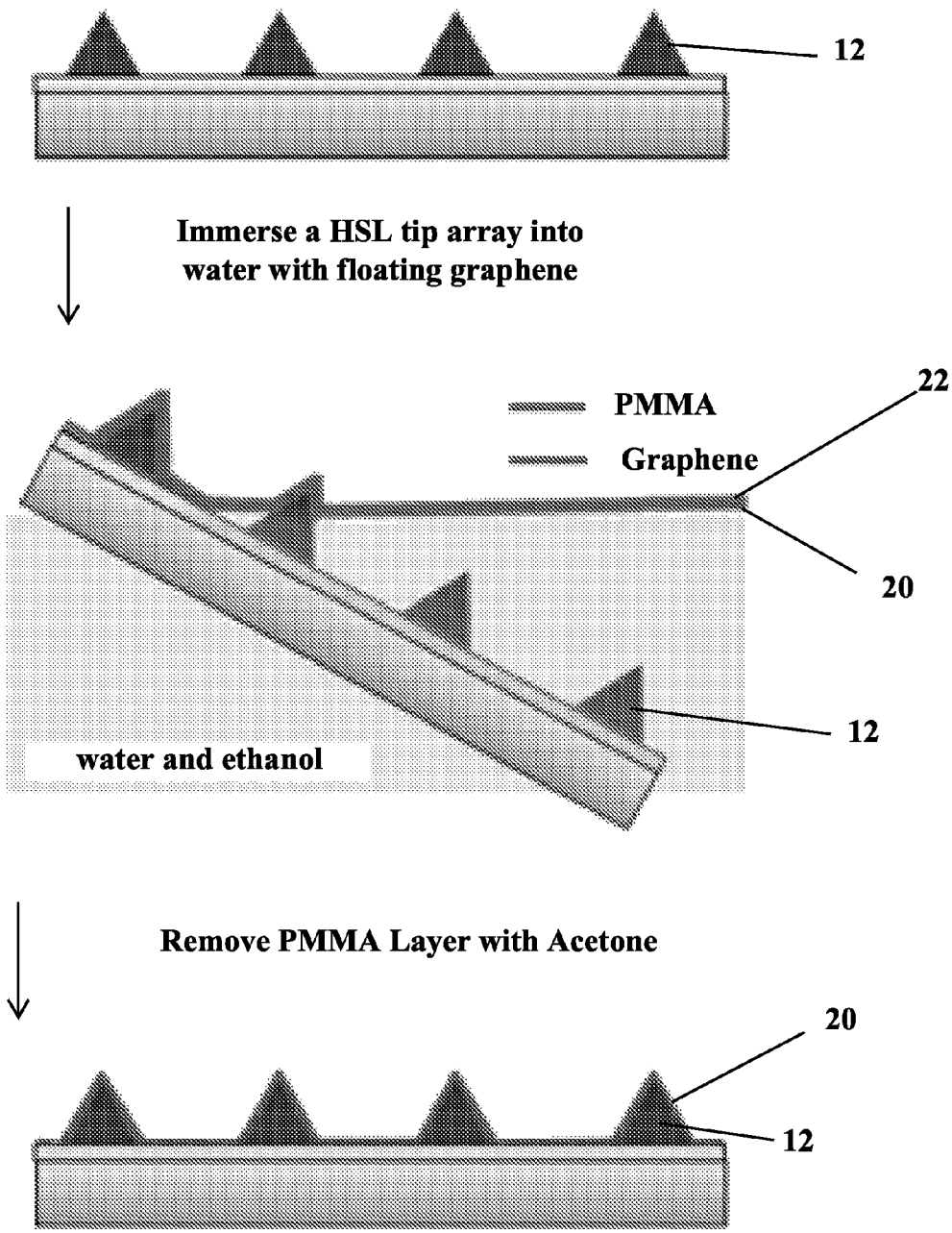
FIG. 25a is a schematic illustration of a method of coating a graphene film on a tip array.

Referring to FIG. 25a, in one embodiment of the disclosure, a micro probe having at least one tip is coated with a graphene film by immersing the at least one tip in a fluid in which a graphene film is floating on a surface thereof. The at least one tip can be immersed beneath the floating graphene film and then the graphene film can be brought into contact with the tip to thereby coat the tip. For example, the fluid can be evaporated to lower the graphene film into contact with the at least one tip. Alternatively, the at least one tip can be raised into contact with the graphene film. In various embodiments in which the micro probe includes a plurality of tips, all or a subset of tips can be immersed in the fluid to coat the immersed tips and immersed portions of the first side of the tip substrate layer with the graphene.

Optionally, prior to coating the tips can be cleaned or pre-treated. In one embodiment, the tips are oxygen plasma treated.

The fluid can comprise water and a surfactant to lower the surface tension of water. It has been advantageously found that a tenting phenomenon in which the graphene film tents over and does not conform to the at least one tip can be avoided when the surface tension of the fluid (such as water) is reduced. When coating in water having no surfactant a significant tenting phenomenon is observed, such that the graphene layer covers across the tip ends and does not conform to the tips. By comparison, when a surfactant is added to the fluid to reduce the surface tension of the fluid, the tenting phenomenon is eliminated. Any suitable surfactant that is compatible and non-destructive to graphene and the tip material, and optionally a backing support layer (e.g. polymethylmethacrylate (PMMA)), can be provided with the fluid for floating graphene film. In one embodiment for use with water, the surfactant is ethanol.

Figure 25B:
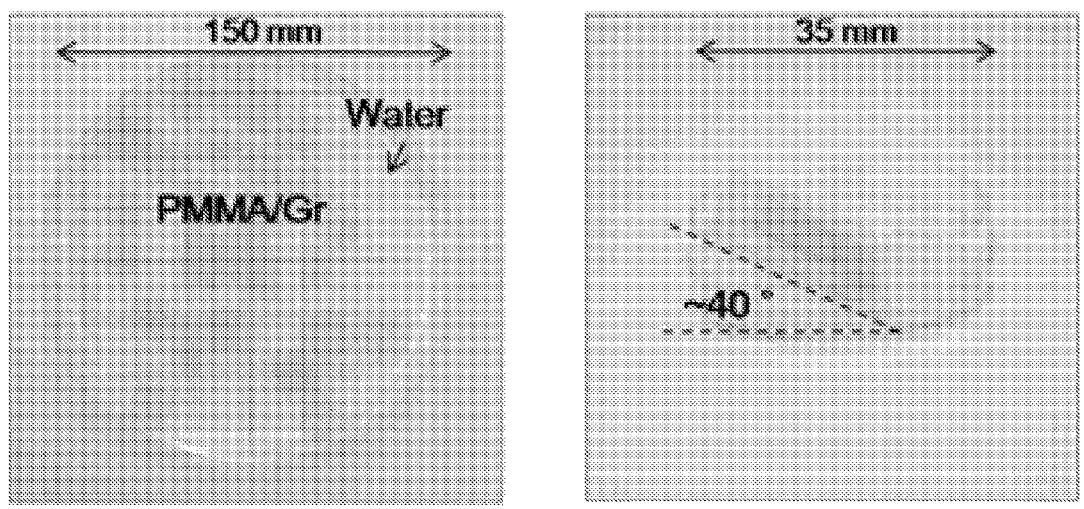
FIG. 25b is photographs of the method of FIG. 25a, illustrating (left photograph) PMMA/graphene film floating on water before coating, and (right photograph) submersion of the tip array in the fluid at an angle to coat the tips with the PMMA/graphene film.
Figure 25C:
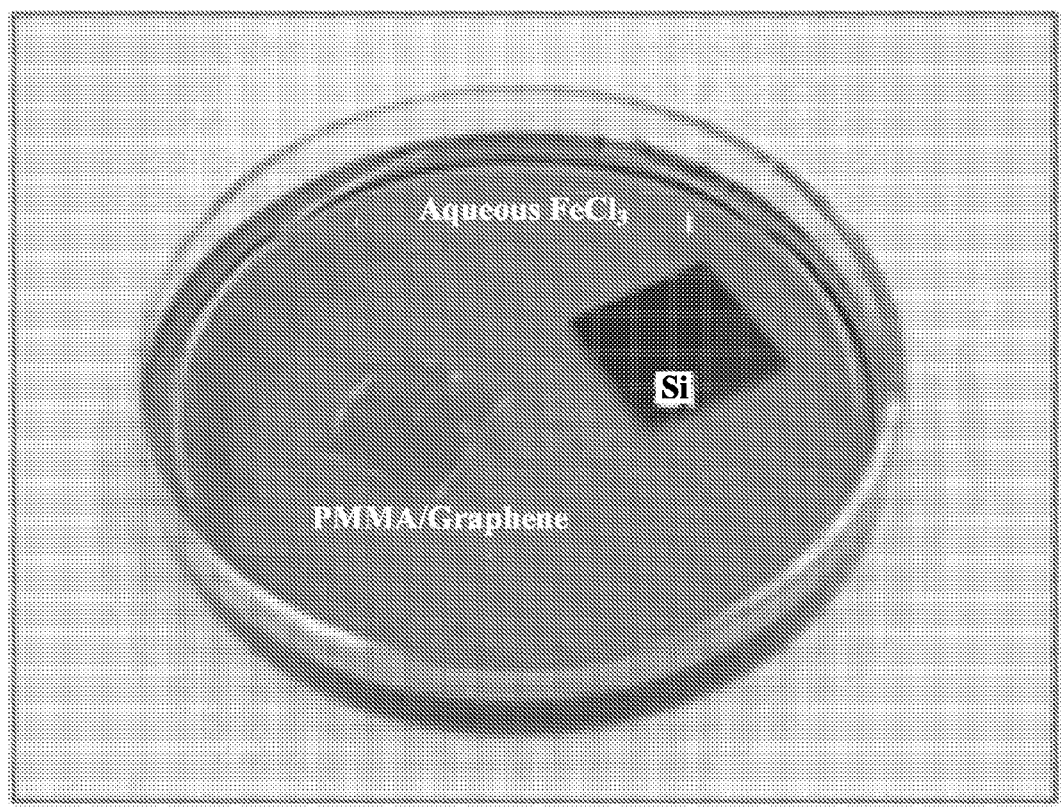
FIG. 25c is a photograph of PMMA/graphene separated from the Ni substrate by removing the Ni layer in an aqueous 1 M $FeCl_3$ solution.

When immersed in the fluid, the tip or tip array can be angled relative to the surface of the fluid (and, thus, the floating graphene film), as measured from a plane parallel to the base of the tip. It has advantageously been determined that tilting the tip or tip array improves conformance of the graphene film to the tip or tip array. Referring to FIGS. 25a and 25b, tilting was advantageously found to maximize the coating coverage. Furthermore, in embodiments in which a tip array having a plurality of tips is coated, tilting of the tip array can allow for row by row coating of the tips with the graphene film as the graphene film is brought into contact with the tip array. The angling of the tip array also guides the graphene film across the tip array as the successive rows are coated. The degree of tiling can be dependent upon by the tip-to-tip distances, tip bottom diameter, and the tip height (also referred to herein as tip thickness), and suitable degrees can be determined through routine experimentation. For example, the tip or tip array can be tilted at least about 10° from the base of the tip, at least about 18°, at least about 20°, at least about 30°, or at least about 40° relative to the surface of the fluid. The angle optionally can be in a range of about 10° to about 80°, about 20° to about 70°, about 15° to about 60°, about 30° to about 60°, about 40° to about 80°, about 20° to about 40°, about 10° to about 30°, about 15° to about 45°, or about 25° to about 35°. Other suitable tilting angles include, about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 52, 54, 56, 58, 60, 62, 64, 66, 68, 70, 72, 74, 76, 78, or 80°.

The graphene film can include one or more layers of graphene as noted above. As used herein "graphene" refers to graphene as well as chemically- and electrochemically-modified graphene (e.g. covalent or non-covalent modifications). The graphene film can further include a support or backing layer when provided in the fluid. For example, the support layer can be PMMA. In embodiments in which the graphene film is provided with a support layer, the support layer can be washed away after the graphene film is coated on the at least one tip. For example, when PMMA is used a support layer, acetone can be used to remove the PMMA layer after the tip is coated.

The graphene film provided in the fluid optionally can be larger in size than the tip or tip array to be coated. The portion of the graphene sheet extending beyond the tip or the tip array in such an arrangement can be coated on a glass slide or cantilever supporting the tip or tip array. Such excess coating can advantageously be used as electrical contact points to electrically connect the graphene film and thereby the tip or tip array to a voltage source. This, in turn, can allow for a simple means of providing electro- or thermal-patterning functionality to the tips.

As proof of concept, hard tip soft spring lithography tip arrays were conformally coated with a multilayer film of graphene 20. In a typical experiment, 1×1 cm2 HSL tip arrays with 4,490 tips and a tip-to-tip pitch of 150 μm were fabricated as described in paragraph 128 above. Large-area graphene films grown by chemical vapor deposition (CVD) on Ni films (Graphene Laboratories Inc.) were used, and a thin poly(methylmethacrylate) (PMMA) 22 (~70 nm) layer was spin coated on the graphene, acting as a supporting layer for the graphene upon the separation of the graphene from the Ni film. The PMMA/graphene was separated from the Ni film by etching away the Ni with a 1M FeCl3 solution, and the PMMA/graphene was washed in DI water.

Following etching of the Ni film, the separated PMMA/graphene film was transferred onto a HSL tip array (1×1 cm2) having silicon tips that had been pre-treated with oxygen plasma. The transfer took place while the PMMA/graphene layer was floating on a mixture of water and ethanol (1:2 V/V). The HSL tip array was submerged in the liquid and held at an angle of ~40° with respect to the surface. The solvent was then allowed to evaporate, which caused the PMMA/graphene to fall onto the tip array and coat it conformally.

Tilting the array during the solvent evaporation process significantly improved the coverage of graphene onto the tip array (FIG. 25b), while utilizing a mixture of the water and ethanol reduced the surface tension and improved the conformal coating (FIG. 13B). Subsequent washing with acetone was used to remove the PMMA. The graphene-coated, glass-supported tip arrays remained transparent, which allowed for optical leveling of the tips with respect to a surface.

Low flexural rigidity also leads to surface wrinkles when a layer experiences small compressive strain during the coating of a flat surface. On further compression that can arise from coating an uneven surface, the wrinkles become unstable and new morphologies emerge, namely folds. Folds are observed between tips. This repetitive fold formation between the tips finally generates a network of folds that completely connect tip to tip, thus indicating complete coverage of even PMMA/graphene. Once the PMMA layer is removed, the flexural rigidity decreases and the graphene experiences more mechanical sagging to the surface. Indeed, as the network of folds formed by PMMA/graphene can be clearly seen, the graphene fold network can only be imaged by AFM and is not clearly observable under an optical microscope. This excellent flexibility of graphene, which allows it to conform to the surface, leads to ultra-strong adhesion to the tip surface, owing to the graphene's interaction with the surface being more liquid-like than solid-like. Furthermore, the folds make the graphene layers more stable and resistant to mechanical stretching by making the layers more expandable, thus more coherently coupling the graphene to the tips during writing.

Beam Pent Lithography Patterning

In accordance with embodiments of the disclosure, projected lithography can be used in connection with a beam pen tip array. Referring again to FIG. 19, beam pen lithography generally includes bringing a transparent polymer tip array in contact with a photosensitive layer, for example, for example SHIPLEY1805 (MicroChem Inc.) photoresist material, followed by exposure (e.g. irradiation) of the top surface (the substrate layer) of the tip array 10 with a radiation source. The projected lithography system controls the exposure as described above. As a result of the blocking layer 16 blocking the radiation (e.g., by reflection), the radiation is transmitted through the transparent polymer and out the portion of the transparent polymer exposed by the aperture 18 (i.e., the tip end). Historically, photolithography has used ultraviolet light from gas-discharge lamps using mercury, sometimes in combination with noble gases such as xenon. These lamps produce light across a broad spectrum with several strong peaks in the ultraviolet range. This spectrum is filtered to select a single spectral line, for example the "g-line" (436 nm) or "i-line" (365 nm). More recently, lithography has moved to "deep ultraviolet," for example wavelengths below 300 nm, which can be produced by excimer lasers. Krypton fluoride produces a 248-nm spectral line, and argon fluoride a 193-nm line. The type of radiation used with the present apparatus and methods is not limited. One practical consideration is compatibility with the tip array materials. Radiation in the wavelength range of about 300 nm to about 600 nm is preferred, optionally 380 nm to 420 nm, for example about 365 nm, about 400 nm, or about 436 nm. For example, the radiation optionally can have a minimum wavelength of about 300, 350, 400, 450, 500, 550, or 600 nm. For example, the radiation optionally can have a maximum wavelength of about 300, 350, 400, 450, 500, 550, or 600 nm.

The photosensitive layer 20 can be exposed by the radiation transmitted through the polymer tip for any suitable time, for example in a range of about 1 second to about 1 minute. For example, the minimum exposure time can be about 1, 2, 3, 4, 5, 6, 7, 8, 9, 10, 20, 30, 40, 50, or 60 seconds. For example, the maximum exposure time can be about 1, 2, 3, 4, 5, 6, 7, 8, 9, 10, 20, 30, 40, 50, or 60 seconds.

The tip array 10 and/or the substrate can be moved during patterning to form the desired indicia. For example, in one embodiment, the tip array 10 is moved while the substrate is held stationary. In another embodiment, the tip array 10 is held stationary while the substrate is moved. In yet another embodiment, both the tip array 10 and the substrate are moved.

The method can further include developing the photosensitive layer 20, for example by any suitable process known in the art. For example, when a resist layer is used, the exposed resist layer can be developed for by exposed for about 30 seconds in MF319 (Rohm & Haas Electronic Materials LLC). The resist layer can be a positive resist or a negative resist. If a positive resist layer is used, developing of the resist layer 20 removes the exposed portion of the resist layer. If a negative resist layer is used, developing of the resist layer removes the unexposed portion of the resist layer.

Optionally, the method can further include depositing a patterning layer on the substrate surface after exposure followed by lift off of the resist layer to thereby form the patterning layer into the indicia printed on the resist layer by BPL. The patterning layer can be a metal, for example, and can be deposited, for example, by thermal evaporation. The resist lift off can be performed using, for example, acetone. For example, the patterns formed by pBPL can be developed for one minute in MF24A (MicroChem Inc., USA). The patterning layer can then be evaporated onto the sample. For example, the patterning layer can be 5 nm of Cr and 15 nm of Au. With such patterning compositions, an overnight lift-off procedure can be performed, for example, in Remover PG (MicroChem Inc., USA) to form the final patterns.

Another factor contributing to BPL resolution is the tip aperture 18 size, which controls the area of the resist which is exposed to light from the tip. Referring to FIG. 4A, with a near UV light or halogen light source and conventional photolithography conditions, dot sizes close to and below the light diffraction limit, of about 200 nm. Without intending to be bound by any particular theory, it is believed that this small feature size may be attributed to near-field effects at the point-of-contact between the tip and surface. Even though the aperture 18 used to create a small, for example 200 nm dots can be 500 nm, the contact area is much smaller, acting like a light pipe. Further optimization of the photolithography conditions can include, for example, using deep-UV illumination, thinner resist layers, and high resolution resist materials, which may improve BPL resolution down to the sub-100 nm range.

The features that can be patterned range from sub-100 nm to 1 mm in size or greater, and can be controlled by altering the exposure time and/or the contacting pressure of the tip array 10.

The BPL tip arrays can exhibit pressure dependence which results from the compressible nature of the polymer used to form the tip array 10. Indeed, the microscopic, preferably pyramidal, tips 14 can be made to deform with successively increasing amounts of applied pressure, which can be controlled by simply extending the piezo in the vertical direction (z-piezo). The controlled deformation of the tip array 10 can be used as an adjustable variable, allowing one to control tip-substrate contact area and resulting feature size. The pressure of the contact can be controlled by the z-piezo of a piezo scanner. The more pressure (or force) exerted on the tip array 10, the larger the feature size. Thus, any combination of contacting time and contacting force/pressure can provide a means for the formation of a feature size from about 30 nm to about 1 mm or greater. Within the pressure range allowed by z-piezo extension of about 5 to about 25 µm, one can observe a near linear relationship between piezo extension and feature size at a fixed contact time of 1 s. The substrate layer of the tip arrays can deform before deformation of the tips 14 occurs, which can offer a buffering provides extra tolerance in bringing all of the tips 14 in contact with the surface without tip deformation and significantly changing the intended feature size. The contacting pressure of the tip array 10 can be about 10 MPa to about 300 MPa.

At very low contact pressures, such as pressures of about 0.01 to about 0.1 g/cm2 for the preferred materials described herein, the feature size of the resulting indicia is independent of the contacting pressure, which allows for one to level the tip array 10 on the substrate surface without changing the feature size of the indicia. Such low pressures are achievable by 0.5 µm or less extensions of the z-piezo of a piezo scanner to which a tip array 10 is mounted, and pressures of about 0.01 g/cm2 to about 0.1 g/cm2 can be applied by z-piezo extensions of less than 0.5 µm. This "buffering" pressure range allows one to manipulate the tip array 10, substrate, or both to make initial contact between tips 14 and substrate surface without compressing the tips 14, and then using the degree of compression of tips 14 (observed by changes in reflection of light off the inside surfaces of the tips 14) to achieve a uniform degree of contact between tips 14 and substrate surface. This leveling ability is important, as non-uniform contact of the tips 14 of the tip array 10 can lead to non-uniform indicia. Given the large number of tips 14 of the tip array 10 (e.g., 11 million in an example provided herein) and their small size, as a practical matter it may be difficult or impossible to know definitively if all of the tips 14 are in contact with the surface. For example, a defect in a tip or the substrate surface, or an irregularity in a substrate surface, may result in a single tip not making contact while all other tips 14 are in uniform contact. Thus, the disclosed methods provide for at least substantially all of the tips 14 to be in contact with the substrate surface (e.g., to the extent detectable). For example, at least 90%, at least 95%, at least 96%, at least 97%, at least 98%, or at least 99% of the tips 14 will be in contact with the substrate surface.

The leveling of the tip array 10 and substrate surface with respect to one another can be assisted by the transparent, or at least translucent nature of the tip array 10 and tip substrate layer 12, which allow for detection of a change in reflection of light that is directed from the top of the tip array 10 (i.e., behind the base of the tips 14 and common substrate) through to the substrate surface. The intensity of light reflected from the tips 14 of the tip array 10 increases upon contact with the substrate surface (e.g., the internal surfaces of the tip array 10 reflect light differently upon contact). By observing the change in reflection of light at each tip, the tip array 10 and/or the substrate surface can be adjusted to effect contact of substantially all or all of the tips 14 of the tip array 10 to the substrate surface. Thus, the tip array 10 and common substrate preferably are translucent or transparent to allow for observing the change in light reflection of the tips 14 upon contact with the substrate surface. Likewise, any rigid backing material to which the tip array 10 is mounted is also preferably at least transparent or translucent.

The contacting time for the tips 14 can be from about 0.001 seconds to about 60 seconds. For example, the minimum contact time can be about 0.001, 0.01, 0.1, 1, 10, 20, 30, 40, 50, or 60 seconds. For example, the maximum contact time can be about 0.001, 0.01, 0.1, 1, 10, 20, 30, 40, 50, or 60 seconds. The contacting force can be controlled by altering the z-piezo of the piezo scanner or by other means that allow for controlled application of force across the tip array 10.

The substrate surface can be contacted with a tip array 10 a plurality of times, wherein the tip array 10, the substrate surface or both move to allow for different portions of the substrate surface to be contacted. The time and pressure of each contacting step can be the same or different, depending upon the desired pattern. The shape of the indicia or patterns has no practical limitation, and can include dots, lines (e.g., straight or curved, formed from individual dots or continuously), a preselected pattern, or any combination thereof.

The indicia resulting from the disclosed methods have a high degree of sameness, and thus are uniform or substantially uniform in size, and preferably also in shape. The individual indicia feature size (e.g., a dot or line width) is highly uniform, for example within a tolerance of about 5%, or about 1%, or about 0.5%. The tolerance can be about 0.9%, about 0.8%, about 0.7%, about 0.6%, about 0.4%, about 0.3%, about 0.2%, or about 0.1%. Non-uniformity of feature size and/or shape can lead to roughness of indicia that can be undesirable for sub-micron type patterning.

The feature size can be about 10 nm to about 1 mm, about 10 nm to about 500 µm, about 10 nm to about 100 µm, about 50 nm to about 100 µm, about 50 nm to about 50 µm, about 50 nm to about 10 µm, about 50 nm to about 5 µm, or about 50 nm to about 1 µm. Features sizes can be less than 1 µm, less than about 900 nm, less than about 800 nm, less than about 700 nm, less than about 600 nm, less than about 500 nm, less than about 400 nm, less than about 300 nm, less than about 200 nm, less than about 100 nm, or less than about 90 nm.

Patterning Compositions

For ink-based patterning, patterning compositions suitable for use in the disclosed methods include both homogeneous and heterogeneous compositions, the latter referring to a composition having more than one component, for example combinations of any one or more of the components described herein. The patterning composition is coated on the tip array. The term "coating," as used herein when referring to the patterning composition, refers both to coating of the tip array as well adsorption and absorption by the tip array of the patterning composition. Upon coating of the tip array with the patterning composition, the patterning composition can be patterned on a substrate surface using the tip array.

Patterning compositions can be liquids, solids, semi-solids, and the like. Patterning compositions suitable for use include, but are not limited to, molecular solutions, polymer solutions, pastes, gels, creams, glues, resins, epoxies, adhesives, metal films, particulates, solders, etchants, and combinations thereof.

Patterning compositions can include materials such as, but not limited to, monolayer-forming species, thin film-forming species, oils, colloids, metals, metal complexes, metal oxides, ceramics, organic species (e.g., moieties comprising a carbon-carbon bond, such as small molecules, polymers, polymer precursors, proteins, antibodies, and the like), polymers (e.g., both non-biological polymers and biological polymers such as single and double stranded DNA, RNA, and the like), polymer precursors, dendrimers, nanoparticles, and combinations thereof. In some embodiments, one or more components of a patterning composition includes a functional group suitable for associating with a substrate, for example, by forming a chemical bond, by an ionic interaction, by a Van der Waals interaction, by an electrostatic interaction, by magnetism, by adhesion, and combinations thereof.

The composition can be formulated to control its viscosity, via routine methods without undue experimentation. Parameters that can control ink viscosity include, but are not limited to, solvent composition, solvent concentration, thickener composition, thickener concentration, particles size of a component, the molecular weight of a polymeric component, the degree of cross-linking of a polymeric component, the free volume (i.e., porosity) of a component, the swellability of a component, ionic interactions between ink components (e.g., solvent-thickener interactions), and combinations thereof.

In some embodiments, the patterning composition comprises an additive, such as a solvent, a thickening agent, an ionic species (e.g., a cation, an anion, a zwitterion, etc.), a carrier matrix (e.g., polyethylene glycol or agarose), the concentration of which can be selected to adjust one or more of the viscosity, the dielectric constant, the conductivity, the tonicity, the density, and the like.

Suitable thickening agents include, but are not limited to, metal salts of carboxyalkylcellulose derivatives (e.g., sodium carboxymethylcellulose), alkylcellulose derivatives (e.g., methylcellulose and ethylcellulose), partially oxidized alkylcellulose derivatives (e.g., hydroxyethylcellulose, hydroxypropylcellulose and hydroxypropylmethylcellulose), starches, polyacrylamide gels, homopolymers of poly-N-vinylpyrrolidone, poly(alkyl ethers) (e.g., polyethylene oxide, polyethylene glycol, and polypropylene oxide), agar, agarose, xanthan gums, gelatin, dendrimers, colloidal silicon dioxide, lipids (e.g., fats, oils, steroids, waxes, glycerides of fatty acids, such as oleic, linoleic, linolenic, and arachidonic acid, and lipid bilayers such as from phosphocholine) and combinations thereof. In some embodiments, a thickener is present in a concentration of about 0.5% to about 25%, about 1% to about 20%, or about 5% to about 15% by weight of a patterning composition.

Suitable solvents for a patterning composition include, but are not limited to, water, C1-C8 alcohols (e.g., methanol, ethanol, propanol and butanol), C6-C12 straight chain, branched and cyclic hydrocarbons (e.g., hexane and cyclohexane), C6-C14 aryl and aralkyl hydrocarbons (e.g., benzene and toluene), C3-C10 alkyl ketones (e.g., acetone), C3-C10 esters (e.g., ethyl acetate), C4-C10 alkyl ethers, and combinations thereof. In some embodiments, a solvent is present in a concentration of about 1% to about 99%, about 5% to about 95%, about 10% to about 90%, about 15% to about 95%, about 25% to about 95%, about 50% to about 95%, or about 75% to about 95% by weight of a patterning composition.

Patterning compositions can comprise an etchant. As used herein, an "etchant" refers to a component that can react with a surface to remove a portion of the surface. Thus, an etchant is used to form a subtractive feature by reacting with a surface and forming at least one of a volatile and/or soluble material that can be removed from the substrate, or a residue, particulate, or fragment that can be removed from the substrate by, for example, a rinsing or cleaning method. In some embodiments, an etchant is present in a concentration of about 0.5% to about 95%, about 1% to about 90%, about 2% to about 85%, about 0.5% to about 10%, or about 1% to about 10% by weight of the patterning composition.

Etchants suitable for use in the methods disclosed herein include, but are not limited to, an acidic etchant, a basic etchant, a fluoride-based etchant, and combinations thereof. Acidic etchants suitable for use with the present invention include, but are not limited to, sulfuric acid, trifluoromethanesulfonic acid, fluorosulfonic acid, trifluoroacetic acid, hydrofluoric acid, hydrochloric acid, carborane acid, and combinations thereof. Basic etchants suitable for use with the present invention include, but are not limited to, sodium hydroxide, potassium hydroxide, ammonium hydroxide, tetraalkylammonium hydroxide ammonia, ethanolamine, ethylenediamine, and combinations thereof. Fluoride-based etchants suitable for use with the present invention include, but are not limited to, ammonium fluoride, lithium fluoride, sodium fluoride, potassium fluoride, rubidium fluoride, cesium fluoride, francium fluoride, antimony fluoride, calcium fluoride, ammonium tetrafluoroborate, potassium tetrafluoroborate, and combinations thereof.

The patterning composition can include a reactive component. As used herein, a "reactive component" refers to a compound or species that has a chemical interaction with a substrate. In some embodiments, a reactive component in the ink penetrates or diffuses into the substrate. In some embodiments, a reactive component transforms, binds, or promotes binding to exposed functional groups on the surface of the substrate. Reactive components can include, but are not limited to, ions, free radicals, metals, acids, bases, metal salts, organic reagents, and combinations thereof. Reactive components further include, without limitation, monolayer-forming species such as thiols, hydroxides, amines, silanols, siloxanes, and the like, and other monolayer-forming species known to a person or ordinary skill in the art. The reactive component can be present in a concentration of about 0.001% to about 100%, about 0.001% to about 50%, about 0.001% to about 25%, about 0.001% to about 10%, about 0.001% to about 5%, about 0.001% to about 2%, about 0.001% to about 1%, about 0.001% to about 0.5%, about 0.001% to about 0.05%, about 0.01% to about 10%, about 0.01% to about 5%, about 0.01% to about 2%, about 0.01% to about 1%, about 10% to about 100%, about 50% to about 99%, about 70% to about 95%, about 80% to about 99%, about 0.001%, about 0.005%, about 0.01%, about 0.1%, about 0.5%, about 1%, about 2%, or about 5% weight of the patterning composition.

The patterning composition can comprise a conductive and/or semi-conductive component. As used herein, a "conductive component" refers to a compound or species that can transfer or move electrical charge. Conductive and semi-conductive components include, but are not limited to, a metal, a nanoparticle, a polymer, a cream solder, a resin, and combinations thereof. In some embodiments, a conductive component is present in a concentration of about 1% to about 100%, about 1% to about 10%, about 5% to about 100%, about 25% to about 100%, about 50% to about 100%, about 75% to about 99%, about 2%, about 5%, about 90%, about 95% by weight of the patterning composition.

Metals suitable for use in a patterning composition include, but are not limited to, a transition metal, aluminum, silicon, phosphorous, gallium, germanium, indium, tin, antimony, lead, bismuth, alloys thereof, and combinations thereof.

The patterning composition can comprise a semi-conductive polymer. Semi-conductive polymers suitable for use with the present invention include, but are not limited to, a polyaniline, a poly(3,4-ethylenedioxythiophene)-poly(styrenesulfonate), a polypyrrole, an arylene vinylene polymer, a polyphenylenevinylene, a polyacetylene, a polythiophene, a polyimidazole, and combinations thereof.

The patterning composition can include an insulating component. As used herein, an "insulating component" refers to a compound or species that is resistant to the movement or transfer of electrical charge. In some embodiments, an insulating component has a dielectric constant of about 1.5 to about 8 about 1.7 to about 5, about 1.8 to about 4, about 1.9 to about 3, about 2 to about 2.7, about 2.1 to about 2.5, about 8 to about 90, about 15 to about 85, about 20 to about 80, about 25 to about 75, or about 30 to about 70. Insulating components suitable for use in the methods disclosed herein include, but are not limited to, a polymer, a metal oxide, a metal carbide, a metal nitride, monomeric precursors thereof, particles thereof, and combinations thereof. Suitable polymers include, but are not limited to, a polydimethylsiloxane, a silsesquioxane, a polyethylene, a polypropylene, a polyimide, and combinations thereof. In some embodiments, for example, an insulating component is present in a concentration of about 1% to about 95%, about 1% to about 80%, about 1% to about 50%, about 1% to about 20%, about 1% to about 10%, about 20% to about 95%, about 20% to about 90%, about 40% to about 80%, about 1%, about 5%, about 10%, about 90%, or about 95% by weight of the patterning composition.

The patterning composition can include a masking component. As used herein, a "masking component" refers to a compound or species that upon reacting forms a surface feature resistant to a species capable of reacting with the surrounding surface. Masking components suitable for use with the present invention include materials commonly employed in traditional photolithography methods as "resists" (e.g., photoresists, chemical resists, self-assembled monolayers, etc.). Masking components suitable for use in the disclosed methods include, but are not limited to, a polymer such as a polyvinylpyrollidone, poly(epichlorohydrin-co-ethyleneoxide), a polystyrene, a poly(styrene-co-butadiene), a poly(4-vinylpyridine-co-styrene), an amine terminated poly(styrene-co-butadiene), a poly(acrylonitrile-co-butadiene), a styrene-butadiene-styrene block copolymer, a styrene-ethylene-butylene block linear copolymer, a polystyrene-block-poly(ethylene-ran-butylene)-block-polystyrene, a poly(styrene-co-maleic anhydride), a polystyrene-block-poly(ethylene-ran-butylene)-block-polystyrene-graft-maleic anhydride, a polystyrene-block-polyisoprene-block-polystyrene, a polystyrene-block-poly(ethylene-ran-butylene)-block-polystyrene, a polynorbornene, a dicarboxy terminated poly(acrylonitrile-co-butadiene-co-acrylic acid), a dicarboxy terminated poly(acrylonitrile-co-butadiene), a polyethyleneimine, a poly(carbonate urethane), a poly(acrylonitrile-co-butadiene-co-styrene), a poly(vinylchloride), a poly(acrylic acid), a poly(methylmethacrylate), a poly(methyl methacrylate-co-methacrylic acid), a polyisoprene, a poly(1,4-butylene terephthalate), a polypropylene, a poly(vinyl alcohol), a poly(1,4-phenylene sulfide), a polylimonene, a poly(vinylalcohol-co-ethylene), a poly[N,N'-(1,3-phenylene)isophthalamide], a poly(1,4-phenylene ether-ether-sulfone), a poly(ethyleneoxide), a poly[butylene terephthalate-co-poly(alkylene glycol) terephthalate], a poly(ethylene glycol) diacrylate, a poly(4-vinylpyridine), a poly(DL-lactide), a poly(3,3',4,4'-benzophenonetetracarboxylic dianhydride-co-4,4'-oxydianiline/1,3-phenylenediamine), an agarose, a polyvinylidene fluoride homopolymer, a styrene butadiene copolymer, a phenolic resin, a ketone resin, a 4,5-difluoro-2,2-bis(trifluoromethyl)-1,3-dioxane, a salt thereof, and combinations thereof. In some embodiments, a masking component is present in a concentration of about 1% to about 10%, about 1% to about 5%, or about 2% by weight of the patterning composition.

The patterning composition can include a conductive component and a reactive component. For example, a reactive component can promote at least one of: penetration of a conductive component into a surface, reaction between the conductive component and a surface, adhesion between a conductive feature and a surface, promoting electrical contact between a conductive feature and a surface, and combinations thereof. Surface features formed by reacting this patterning composition include conductive features selected from the group consisting of: additive non-penetrating, additive penetrating, subtractive penetrating, and conformal penetrating surface features.

The patterning composition can comprise an etchant and a conductive component, for example, suitable for producing a subtractive surface feature having a conductive feature inset therein.

The patterning composition can comprise an insulating component and a reactive component. For example, a reactive component can promote at least one of: penetration of an insulating component into a surface, reaction between the insulating component and a surface, adhesion between an insulating feature and a surface, promoting electrical contact between an insulating feature and a surface, and combinations thereof. Surface features formed by reacting this patterning composition include insulating features selected from the group consisting of: additive non-penetrating, additive penetrating, subtractive penetrating, and conformal penetrating surface features.

The patterning composition can comprise an etchant and an insulating component, for example, suitable for producing a subtractive surface feature having an insulating feature inset therein.

The patterning composition can comprise a conductive component and a masking component, for example, suitable for producing electrically conductive masking features on a surface.

Other contemplated components of a patterning composition suitable for use with the disclosed methods include thiols, 1,9-nonanedithiol solution, silane, silazanes, alkynes cystamine, N-Fmoc protected amino thiols, biomolecules, DNA, proteins, antibodies, collagen, peptides, biotin, and carbon nanotubes.

For a description of patterning compounds and patterning compositions, and their preparation and use, see Xia and Whitesides, Angew. Chem. Int. Ed., 37, 550-575 (1998) and references cited therein; Bishop et al., Curr. Opinion Colloid & Interface Sci., 1, 127-136 (1996); Calvert, J. Vac. Sci. Technol. B, 11, 2155-2163 (1993); Ulman, Chem. Rev., 96:1533 (1996) (alkanethiols on gold); Dubois et al., Annu. Rev. Phys. Chem., 43:437 (1992) (alkanethiols on gold); Ulman, An Introduction to Ultrathin Organic Films: From Langmuir-Blodgett to Self-Assembly (Academic, Boston, 1991) (alkanethiols on gold); Whitesides, Proceedings of the Robert A. Welch Foundation 39th Conference On Chemical Research Nanophase Chemistry, Houston, Tex., pages 109-121 (1995) (alkanethiols attached to gold); Mucic et al. Chem. Commun. 555-557 (1996) (describes a method of attaching 3' thiol DNA to gold surfaces); U.S. Pat. No. 5,472,881 (binding of oligonucleotide-phosphorothiolates to gold surfaces); Burwell, Chemical Technology, 4, 370-377 (1974) and Matteucci and Caruthers, J. Am. Chem. Soc., 103, 3185-3191 (1981) (binding of oligonucleotides-alkylsiloxanes to silica and glass surfaces); Grabar et al., Anal. Chem., 67, 735-743 (binding of aminoalkylsiloxanes and for similar binding of mercaptoalkylsiloxanes); Nuzzo et al., J. Am. Chem. Soc., 109, 2358 (1987) (disulfides on gold); Allara and Nuzzo, Langmuir, 1, 45 (1985) (carboxylic acids on aluminum); Allara and Tompkins, J. Colloid Interfate Sci., 49, 410-421 (1974) (carboxylic acids on copper); Iler, The Chemistry Of Silica, Chapter 6, (Wiley 1979) (carboxylic acids on silica); Timmons and Zisman, J. Phys. Chem., 69, 984-990 (1965) (carboxylic acids on platinum); Soriaga and Hubbard, J. Am. Chem. Soc., 104, 3937 (1982) (aromatic ring compounds on platinum); Hubbard, Acc. Chem. Res., 13, 177 (1980) (sulfolanes, sulfoxides and other functionalized solvents on platinum); Hickman et al., J. Am. Chem. Soc., 111, 7271 (1989) (isonitriles on platinum); Maoz and Sagiv, Langmuir, 3, 1045 (1987) (silanes on silica); Maoz and Sagiv, Langmuir, 3, 1034 (1987) (silanes on silica); Wasserman et al., Langmuir, 5, 1074 (1989) (silanes on silica); Eltekova and Eltekov, Langmuir, 3,951 (1987) (aromatic carboxylic acids, aldehydes, alcohols and methoxy groups on titanium dioxide and silica); and Lec et al., J. Phys. Chem., 92, 2597 (1988) (rigid phosphates on metals); Lo et al., J. Am. Chem. Soc., 118, 11295-11296 (1996) (attachment of pyrroles to superconductors); Chen et al., J. Am. Chem. Soc., 117, 6374-5 (1995) (attachment of amines and thiols to superconductors); Chen et al., Langmuir, 12, 2622-2624 (1996) (attachment of thiols to superconductors); McDevitt et al., U.S. Pat. No. 5,846,909 (attachment of amines and thiols to superconductors); Xu et al., Langmuir, 14, 6505-6511 (1998) (attachment of amines to superconductors); Mirkin et al., Adv. Mater. (Weinheim, Ger.), 9, 167-173 (1997) (attachment of amines to superconductors); Hovis et al., J. Phys. Chem. B, 102, 6873-6879 (1998) (attachment of olefins and dienes to silicon); Hovis et al., Surf. Sci., 402-404, 1-7 (1998) (attachment of olefins and dienes to silicon); Hovis et al., J. Phys. Chem. B, 101, 9581-9585 (1997) (attachment of olefins and dienes to silicon); Hamers et al., J. Phys. Chem. B, 101, 1489-1492 (1997) (attachment of olefins and dienes to silicon); Hamers et al., U.S. Pat. No. 5,908,692 (attachment of olefins and dienes to silicon); Ellison et al., J. Phys. Chem. B, 103, 6243-6251 (1999) (attachment of isothiocyanates to silicon); Ellison et al., J. Phys. Chem. B, 102, 8510-8518 (1998) (attachment of azoalkanes to silicon); Ohno et al., Mol. Cryst. Liq. Cryst. Sci. Technol., Sect. A, 295, 487-490 (1997) (attachment of thiols to GaAs); Reuter et al., Mater. Res. Soc. Symp. Proc., 380, 119-24 (1995) (attachment of thiols to GaAs); Bain, Adv. Mater. (Weinheim, Fed. Repub. Ger.), 4, 591-4 (1992) (attachment of thiols to GaAs); Sheen et al., J. Am. Chem. Soc., 114, 1514-15 (1992) (attachment of thiols to GaAs); Nakagawa et al., Jpn. J. Appl. Phys., Part 1, 30, 3759-62 (1991) (attachment of thiols to GaAs); Lunt et al., J. Appl. Phys., 70, 7449-67 (1991) (attachment of thiols to GaAs); Lunt et al., J. Vac. Sci. Technol., B, 9, 2333-6 (1991) (attachment of thiols to GaAs); Yamamoto et al., Langmuir ACS ASAP, web release number Ia990467r (attachment of thiols to InP); Gu et al., J. Phys. Chem. B, 102, 9015-9028 (1998) (attachment of thiols to InP); Menzel et al., Adv. Mater. (Weinheim, Ger.), 11, 131-134 (1999) (attachment of disulfides to gold); Yonezawa et al., Chem. Mater., 11, 33-35 (1999) (attachment of disulfides to gold); Porter et al., Langmuir, 14, 7378-7386 (1998) (attachment of disulfides to gold); Son et al., J. Phys. Chem., 98, 8488-93 (1994) (attachment of nitriles to gold and silver); Steiner et al., Langmuir, 8, 2771-7 (1992) (attachment of nitriles to gold and copper); Solomun et al., J. Phys. Chem., 95, 10041-9 (1991) (attachment of nitriles to gold); Solomun et al., Ber. Bunsen-Ges. Phys. Chem., 95, 95-8 (1991) (attachment of nitriles to gold); Henderson et al., Inorg. Chim. Acta, 242, 115-24 (1996) (attachment of isonitriles to gold); Huc et al., J. Phys. Chem. B, 103, 10489-10495 (1999) (attachment of isonitriles to gold); Hickman et al., Langmuir, 8, 357-9 (1992) (attachment of isonitriles to platinum); Steiner et al., Langmuir, 8, 90-4 (1992) (attachment of amines and phospines to gold and attachment of amines to copper); Mayya et al., J. Phys. Chem. B, 101, 9790-9793 (1997) (attachment of amines to gold and silver); Chen et al., Langmuir, 15, 1075-1082 (1999) (attachment of carboxylates to gold); Tao, J. Am. Chem. Soc., 115, 4350-4358 (1993) (attachment of carboxylates to copper and silver); Laibinis et al., J. Am. Chem. Soc., 114, 1990-5 (1992) (attachment of thiols to silver and copper); Laibinis et al., Langmuir, 7, 3167-73 (1991) (attachment of thiols to silver); Fenter et al., Langmuir, 7, 2013-16 (1991) (attachment of thiols to silver); Chang et al., Am. Chem. Soc., 116, 6792-805 (1994) (attachment of thiols to silver); Li et al., J. Phys. Chem., 98, 11751-5 (1994) (attachment of thiols to silver); Li et al., Report, 24 pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., Langmuir, 7, 955-63 (1991) (attachment of thiols to silver); Walczak et al., J. Am. Chem. Soc., 113, 2370-8 (1991) (attachment of thiols to silver); Sangiorgi et al., Gazz. Chim. Ital., 111, 99-102 (1981) (attachment of amines to copper); Magallon et al., Book of Abstracts, 215th ACS National Meeting, Dallas, Mar. 29-Apr. 2, 1998, COLL-048 (attachment of amines to copper); Patil et al., Langmuir, 14, 2707-2711 (1998) (attachment of amines to silver); Sastry et al., J. Phys. Chem. B, 101, 4954-4958 (1997) (attachment of amines to silver); Bansal et al., J. Phys. Chem. B. 102, 4058-4060 (1998) (attachment of alkyl lithium to silicon); Bansal et al., J. Phys. Chem. B, 102, 1067-1070 (1998) (attachment of alkyl lithium to silicon); Chidsey, Book of Abstracts, 214th ACS National Meeting, Las Vegas, Nev., Sep. 7-11, 1997, I&EC-027 (attachment of alkyl lithium to silicon); Song, J. H., Thesis, University of California at San Diego (1998) (attachment of alkyl lithium to silicon dioxide); Meyer et al., J. Am. Chem. Soc., 110, 4914-18 (1988) (attachment of amines to semiconductors); Brazdil et al. J. Phys. Chem., 85, 1005-14 (1981) (attachment of amines to semiconductors); James et al., Langmuir, 14, 741-744 (1998) (attachment of proteins and peptides to glass); Bernard et al., Langmuir, 14, 2225-2229 (1998) (attachment of proteins to glass, polystyrene, gold, silver and silicon wafers); Pereira et al., J. Mater. Chem., 10, 259 (2000) (attachment of silazanes to SiO2); Pereira et al., J. Mater. Chem., 10, 259 (2000) (attachment of silazanes to SiO2); Dammel, Diazonaphthoquinone Based Resists (1st ed., SPIE Optical Engineering Press, Bellingham, Wash., 1993) (attachment of silazanes to SiO2); Anwander et al., J. Phys. Chem. B, 104, 3532 (2000) (attachment of silazanes to SiO2); Slavov et al., J. Phys. Chem., 104, 983 (2000) (attachment of silazanes to SiO2).

For a description of patterning compounds and patterning compositions, and their preparation and use, see Xia and Whitesides, Angew. Chem. Int. Ed., 37, 550-575 (1998) and references cited therein; Bishop et al., Curr. Opinion Colloid & Interface Sci., 1, 127-136 (1996); Calvert, J. Vac. Sci. Technol. B, 11, 2155-2163 (1993); Ulman, Chem. Rev., 96:1533 (1996) (alkanethiols on gold); Dubois et al., Annu. Rev. Phys. Chem., 43:437 (1992) (alkanethiols on gold); Ulman, An Introduction to Ultrathin Organic Films: From Langmuir-Blodgett to Self-Assembly (Academic, Boston, 1991) (alkanethiols on gold); Whitesides, Proceedings of the Robert A. Welch Foundation 39th Conference On Chemical Research Nanophase Chemistry, Houston, Tex., pages 109-121 (1995) (alkanethiols attached to gold); Mucic et al. Chem. Commun. 555-557 (1996) (describes a method of attaching 3' thiol DNA to gold surfaces); U.S. Pat. No. 5,472,881 (binding of oligonucleotide-phosphorothiolates to gold surfaces); Burwell, Chemical Technology, 4, 370-377 (1974) and Matteucci and Caruthers, J. Am. Chem. Soc., 103, 3185-3191 (1981) (binding of oligonucleotides-alkylsiloxanes to silica and glass surfaces); Grabar et al., Anal. Chem., 67, 735-743 (binding of aminoalkylsiloxanes and for similar binding of mercaptoalkylsiloxanes); Nuzzo et al., J. Am. Chem. Soc., 109, 2358 (1987) (disulfides on gold); Allara and Nuzzo, Langmuir, 1, 45 (1985) (carboxylic acids on aluminum); Allara and Tompkins, J. Colloid Interfate Sci., 49, 410-421 (1974) (carboxylic acids on copper); Iler, The Chemistry Of Silica, Chapter 6, (Wiley 1979) (carboxylic acids on silica); Timmons and Zisman, J. Phys. Chem., 69, 984-990 (1965) (carboxylic acids on platinum); Soriaga and Hubbard, J. Am. Chem. Soc., 104, 3937 (1982) (aromatic ring compounds on platinum); Hubbard, Acc. Chem. Res., 13, 177 (1980) (sulfolanes, sulfoxides and other functionalized solvents on platinum); Hickman et al., J. Am. Chem. Soc., 111, 7271 (1989) (isonitriles on platinum); Maoz and Sagiv, Langmuir, 3, 1045 (1987) (silanes on silica); Maoz and Sagiv, Langmuir, 3, 1034 (1987) (silanes on silica); Wasserman et al., Langmuir, 5, 1074 (1989) (silanes on silica); Eltekova and Eltekov, Langmuir, 3,951 (1987) (aromatic carboxylic acids, aldehydes, alcohols and methoxy groups on titanium dioxide and silica); and Lec et al., J. Phys. Chem., 92, 2597 (1988) (rigid phosphates on metals); Lo et al., J. Am. Chem. Soc., 118, 11295-11296 (1996) (attachment of pyrroles to superconductors); Chen et al., J. Am. Chem. Soc., 117, 6374-5 (1995) (attachment of amines and thiols to superconductors); Chen et al., Langmuir, 12, 2622-2624 (1996) (attachment of thiols to superconductors); McDevitt et al., U.S. Pat. No. 5,846,909 (attachment of amines and thiols to superconductors); Xu et al., Langmuir, 14, 6505-6511 (1998) (attachment of amines to superconductors); Mirkin et al., Adv. Mater. (Weinheim, Ger.), 9, 167-173 (1997) (attachment of amines to superconductors); Hovis et al., J. Phys. Chem. B, 102, 6873-6879 (1998) (attachment of olefins and dienes to silicon); Hovis et al., Surf. Sci., 402-404, 1-7 (1998) (attachment of olefins and dienes to silicon); Hovis et al., J. Phys. Chem. B, 101, 9581-9585 (1997) (attachment of olefins and dienes to silicon); Hamers et al., J. Phys. Chem. B, 101, 1489-1492 (1997) (attachment of olefins and dienes to silicon); Hamers et al., U.S. Pat. No. 5,908,692 (attachment of olefins and dienes to silicon); Ellison et al., J. Phys. Chem. B, 103, 6243-6251 (1999) (attachment of isothiocyanates to silicon); Ellison et al., J. Phys. Chem. B, 102, 8510-8518 (1998) (attachment of azoalkanes to silicon); Ohno et al., Mol. Cryst. Liq. Cryst. Sci. Technol., Sect. A, 295, 487-490 (1997) (attachment of thiols to GaAs); Reuter et al., Mater. Res. Soc. Symp. Proc., 380, 119-24 (1995) (attachment of thiols to GaAs); Bain, Adv. Mater. (Weinheim, Fed. Repub. Ger.), 4, 591-4 (1992) (attachment of thiols to GaAs); Sheen et al., J. Am. Chem. Soc., 114, 1514-15 (1992) (attachment of thiols to GaAs); Nakagawa et al., Jpn. J. Appl. Phys., Part 1, 30, 3759-62 (1991) (attachment of thiols to GaAs); Lunt et al., J. Appl. Phys., 70, 7449-67 (1991) (attachment of thiols to GaAs); Lunt et al., J. Vac. Sci. Technol., B, 9, 2333-6 (1991) (attachment of thiols to GaAs); Yamamoto et al., Langmuir ACS ASAP, web release number Ia990467r (attachment of thiols to InP); Gu et al., J. Phys. Chem. B, 102, 9015-9028 (1998) (attachment of thiols to InP); Menzel et al., Adv. Mater. (Weinheim, Ger.), 11, 131-134 (1999) (attachment of disulfides to gold); Yonezawa et al., Chem. Mater., 11, 33-35 (1999) (attachment of disulfides to gold); Porter et al., Langmuir, 14, 7378-7386 (1998) (attachment of disulfides to gold); Son et al., J. Phys. Chem., 98, 8488-93 (1994) (attachment of nitriles to gold and silver); Steiner et al., Langmuir, 8, 2771-7 (1992) (attachment of nitriles to gold and copper); Solomun et al., J. Phys. Chem., 95, 10041-9 (1991) (attachment of nitriles to gold); Solomun et al., Ber. Bunsen-Ges. Phys. Chem., 95, 95-8 (1991) (attachment of nitriles to gold); Henderson et al., Inorg. Chim. Acta, 242, 115-24 (1996) (attachment of isonitriles to gold); Huc et al., J. Phys. Chem. B, 103, 10489-10495 (1999) (attachment of isonitriles to gold); Hickman et al., Langmuir, 8, 357-9 (1992) (attachment of isonitriles to platinum); Steiner et al., Langmuir, 8, 90-4 (1992) (attachment of amines and phospines to gold and attachment of amines to copper); Mayya et al., J. Phys. Chem. B, 101, 9790-9793 (1997) (attachment of amines to gold and silver); Chen et al., Langmuir, 15, 1075-1082 (1999) (attachment of carboxylates to gold); Tao, J. Am. Chem. Soc., 115, 4350-4358 (1993) (attachment of carboxylates to copper and silver); Laibinis et al., J. Am. Chem. Soc., 114, 1990-5 (1992) (attachment of thiols to silver and copper); Laibinis et al., Langmuir, 7, 3167-73 (1991) (attachment of thiols to silver); Fenter et al., Langmuir, 7, 2013-16 (1991) (attachment of thiols to silver); Chang et al., Am. Chem. Soc., 116, 6792-

805 (1994) (attachment of thiols to silver); Li et al., J. Phys. Chem., 98, 11751-5 (1994) (attachment of thiols to silver); Li et al., Report, 24 pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., Langmuir, 7, 955-63 (1991) (attachment of thiols to silver); Walczak et al., J. Am. Chem. Soc., 113, 2370-8 (1991) (attachment of thiols to silver); Sangiorgi et al., Gazz. Chim. Ital., 111, 99-102 (1981) (attachment of amines to copper); Magallon et al., Book of Abstracts, 215th ACS National Meeting, Dallas, Mar. 29-Apr. 2, 1998, COLL-048 (attachment of amines to copper); Patil et al., Langmuir, 14, 2707-2711 (1998) (attachment of amines to silver); Sastry et al., J. Phys. Chem. B, 101, 4954-4958 (1997) (attachment of amines to silver); Bansal et al., J. Phys. Chem. B. 102, 4058-4060 (1998) (attachment of alkyl lithium to silicon); Bansal et al., J. Phys. Chem. B, 102, 1067-1070 (1998) (attachment of alkyl lithium to silicon); Chidsey, Book of Abstracts, 214th ACS National Meeting, Las Vegas, Nev., Sep. 7-11, 1997, I&EC-027 (attachment of alkyl lithium to silicon); Song, J. H., Thesis, University of California at San Diego (1998) (attachment of alkyl lithium to silicon dioxide); Meyer et al., J. Am. Chem. Soc., 110, 4914-18 (1988) (attachment of amines to semiconductors); Brazdil et al. J. Phys. Chem., 85, 1005-14 (1981) (attachment of amines to semiconductors); James et al., Langmuir, 14, 741-744 (1998) (attachment of proteins and peptides to glass); Bernard et al., Langmuir, 14, 2225-2229 (1998) (attachment of proteins to glass, polystyrene, gold, silver and silicon wafers); Pereira et al., J. Mater. Chem., 10, 259 (2000) (attachment of silazanes to SiO2); Pereira et al., J. Mater. Chem., 10, 259 (2000) (attachment of silazanes to SiO2); Dammel, Diazonaphthoquinone Based Resists (1st ed., SPIE Optical Engineering Press, Bellingham, Wash., 1993) (attachment of silazanes to SiO2); Anwander et al., J. Phys. Chem. B, 104, 3532 (2000) (attachment of silazanes to SiO2); Slavov et al., J. Phys. Chem., 104, 983 (2000) (attachment of silazanes to SiO2).

Substrates to be Patterned

Any suitable substrates can be patterned, depending on the patterning methods used. For example, for beam pen lithography any photosensitive substrate or substrate layer can be patterned. For electrochemical deposition and suitable electro-sensitive substrate or substrate layer can be used. For thermal deposition, a thermal sensitive substrate can be used or a thermal sensitive ink composition can be deposited on any substrate.

Substrates can include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, films thereof, thin films thereof, laminates thereof, foils thereof, composites thereof, and combinations thereof. A substrate can comprise a semiconductor such as, but not limited to: crystalline silicon, polycrystalline silicon, amorphous silicon, p-doped silicon, n-doped silicon, silicon oxide, silicon germanium, germanium, gallium arsenide, gallium arsenide phosphide, indium tin oxide, and combinations thereof. A substrate can comprise a glass such as, but not limited to, undoped silica glass (SiO2), fluorinated silica glass, borosilicate glass, borophosphorosilicate glass, organosilicate glass, porous organosilicate glass, and combinations thereof. The substrate can be a non-planar substrate, such as pyrolytic carbon, reinforced carbon-carbon composite, a carbon phenolic resin, and the like, and combinations thereof. A substrate can comprise a ceramic such as, but not limited to, silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, such as, but not limited to: a plastic, a metal, a composite thereof, a laminate thereof, a thin film thereof, a foil thereof, and combinations thereof.

The substrate can comprise a compressible material. The compressible material can be layered on top of a substrate as described herein. Examples of compressible materials include, but are not limited to, polymers, metals (e.g., soft metals), foils, films, or the like. Non-limiting examples of a compressible layer include polymethylmethacrylate (PMMA), polydimethylsiloxane (PDMS), nitrocellulose, and combinations thereof.

The substrate can comprise a material that can be desorbed upon application of electrical energy. Non-limiting examples of such a material include 16-mercaptohexadecanoic acid (MHA) and octadecanethiol (ODT), alkane thiols, and phosphonic acids.

Surfaces to be Patterned by pBPL

The surfaces to pattern by BPL can include any suitable substrate, such as those described above which is photosensitive or includes a photosensitive layer. For example, the photosensitive substrate or photosensitive layer 20 can be a resist layer. The resist layer can be any known resist material, for example SHIPLEY1805 (MicroChem Inc.). Other suitable resist materials include, but are not limited to, Shipley1813 (MicroChem Inc.), Shipley1830 (MicroChem Inc.), PHOTORESIST AZ1518 (MicroChemicals, Germany), PHOTORESIST AZ5214 (MicroChemicals, Germany), SU-8, and combinations thereof. Other examples of photosensitive materials include, but are not limited to, liquid crystals and metals. For examples, the substrate can include metal salts that can be reduced when exposed to the radiation. Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, and laminates and combinations thereof. The substrate can be in the form of films, thin films, foils, and combinations thereof. A substrate can comprise a semiconductor including, but not limited to one or more of: crystalline silicon, polycrystalline silicon, amorphous silicon, p-doped silicon, n-doped silicon, silicon oxide, silicon germanium, germanium, gallium arsenide, gallium arsenide phosphide, indium tin oxide, graphene, and combinations thereof. A substrate can comprise a glass including, but not limited to, one or more of undoped silica glass (SiO2), fluorinated silica glass, borosilicate glass, borophosphorosilicate glass, organosilicate glass, porous organosilicate glass, and combinations thereof. The substrate can be a non-planar substrate, including, but not limited to, one or more of pyrolytic carbon, reinforced carbon-carbon composite, a carbon phenolic resin, and combinations thereof. A substrate can comprise a ceramic including, but not limited to, one or more of silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, including, but not limited to one or more of: a plastic, a metal, a composite thereof, a laminate thereof, a thin film thereof, a foil thereof, and combinations thereof.

The photosensitive substrate or the photosensitive layer 20 can have any suitable thickness, for example in a range of about 100 nm to about 5000 nm. For example, the minimum photosensitive substrate or photosensitive layer 20 thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. For example, the maximum photosensitive substrate or photosensitive layer 20 thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. The diameter of the indicia formed by the tip array 10 can be modulated by modifying the resist material used and/or the thickness of the photosensitive substrate or photosensitive layer 20. For example, under the same radiation conditions, a thicker photosensitive layer can result in indicia having larger diameters. At constant photosensitive layer thickness, an increase in radiation intensity can result in indicia having larger diameters.

In one embodiment a substrate is spin-coated with a layer of positive-tone photoresist (for example, SHIPLEY1805). The photoresist can be applied by pre-diluting with propylene glycol monomethyl ether acetate at a ratio selected based on the desired thickness of the resist layer. For example, if a 40 nm thick photoresist layer is desired, the photoresist can be diluted with the acetate in a ratio of 1:4. If a 150 nm thick photoresist layer is desired the dilution ratio can be, for example, 1:1. The photoresist coated substrate can be soft-baked, for example, on a hot plate at 115° C. for about one minute. To improve the performance of the resist for lift-off processing, a layer of lift-off resist can optionally be applied. For example LOR 3A lift-off resist (available from MicroChem Corp) can be used. The lift-off resist can be spin coated onto the photoresist for example at 4000 rpm for one minute and can then be baked, for example at 180° C. for about five minutes.

EXAMPLES

Examples 1: Formation of BPL Tip Array

Figures 26A, 26B:
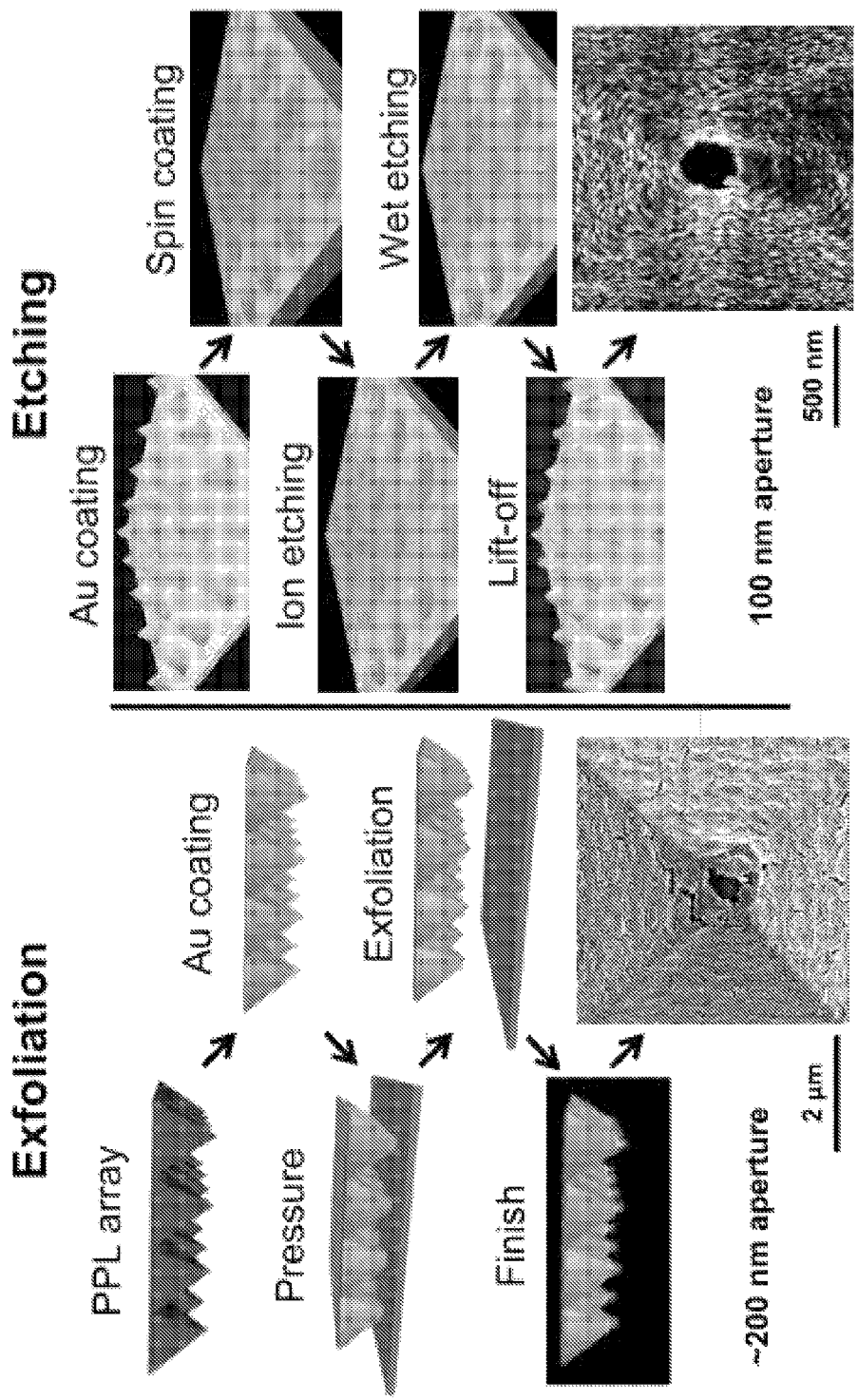
FIG. 26a is a schematic illustration of a method of making a beam pen tip array tip array using a lift-off procedure, the inset is an SEM image of an aperture formed by the method.
FIG. 26b is a schematic illustration of a method of making a beam pen tip array using a dry and wet etching process, the inset is an SEM image of an aperture formed by the method.

BPL tip arrays were fabricated starting from a PPL tip array in accordance with known methods. See Huo et al., Science 2008, 321, 1658-60. Hard PDMS composed of 3.4 g of vinyl-compound-rich prepolymer (VDT-731, Gelest) and 1.0 g of hydrosilane-rich crosslinker (HMS-301) was poured onto a Si master and followed by curing at 80° C. for 24 hours. After peeling the PPL tip array off the Si master, it was exposed to air plasma at 200 mb and 60 W for 1 min. Next, a 5 nm layer of Ti followed by a 100 nm layer of Au was evaporated on the tip array at 0.25 Å/s to make the entire tip array opaque. In order to open apertures in the apex of the pyramidal tips PMMA (950c 7, MicroChem Inc., USA) was spin-coated onto the metal-coated tip array at 1000 rpm for 1 min and baked at 150° C. for 5 minutes. The PMMA coating was repeated an additional 1 to 3 times to ensure complete coverage. Reactive ion etching was then employed to homogeneously etch the PMMA until the apexes of the tips were exposed. The array was observed in an optical microscope every minute in order to stop the etch precisely when only the apexes were exposed. Typically, etching with 25 W for 5 minutes in 100 mTorr $O_2$ was sufficient. The gold at the apex of each pen was removed through soaking in a selective chemical etch, using the remaining portion of the PMMA as an etch mask. The chemical etch was performed for about 50 seconds, leaving an aperture at the tip of each tip in the array. Finally, rinsing in acetone was used to remove the remaining PMMA. FIG. 26b provides a schematic illustration of the aperture formation process. Apertures having a diameter of about 100 nm were formed in the apexes of the tips.

Example 2: Patterning with pBPL without Tip Array Movement

A BPL tip array was mounted on a scanning probe lithography platform and leveled with respect to a photoresist-coated Si wafer utilizing an optical leveling procedure. To expose a region of the resist, the tips were brought into contact with the resist surface and UV light with a wavelength λ of about 405 nm was shined on the back side of the tip array and held for a specific exposure time. While sub-λ sized apertures of the tip arrays blocked the propagating light, evanescent light extended into the photoresist with an intensity that decayed exponentially with depth into the resist surface.

Figure 27:
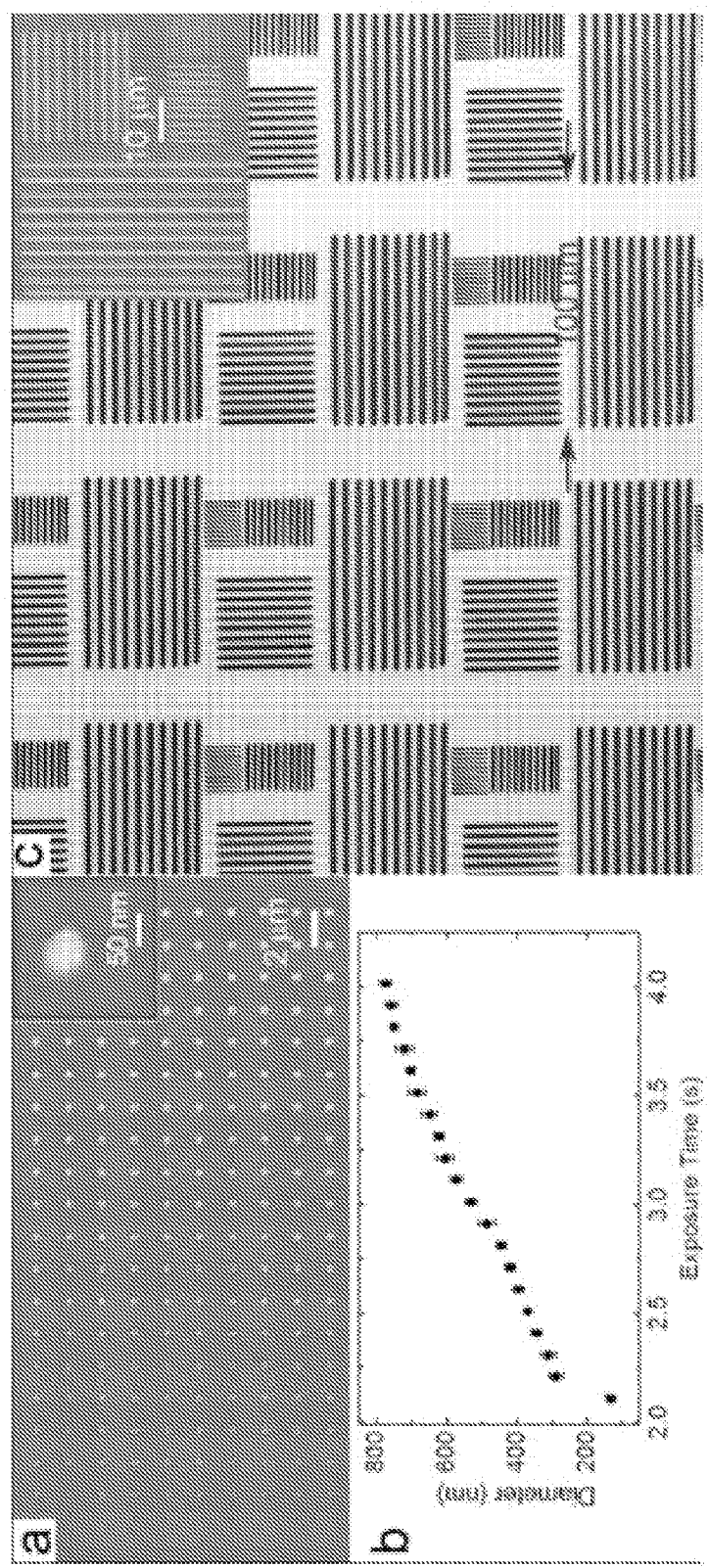
FIG. 27a is an SEM image of a dot pattern formed using projected lithography according to the disclosure herein using a beam pen tip array.
FIG. 27b is graph illustrating the relationship between feature size and exposure time for a method of patterning using projected lithography with a beam pen tip array according to the disclosure herein.
FIG. 27c is an SEM image of a line pattern formed using projected lithography using a beam pen tip array according to the disclosure herein.

To optimize the exposure time, a dose-test was performed in which the tip array wrote a series of dots (FIG. 27a) with exposure times between 2 and 4 seconds. In this experiment, the exposure times were modulated by controlling the mirrors to print in "grayscale," which modulated the duty cycle of each mirror. This provided a simple way to adjust the exposure dose received by each pixel patterned. At an exposure dose of 2 seconds, the patterned features had a diameter of 122±12 nn, which is substantially smaller than λ/2. At longer exposure times, larger features were patterned (FIG. 27b).

In contrast to pattern dots with the tips held still, moving the tips linearly across the sample while in contact with the sample allows one to pattern lines. Gold lines with widths of about 375 nm, about 750 nm, about 1.125 μm, and about 1.5 μm were patterned by scanning the tip array at 4, 2, 1, and 0.5 μm/s, respectively. The structures written by the tips were visualized by scanning electron microscopy after being coated with 5 nm of Cr and 25 nm of Au and subjected to solvent lift off to remove the remaining photoresist.

Example 3: Patterning by pBPL with Raster Scanning of the Tip Array

To generate a large scale image, the tip array was raster scanned across a sample while a DMD displayed images extracted from a master image. To achieve registry between the projected image and the tips, an alignment procedure as described above was used.

Once good alignment was achieved, the large scale pattern was written while the actions of the DMD and the scanning probe system were controlled by the software program as described above.

Referring to FIG. 28, a tip array having 10,000 tips addressing 10,000 points each creating a $cm^2$ image. The features had a diameter of about 300 nm. This demonstrates the high quality control of light from macroscale to nanoscale achievable with embodiments of the disclosure. This ability corresponds to a four order magnitude increase in data transfer rate as compared to conventional BPL. Fabrication of this pattern would not be possible using conventional optical techniques, and instead would include the significantly more costly and complicated electron beam lithography (EBL) process.

Example 4: Generation of Circuit Patterns Using pBPL

Figure 29:
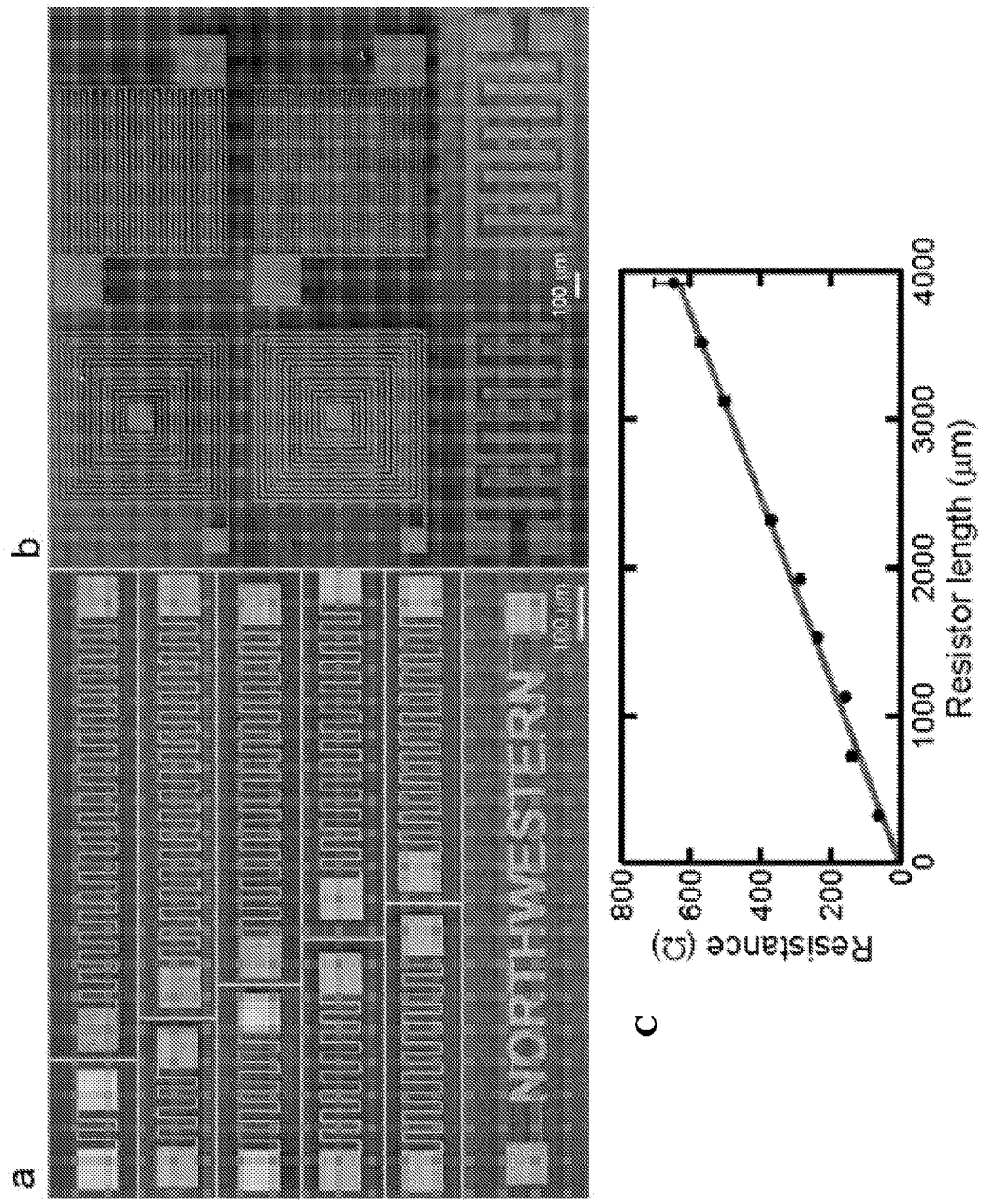

The utility of pBPL was evaluated by patterning functional circuits. Arrays of serpentine resistors with varying lengths were patterned. FIG. 29a illustrates representative SEM images of the resistors. All resistors required the coordination of multiple tips with the smallest lines requiring three tips and the largest lines requesting fifteen tips. The largest lines were continuous wires having a length of 4 mm and a width of 2 µm. Current-voltage characterization of sixty-one devices revealed that all measured devices had Ohmic character with resistances that depended linearly on the line length (FIG. 29b).

The sheet resistance of the resistance of resistors can be computed by combining the slope of the linear fit in FIG. 29c to find r=0.32 Ω/square, in agreement with the expected value of about 0.4 Ω/square for a 50 nm thick gold film.

In addition to resistors, planar capacitors, inductors, and surface acoustic wave sensors (SAWS) were also patterned, demonstrating a full pallet of passive circuit elements that can be patterned using embodiments of the disclosure (FIG. 29b). The capacitor illustrated in FIG. 29c was patterned using fifty-seven tips, the inductor was patterned using fifty-one tips, and the SAWS was patterned using 101 tips.

Figure 30A:
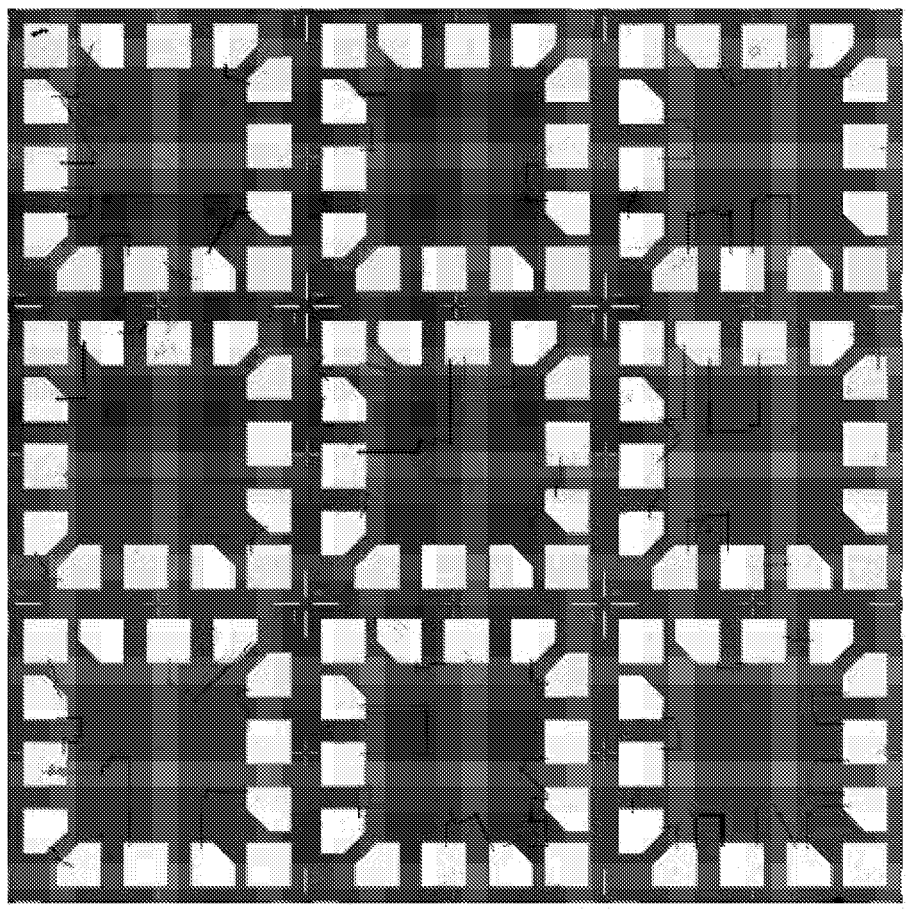
FIGS. 30a and 30b are SEM image of dispersed semiconductor nanowires electrically connected by leads that were formed by projected lithography with a beam pen tip array according to the disclosure herein.
Figure 30B:
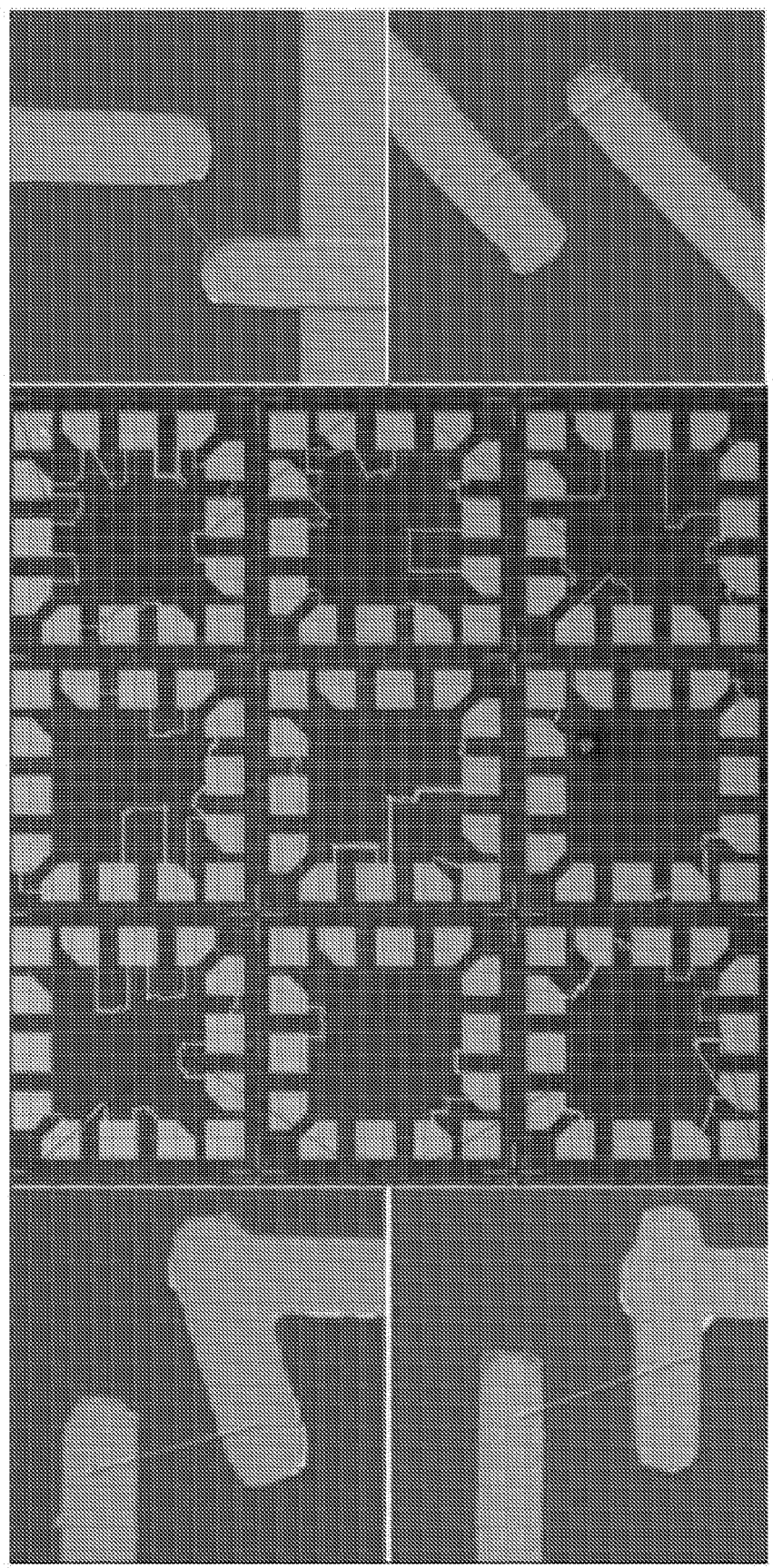

FIG. 30a illustrates electrical wire connections generated using pBPL. To evaluate the potential of pBPL to generate patterns in registry with existing structures, semiconductor nanowires were dispersed on a substrate and electrically connected by leads generated by pBPL (FIG. 30b). An array consisting of 729 tips (27×27) and alignment markers was used to pattern connections to sixty wires that had been located by optical microscopy. Patterning of this type, which is traditionally done by EBL, demonstrates the ability of pBPL to rapidly pattern in a mask-free fashion with registry to an existing pattern. Once the patterns were written, 59/60 of the wires were successfully connected and after the lift-off of the photoresist, 40/60 working devices were obtained. The electrical transport of the nanowire structure demonstrated clear semiconducting behavior.

Example 5: Method of Making a Heat Actuation Tip Array

Figure 11:
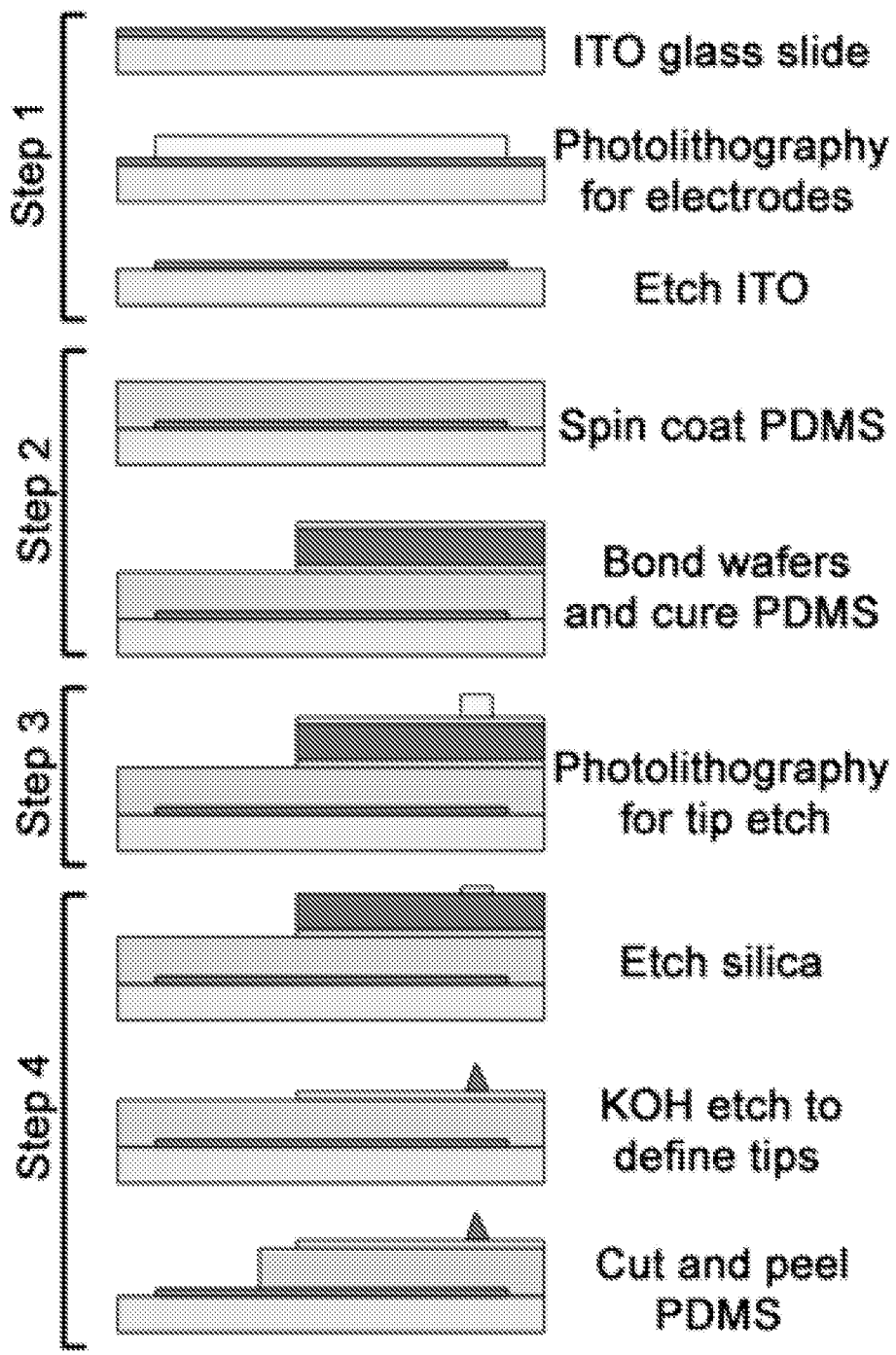
FIG. 11 is a schematic illustration of a fabrication process of a thermal actuation tip array in accordance with an embodiment of the disclosure herein.

FIG. 11 provides a schematic illustration of a method of making a heat actuation tip array, the tip array being a silicon pen tip array. Heaters were fabricated by etching an indium tin oxide (ITO) coated glass slide. ITO was chosen as an electrode material because it is transparent and a conductor. 25×25 mm$^2$ glass slides coated in 8 to 12 Ω/sq ITO were purchased from Sigma Aldrich and cleaned chemically by rinsing in acetone, DI water, and isopropanol. They were then dried under nitrogen. The slides were spin coated with a positive tone photoresist (S1805—Shipley) at 4000 rpm for 40 s and baked on a hot plate for 1 minute at 115° C. Samples were then aligned in a mask aligner and exposed for 2 s and post-exposure baked for 1 minute at 115° C. Patterns were then developed in MF-24A (Shipley) for 60 s then rinsed in DI water and dried under nitrogen. In order to make the patterned photoresist a better mask for etching, samples were hard baked for 4 hours at 80° C.

To etch the ITO, a reactive ion etch was utilized. Samples were mounted on 4 inch (10 cm) wafers with photoresist and loaded into a deep reactive ion etch (DRIE—STS LpX Pegasus). The samples were etched under 200 sccm of Argon that was held at 5 mTorr using 2500 W RF power and 40 W delivered to the platen. Under these conditions, the etch rate of ITO was found to be approximately 1 Å/s. The completion of the etch was verified by using a multimeter to measure the background resistance and resistance of the devices. To remove the residual resist, samples were soaked overnight in Remover PG (Microchem) on an 80° C. hot plate. Samples were visualized in a scanning electron microscope (FIG. 10c) to reveal the ITO coils and bus lines. In this figure, a 4×4 array of coil heaters is present.

Next, the slides were coated with PDMS placed on a Si wafer. Si wafers (NOVA Electronic Materials; resistivity 1-10 Ω·cm, (100) orientation, 50±5 µm thick) with a 10,000 Å (±5%) SiO$_2$ layer on each side were used for fabricating the tip arrays. The wafers were cleaned in acetone, ethanol, then rinsed with water before use. In preparing the elastomer base, PDMS and a curing agent (Sylgard 184 Silicone) were mixed in a 10:1 ratio (w/w), and then degassed under vacuum (10-3 Torr) for 30 min. Uncured PDMS was spin-coated at 1,000 rpm for 30 s with a ramping speed of 1,000 rpm/s, followed by curing at 75° C. for 10 min. The average thickness was determined by profilometry (Veeco, Dektak 150) to be 88.5±1.3 µm. To increase the adhesion between the cured PDMS and Si wafers, epoxy (DAP Dow Corning, Silicone Rubber Aquarium Sealant) was used by spin-coating it onto the cured PDMS. The epoxy was diluted with heptane (0.2 g epoxy and 2 mL heptane) to decrease the viscosity of the epoxy and, as a result, homogeneous film thickness less than 1 µm were obtained. Oxygen-plasma-treated (60 W at a pressure of 100 mTorr) wafers were then placed on spin-coated epoxy/PDMS on clean glass slides, followed by curing at 75° C. for 1 h.

Photolithography was used to define square masks for the tip etching procedure. These squares were be between 120 µm and 140 µm (depending on the thickness of the silicon wafer) and the edges of the squares must be aligned along the Si layers <110> direction. First, samples were treated in oxygen plasma for 1 min at ~100 mTorr at 30 W. This step can enhance adhesion of the resist. Samples were then spin-coated with photoresist (S1805—Shipley) at 4000 rpm for 40 s and baked on a hot plate for 1 minute at 115° C. Samples were then aligned using a mask aligner. In contrast to previous HSL work, where the tip masks are aligned to be parallel to the edge of the silicon wafer, here the tip masks were aligned to predefined alignment markers on the ITO surface below. This alignment ensured that each tip rested above a heater. Samples were exposed for 2 s and post-exposure baked for 1 minute at 115° C. Patterns were developed in MF-24A for 60 s then rinsed in DI water and dried under nitrogen.

An anisotropic wet etch was used to define the tips. The edge of the Si wafer chip was passivated with PDMS to prevent etching in from the sides. Exposed SiO$_2$ was then selectively etched in isotropic buffered hydrofluoric acid (Transene, 9% HF, BUFFER-HF Improved) for 9 min in a polystyrene petri dish and washed with water. To remove the photoresist, the wafer was cleaned in acetone, ethanol, and subsequently dried with flowing nitrogen. The wafer was then cleaned with oxygen plasma (1 min at 30 W at a pressure of 100 mTorr). O$_2$ plasma cleaning prior to Si etching was found to improve the uniformity of the tips. Samples were immediately transferred into 40 wt % KOH (333 g KOH in 500 mL DI water) (KOH from Sigma-Aldrich; 99.99% metal basis, semiconductor grade, product no. 306568) at 75° C. and held in the center of the etchant in a Teflon holder. The solution was continuously stirred to reduce the effect of micro-masking by hydrogen bubbles generated by the reaction at the Si surface. After 60-65 min, the sample was removed from the etchant, rinsed in water, ethanol, and then dried in air. As the etching rate of Si (100) in 40 wt % KOH at 75° C. is about 50 µm/h, the minimum thickness of $SiO_2$ can be about 250 nm for an experimentally viable fabrication procedure. In view of this, a 1 µm thick $SiO_2$ layer was selected.

Example 6: Characterization of Thermal Actuation

Figure 12A:
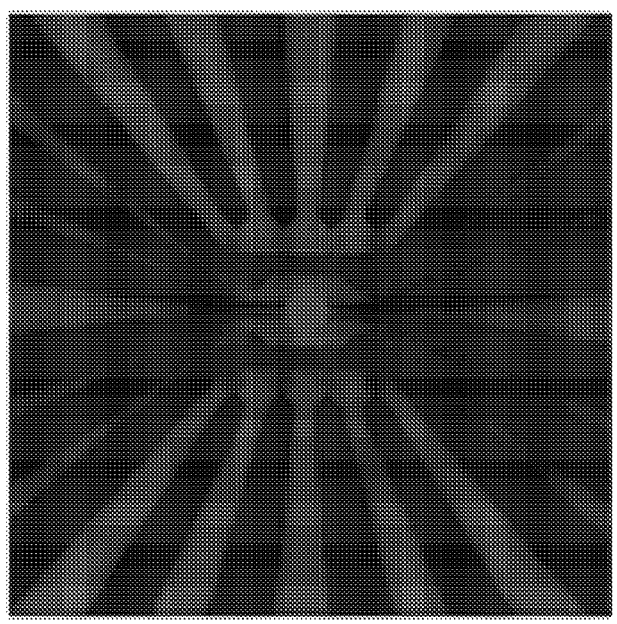
FIG. 12a is a thermal image of one heater in an array in an "off" and an "on" state according to the disclosure herein.
Figure 12A:
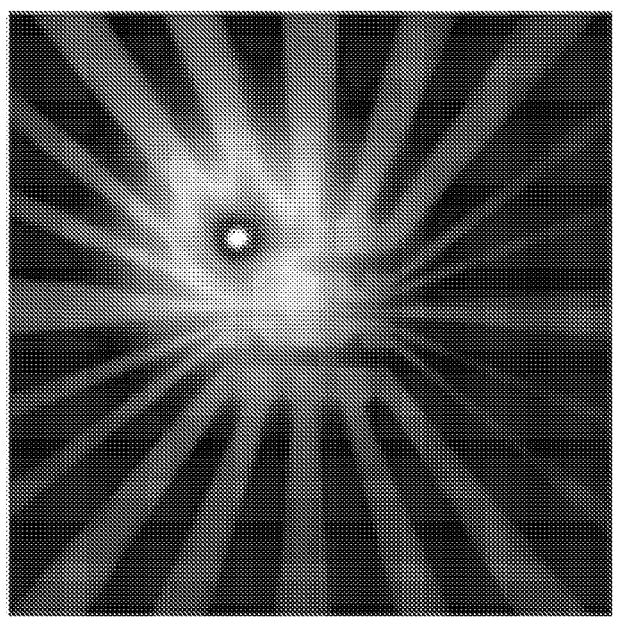
Figure 12B:
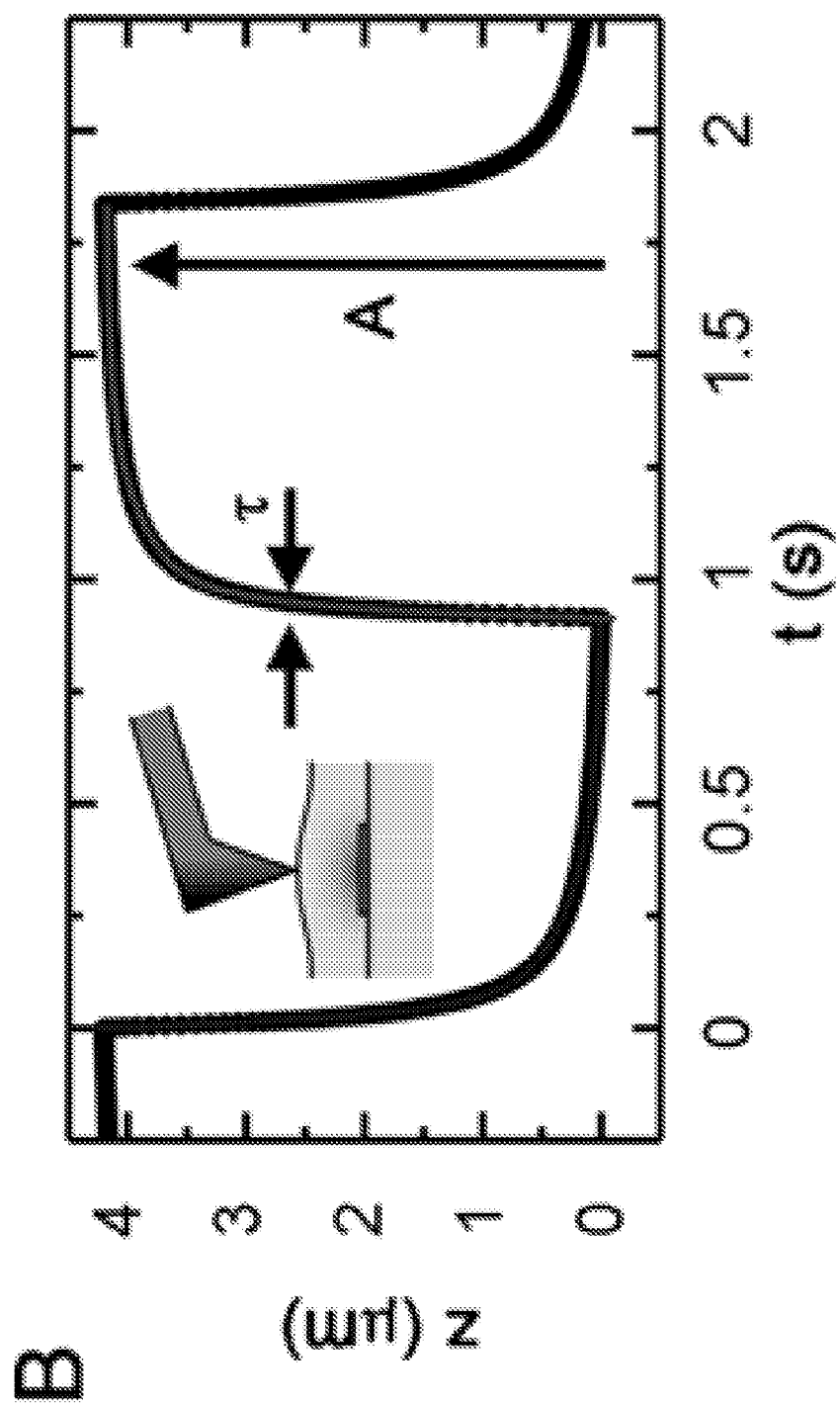
FIG. 12b is a graph illustrating the measurement of the actuation and extraction of a timescale τ and amplitude A according to the disclosure herein.
Figure 12C:
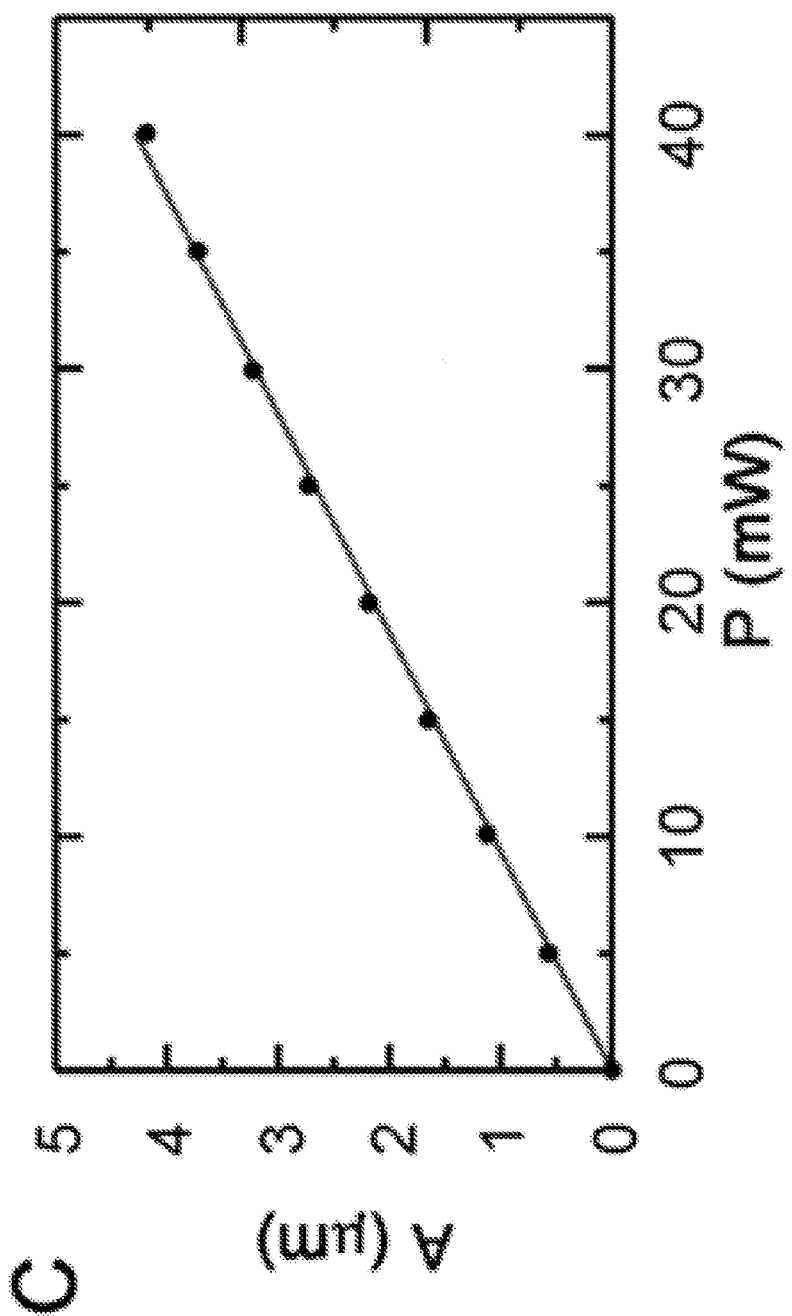
FIG. 12c is a graph illustrating the linear relationship observed between applied power and actuation amplitude according to the disclosure herein.

Thermal actuation was characterized with atomic force microscopy (AFM), resistance measurements, and thermal imaging. For characterization purposes, samples were used that consisted of the heater coil array and PDMS coating layer, but no tip array. When no power was applied to the heaters, thermal imaging revealed the structure of the coils and leads as slight differences in temperature (FIG. 12a—top). When 28 mW was applied to the top left heater for 1 s, a temperature plume was visible, centered on the selected heater (FIG. 12a—bottom). A maximum temperature increase of about 35° C. was observed in this case. The thermal actuation of the PDMS can be directly measured with AFM by scanning in contact mode (Dimension Icon—Bruker) using a contact mode probe (PPP-CONT—NanoWorld AG) in a small (100×100 $nm^2$) region on the PDMS above the heater. Scans were taken with a resolution of 4096 points and 10 lines at 0.1 Hz. The deflection set point was 1 V and the integral and proportional gain were 5 and 10 respectively. At the same time, the heater was driven with a 0.5 Hz square wave at a set power P. The height recorded by the AFM was a square wave with damping given by the finite heating time of the PDMS (FIG. 12b). Each rise and fall of the height was fit to the sum of two exponentials and was characterized by a total amplitude A and a rise time τ defined to be the time required to reach 63% (equivalent to the time constant of an exponential function). τ was found to only depend on the thickness of the PDMS film and equaled about 20 ms for a 40 µm thick PDMS film and 40 ms for a 90 µm thick PDMS film. Both of these times are adequately fast for a molecular patterning. The amplitude A was found to depend linearly on the applied power P (FIG. 12c). The constant of proportionality α increases with smaller heaters and increases with thicker PDMS films. α was found to be between 87 nm/mW and 120 nm/mW.

Figure 12D:
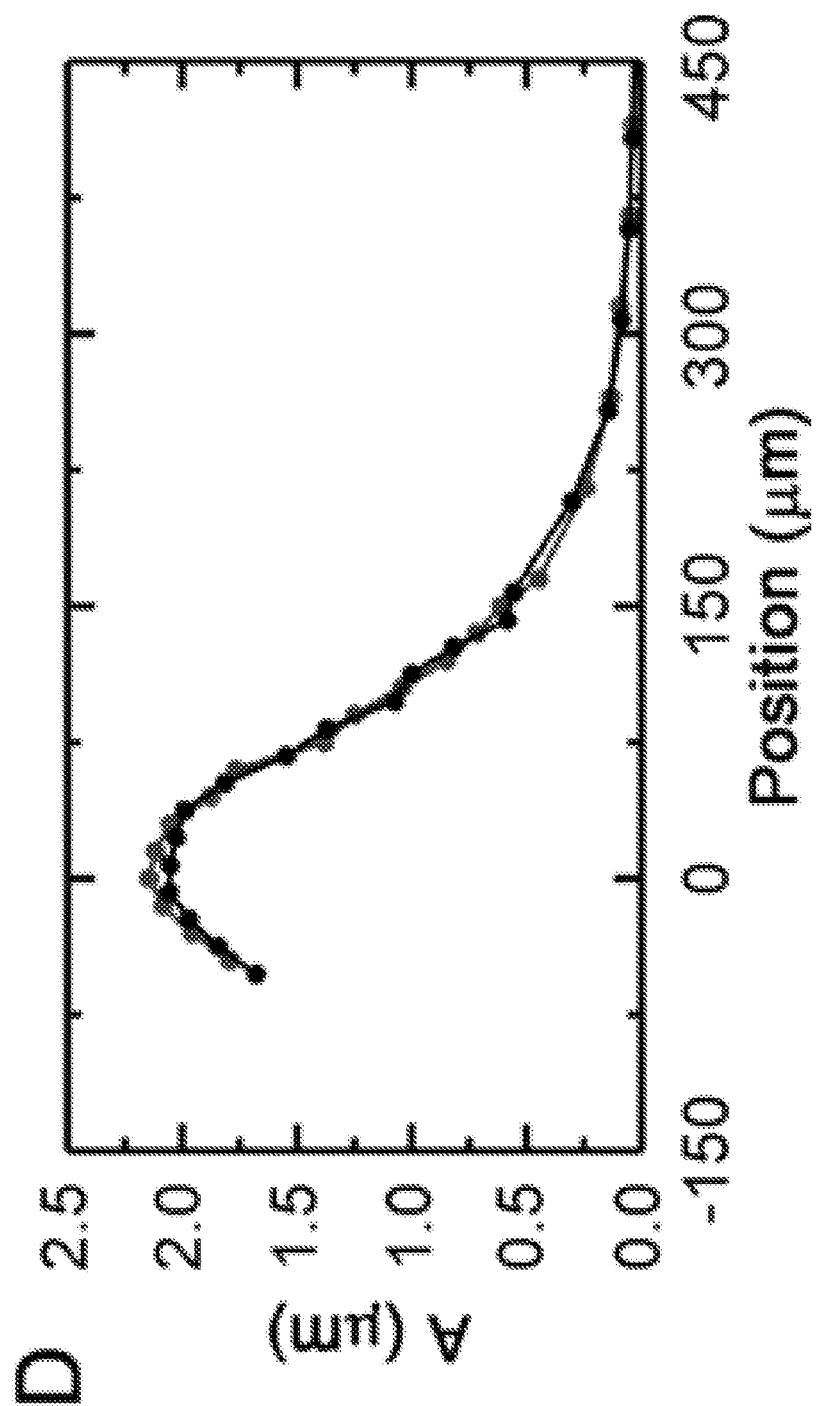
FIG. 12d is a graph of an amplitude profile along the surface of the PDMS according to the disclosure herein, showing minimal crosstalk and fatigue.

AFM was also used to evaluate the importance of crosstalk between tips and fatigue with continued use. FIG. 12d shows the amplitude of driving recorded at different locations along the surface of the PDMS when the heater at the origin was driven with 28 mW for 50 ms. The red trace was the initial measurement and it was apparent that since the amplitude at 150 µm was only 20% its peak value, crosstalk between tips will not be an issue. It is worth noting that crosstalk was a considerably larger issue if the power was left on longer, reaching about 40% at 1 s. By restricting the on time, it was possible to mitigate crosstalk. Fatigue was also not an issue as after cycling for 12 hours (23,000 on/off cycles) the amplitude vs. position curve was barely different (FIG. 12d black line). This characterization shows that thermal actuation is powerful and fast enough to perform actuated SPL and that crosstalk and fatigue are not major concerns.

The foregoing describes and exemplifies the invention but is not intended to limit the invention defined by the claims which follow. All of the methods disclosed and claimed herein can be made and executed without undue experimentation in light of the present disclosure. While the materials and methods of this invention have been described in terms of specific embodiments, it will be apparent to those of skill in the art that variations may be applied to the materials and/or methods and in the steps or in the sequence of steps of the methods described herein without departing from the concept, spirit and scope of the invention. More specifically, it will be apparent that certain agents which are both chemically and physiologically related may be substituted for the agents described herein while the same or similar results would be achieved.

All patents, publications and references cited herein are hereby fully incorporated by reference. In case of conflict between the present disclosure and incorporated patents, publications and references, the present disclosure should control.

The following additional considerations apply to the foregoing discussion. Throughout this specification, plural instances may implement methods, instructions, functions, components, operations, or structures described as a single instance. Although individual methods and instructions are illustrated and described as separate operations, one or more of the methods and instructions may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Figure 1B:
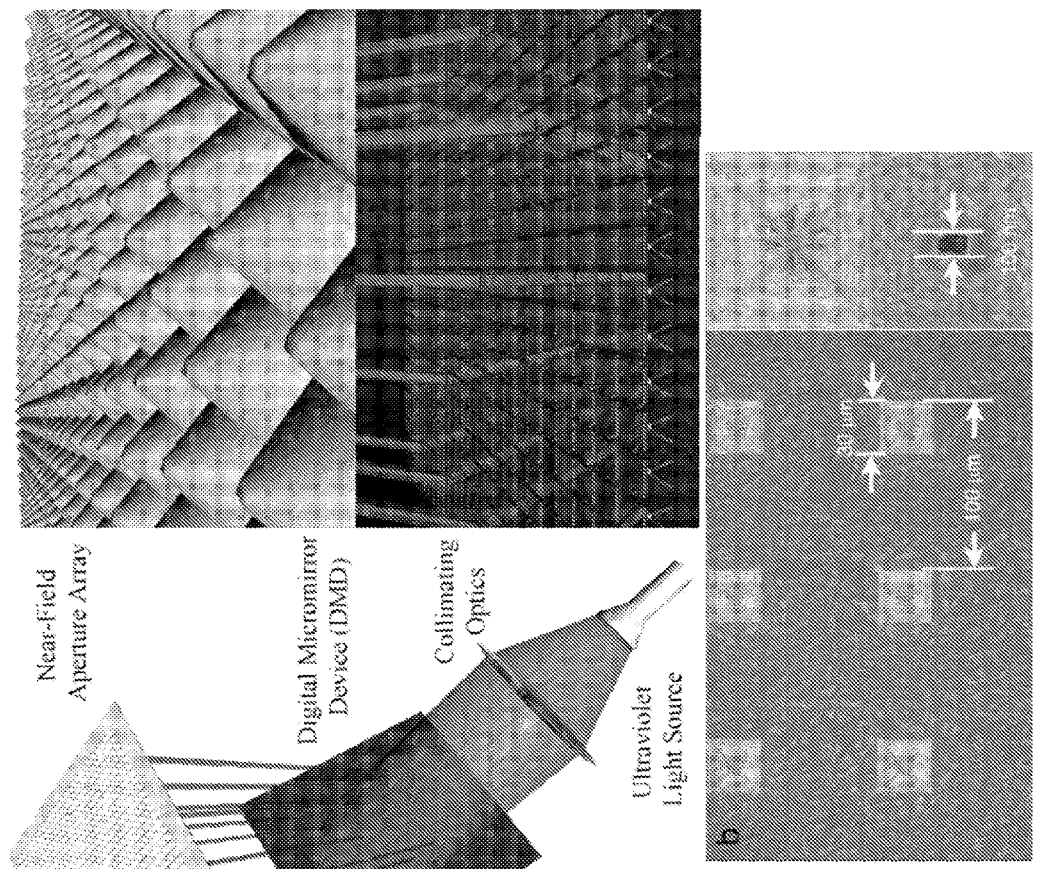
FIG. 1b is a schematic illustration of a projected lithography system using a beam pen tip array according to the disclosure herein.

For example, the various component of the system 100 may communicate through any combination of a LAN, a MAN, a WAN, a mobile, a wired or wireless network, a private network, or a virtual private network. Moreover, while only one actuation computer is illustrated in FIG. 1 to simplify and clarify the description, it is understood that any number of computers or display devices are supported and can be in communication with the system 100.

Additionally, certain embodiments are described herein as including logic or a number of methods, instructions, modules, etc. Methods and modules may constitute either software modules (e.g., non-transitory code stored on a tangible machine-readable storage medium) or hardware modules. A hardware module is a tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain functions. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term hardware should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware and software modules can provide information to, and receive information from, other hardware and/or software modules. Accordingly, the described hardware modules may be regarded as being communicatively coupled. Where multiple of such hardware or software modules exist contemporaneously, communications may be achieved through signal transmission (e.g., over appropriate circuits and buses) that connect the hardware or software modules. In embodiments in which multiple hardware modules or software are configured or instantiated at different times, communications between such hardware or software modules may be achieved, for example, through the storage and retrieval of information in memory structures to which the multiple hardware or software modules have access. For example, one hardware or software module may perform an operation and store the output of that operation in a memory device to which it is communicatively coupled. A further hardware or software module may then, at a later time, access the memory device to retrieve and process the stored output. Hardware and software modules may also initiate communications with input or output devices, and can operate on a resource (e.g., a collection of information).

The various operations of example functions and methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods and instructions described herein may be at least partially processor-implemented. For example, at least some of the instructions of a method may be performed by one or processors or processor-implemented hardware modules. The performance of certain of the instructions may be distributed among the one or more processors, not only residing within a single machine, but deployed across a number of machines. In some example embodiments, the processor or processors may be located in a single location (e.g., within a laboratory environment, a factory environment or as a server farm), while in other embodiments the processors may be distributed across a number of locations.

The one or more processors may also operate to support performance of the relevant operations in a "cloud computing" environment or as a "software as a service" (SaaS). For example, at least some of the functions may be performed by a group of computers (as examples of machines including processors), these operations being accessible via a network (e.g., the Internet) and via one or more appropriate interfaces (e.g., application program interfaces (APIs).

The performance of certain of the operations may be distributed among the one or more processors, not only residing within a single machine, but deployed across a number of machines. In some example embodiments, the one or more processors or processor-implemented modules may be located in a single geographic location (e.g., within a lab environment, etc.). In other example embodiments, the one or more processors or processor-implemented modules may be distributed across a number of geographic locations.

Some portions of this specification are presented in terms of algorithms or symbolic representations of operations on data and data structures stored as bits or binary digital signals within a machine memory (e.g., a computer memory). These algorithms or symbolic representations are examples of techniques used by those of ordinary skill in the data processing arts to convey the substance of their work to others skilled in the art. As used herein, a "method" or an "instruction" or an "algorithm" or a "routine" is a self-consistent sequence of operations or similar processing leading to a desired result. In this context, methods, instructions, algorithms, routines and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "some embodiments" or "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a function, process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description should be read to include one or at least one and the singular also includes the plural unless it is obvious that it is meant otherwise.

Still further, the figures depict preferred embodiments of a computer system 100 for purposes of illustration only. One of ordinary skill in the art will readily recognize from the following discussion that alternative embodiments of the structures and methods illustrated herein may be employed without departing from the principles described herein.

Upon reading this disclosure, those of skill in the art will appreciate still additional alternative structural and functional designs for a system and a process for segmenting a customer base and implementing specific behaviors for each customer segment through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method of patterning, comprising:
    dividing an image into a set of frame sections;
    determining a tip pattern for a respective portion of an image to be patterned by each tip of a tip array in each frame section of the set of frame sections;
    disposing the tip array in a patterning position in a first location of the substrate corresponding to a location of the substrate in which a first frame section in the set of frame sections is to be patterned;
    projecting a first pattern of radiation onto the tip array to selectively irradiate one or more tips of the tip array and pattern the substrate, wherein the first pattern of radiation corresponds to a tip pattern for the first frame section;
    disposing the tip array in a patterning position in a second location of the substrate corresponding to a location of the substrate in which a second frame section in the set of frame sections is to be patterned;
    projecting a second pattern of radiation onto the tip array to selectively irradiate tips of the tip array and pattern the substrate, wherein the second pattern of radiation corresponds to a tip pattern for the second frame section; and
    repeating the disposing and projecting for each frame section in the set of frame sections to pattern the image, wherein:
        each frame section corresponds to a portion of the image to be patterned on a substrate by each tip of the tip array in a patterning location;
        determining a tip pattern for a respective portion of an image to be patterned by each tip comprises:
            receiving a set of data inputs, the set of data inputs comprising a spatial size of the image, a center location of the image, rotational offset of the image, a delay time, an exposure time, and a safety time;
            outputting an instruction data set based on the set of data inputs;
            receiving with a control system for the tip array the instruction data set for directing movement of the tip array to a patterning location; and
        the method further comprising:
            (a) detecting a Z-piezo voltage, wherein a threshold voltage corresponds to the tip array being in a patterning position, wherein the first pattern of radiation is projected on the tip array after detecting the threshold voltage;
            (b) maintaining projection of the first pattern of radiation for an exposure time;
            (c) maintaining the tips in the patterning position for a hold time equal to the exposure time, the delay time, and the safety time to pattern the first portion of the image on the substrate;
            (d) stopping projection of the first pattern of radiation after the exposure time has lapsed;
            (e) removing the tips from the patterning position in the first location after the hold time has lapsed;
            wherein disposing the tip array in patterning position in the second location comprises moving the tips to the patterning position in the second location once the tips are removed from the patterning position in the first location, the spatial location of the patterning position in the second location being provided by the instruction data set; and,
            (m) repeating steps (a)-(e) at the patterning position in the second location to pattern the substrate in the second location.

2. The method of claim 1, wherein the frame section has a shape corresponding to a size and shape of an arrangement of the tips on the tip array.

3. The method of claim 1, wherein the tip array is a beam tip array and projecting the irradiation pattern selectively irradiates one or more tips of the tip array to selectively expose the substrate.

4. The method of claim 1, wherein the substrate comprises a photosensitive layer, and selectively exposing the substrate comprises exposing the photosensitive layer of the substrate.

5. The method of claim 4, further comprising developing the exposed photosensitive layer to remove either the exposed portion of the photosensitive layer or the non-exposed portion of the photosensitive layer.

6. The method of claim 5, further comprising applying a patterning material to the portion of the photosensitive layer in which the photosensitive layer was removed and removing the remaining portion of the photosensitive layer to thereby form a patterned indicium.

7. The method of claim 1, wherein the tips further comprise a graphene coating disposed on the tips.

8. The method of claim 1, wherein disposing the tip array in a patterning location comprises moving the tip array and holding the substrate surface stationary, or holding the tip array stationary and moving the substrate, or moving both the tip array and the substrate.

9. The method of claim 1, wherein the first and/or second pattern of radiation comprises a radiation having a wavelength in a range of 10 nm to 500 nm.

10. The method of claim 1, wherein the first and second patterns of irradiation comprise radiation having the same wavelength.

11. The method of claim 1, wherein the first and second patterns of irradiation comprise radiation having different wavelengths.

12. The method of claim 1, wherein projecting the first and second patterns of irradiation comprises selectively reflecting the irradiation off of mirrors of a digital micromirror device.

13. The method of claim 12, further comprising cycling one or more of the selective mirrors of the digital micromirror device during projection of the irradiation pattern to pattern in grayscale.

14. A method of patterning, comprising:
dividing an image into a set of frame sections;
determining a tip pattern for a respective portion of an image to be patterned by each tip of a tip array in each frame section of the set of frame sections;
disposing the tip array in a patterning position in a first location of the substrate corresponding to a location of the substrate in which a first frame section in the set of frame sections is to be patterned;
projecting a first pattern of radiation onto the tip array to selectively irradiate one or more tips of the tip array and pattern the substrate, wherein the first pattern of radiation corresponds to a tip pattern for the first frame section;
disposing the tip array in a patterning position in a second location of the substrate corresponding to a location of the substrate in which a second frame section in the set of frame sections is to be patterned;
projecting a second pattern of radiation onto the tip array to selectively irradiate tips of the tip array and pattern the substrate, wherein the second pattern of radiation corresponds to a tip pattern for the second frame section; and
repeating the disposing and projecting for each frame section in the set of frame sections to pattern the image, wherein:
the tip array comprises:
an elastomeric tip substrate layer having a first side and an opposed second side;
a plurality of tips disposed on the first side of the tip substrate layer;
a plurality of heaters disposed on the second side of the tip substrate layer; and
projecting the first and second irradiation patterns selectively exposes the heaters to selectively activate the exposed heaters to locally heat a heating zone of the tip substrate layer and lower one or more tips disposed in the heating zone into contact or closer contact with the substrate.

15. The method of claim 14, further comprising applying a patterning composition to the tips before disposing the tip array in the patterning position in the first patterning location.

16. The method of claim 14, wherein the tips comprise an elastomer.

17. The method of claim 16, wherein the elastomer of the tips and/or the elastomeric tip substrate layer is polydimethylsiloxane (PDMS).

18. The method of claim 14, wherein the tips comprise a metal, a metalloid, a semi-conducting material, or a combination thereof.

19. A system for patterning a substrate using projected radiation comprising:
a micro tip array coupled to an actuator;
a projector including a radiation source;
a substrate stage;
a control module communicatively linked to the actuator, the substrate stage, and the projector, the module including a processor for executing instructions stored on a memory, the instructions to:
divide an image to be patterned into a set of frame sections;
determine a tip pattern for a respective portion of an image to be patterned by each tip of the tip array in each frame section of the set of frame sections; and
for each frame section in the set of frame sections,
cause the actuator and/or the substrate stage to dispose the tip array in a patterning position in a first location of a substrate corresponding to a location of the substrate in which a first frame section in the set of frame sections is to be patterned;
cause the projector to project a first pattern of radiation onto the tip array to selectively irradiate one or more tips of the tip array and pattern the substrate, wherein the first pattern of radiation corresponds to a tip pattern for the first frame section;
cause the actuator and/or the substrate stage to dispose the tip array in a patterning position in a second location of the substrate corresponding to a location of the substrate in which a second frame section in the set of frame sections is to be patterned; and
cause the projector to project a second pattern of radiation onto the tip array to selectively irradiate tips of the tip array and pattern the substrate, wherein the second pattern of radiation corresponds to a tip pattern for the second frame section, wherein the tip array comprises:
an elastomeric tip substrate layer comprising a first surface and an oppositely disposed second surface, the tip substrate layer being formed from an elastomeric material;
a plurality of tips fixed to the first surface, the tips each comprising a tip end disposed opposite the first surface, the tips having a radius of curvature of less than about 1 micron; and
an array of heaters disposed on the second surface of the tip substrate layer and configured such that when the tip substrate layer is heated by a heater, a tip disposed in a location of a heated portion of tip substrate layer is moved relative to a tip disposed in a location of an unheated portion of the tip substrate layer.

20. The system of claim 19, wherein
the instructions to cause the actuator to project the first and second irradiation patterns selectively expose the heaters to selectively activate the exposed heaters to locally heat a heating zone of the tip substrate layer and thereby move one or more tips disposed in the heating zone into contact or closer contact with the substrate.

21. The system of claim 19, wherein the heaters are selected from one or both of electrically activated heaters and photoconductive heaters.

22. The system of claim 19, wherein the tip array is a beam pen array and the instruction to cause the projector to project the irradiation pattern causes the projector to selectively irradiate one or more tips of the tip array to selectively expose the substrate.

23. The system of claim 19, wherein the projector includes a digital micromirror device.

24. The system of claim 23, wherein the instruction to cause the projector to project the first and second patterns of irradiation includes an instruction to selectively reflect the irradiation off of mirrors of the digital micromirror device.

25. The system of claim 24, wherein the instructions further comprise cycling one or more of the selective mirrors of the digital micromirror device during projection of the irradiation pattern to modulate the intensity of the projected radiation.

26. The system of claim 19, wherein the tip array is caused to be disposed in the patterning position by the actuator which manipulates the position of the tip array while the substrate stage is held still.

27. The system of claim 19, wherein the tip array is caused to be disposed in the patterning position by the substrate stage which manipulates the position of the substrate while the tip array is held still.

28. The system of claim 19, wherein the tip array is caused to be disposed in the patterning position by the actuator and the substrate which, respectively, manipulate the position of the tip array and the position of the substrate.

29. A system for patterning a substrate using projected radiation, the system comprising:
- a tip array coupled to an actuator comprising a piezo driver;
- a projector including a radiation source;
- a substrate stage;
- a control module communicatively linked to a microscope and the projector, the module including a processor for executing instructions stored on a memory, the instructions to:
  (a) subdivide an image to be patterned into square frame sections, wherein each square frame section corresponds to a portion of the image to be patterned on a substrate by each tip of a tip array in a patterning location;
  (b) receive a set of data inputs, the set of data inputs comprising a spatial size of the image, a center location of the image, rotational offset of the image, a delay time, an exposure time, and a safety time;
  (c) generate an instruction data set based the set of data inputs, the instruction set for directing movement of the tip array to a patterning location by the actuator;
  (d) detect a threshold piezo voltage corresponding to the tip array being in a patterning position;
  (e) cause the projector to:
  project a first irradiation pattern onto the tip array after detecting the threshold voltage, wherein the first irradiation pattern corresponds to a first portion of the image and the first portion of the image corresponds to a first subset of the frames sections located in the first patterning location,
  maintain projection of the first irradiation pattern for an exposure time, and
  stop projection of the first pattern of radiation after the exposure time has lapsed;
  (f) cause the actuator and/or substrate stage to:
  maintain the tips in the patterning position for a hold time equal to the exposure time, the delay time, and the safety time to pattern the first portion of the image on the substrate,
  remove the tips from the patterning position after the hold time has lapsed, and
  move the tips to a second patterning location once the tips are removed from the patterning position, the spatial location of second patterning location being provided by the instruction data set; and
  (h) repeat steps (e) and (f) at the second patterning location to pattern the substrate in a second patterning location.

* * * * *